United States Patent
Ito

(10) Patent No.: US 8,258,040 B2
(45) Date of Patent: Sep. 4, 2012

(54) SEMICONDUCTOR DEVICE AND METHOD FOR MANUFACTURING THE SAME

(75) Inventor: Tetsuya Ito, Yokohama (JP)

(73) Assignee: Fujitsu Semiconductor Limited, Yokohama (JP)

(\*) Notice: Subject to any disclaimer, the term of this patent is extended or adjusted under 35 U.S.C. 154(b) by 0 days.

(21) Appl. No.: 12/951,774

(22) Filed: Nov. 22, 2010

(65) Prior Publication Data

US 2011/0070704 A1 Mar. 24, 2011

Related U.S. Application Data

(62) Division of application No. 12/049,592, filed on Mar. 17, 2008, now Pat. No. 7,863,664.

(30) Foreign Application Priority Data

Mar. 16, 2007 (JP) ................................ 2007-068438

(51) Int. Cl.
*H01L 21/20* (2006.01)
(52) U.S. Cl. ................................ 438/386; 257/E21.396
(58) Field of Classification Search .................. 438/243, 438/248, 386, 391; 257/E21.396, E29.346
See application file for complete search history.

(56) References Cited

U.S. PATENT DOCUMENTS

| | | | |
|---|---|---|---|
| 4,752,819 A | 6/1988 | Koyama | |
| 4,859,615 A | 8/1989 | Tsukamoto et al. | |
| 5,304,835 A | 4/1994 | Imai et al. | |
| 5,468,983 A | 11/1995 | Hirase et al. | |
| 5,641,699 A | 6/1997 | Hirase et al. | |
| 5,946,230 A | 8/1999 | Shimizu et al. | |
| 6,815,751 B2 * | 11/2004 | Brown et al. | 257/305 |
| 6,995,415 B2 | 2/2006 | Ogawa et al. | |
| 7,030,457 B2 | 4/2006 | Ahrens et al. | |
| 7,863,668 B2 * | 1/2011 | Takahashi | 257/315 |

FOREIGN PATENT DOCUMENTS

| | | |
|---|---|---|
| CN | 1096135 | 12/1994 |
| CN | 1275809 | 12/2000 |
| GB | 2353328 | 1/2001 |
| JP | 62-067862 | 3/1987 |
| JP | 62-193167 | 8/1987 |
| JP | 63-024657 | 2/1988 |
| JP | 11-097652 | 4/1999 |
| JP | 2004-172643 | 6/2004 |
| JP | 2006-156656 | 6/2006 |
| WO | WO 92/02044 | 2/1992 |

OTHER PUBLICATIONS

"Chinese Office Action" dated Oct. 23, 2009, corresponding to Chinese Patent Application No. 200810086170.0.

(Continued)

*Primary Examiner* — Quoc Hoang
(74) *Attorney, Agent, or Firm* — Fujitsu Patent Center

(57) ABSTRACT

It is disclosed a semiconductor device including a silicon substrate, provided with a plurality of cell active regions in a call region, an element isolation groove, formed in a portion, between any two of the plurality of cell active region, of the silicon substrate, a capacitor dielectric film, formed in the element isolation groove, a capacitor upper electrode, formed on the capacitor dielectric film, and configuring a capacitor together with the silicon substrate and the capacitor dielectric film. The semiconductor device is characterized in that a dummy active region is provided next to the cell region in the silicon substrate.

10 Claims, 58 Drawing Sheets

OTHER PUBLICATIONS

USPTO, (Hoang) Notice of Allowance and Notice of Allowability, Aug. 16, 2010, in parent U.S. Appl. No. 12/049,592 [now allowed].

USPTO, (Hoang) Non-Final Office Action, Feb. 24, 2010, in parent U.S. Appl. No. 12/049,592 [now allowed].

USPTO, (Hoang) Restriction Requirement, Dec. 3, 2009, in parent U.S. Appl. No. 12/049,592 [now allowed].

Japanese Office Action mailed May 8, 2012 for corresponding Japanese Application No. 2007-068438, with partial English-language translation.

* cited by examiner

FIG. 4
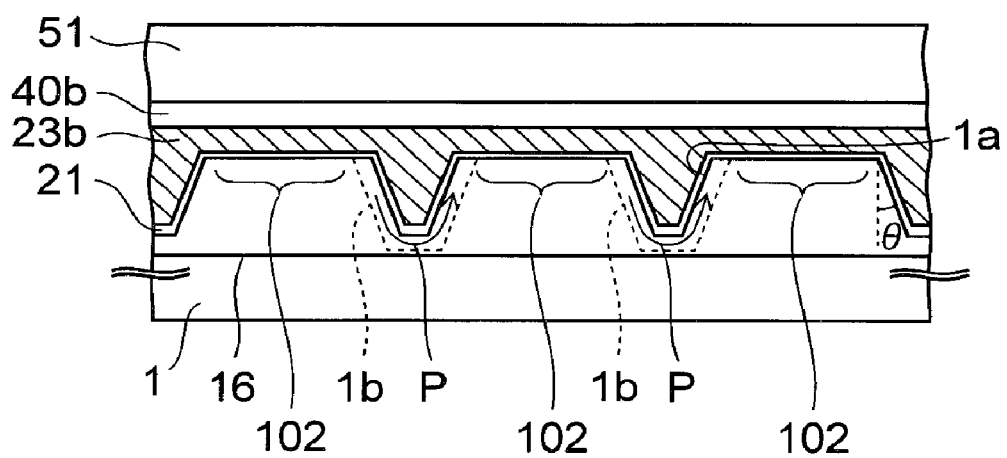
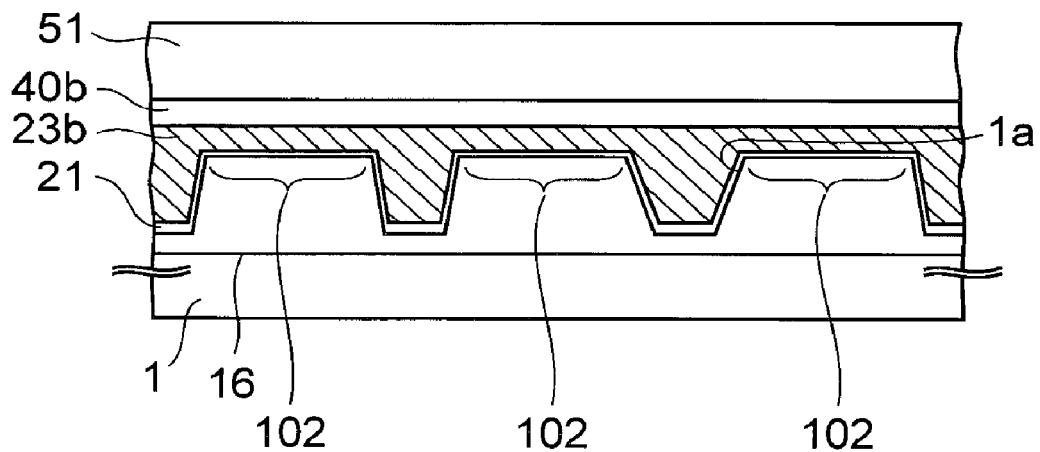

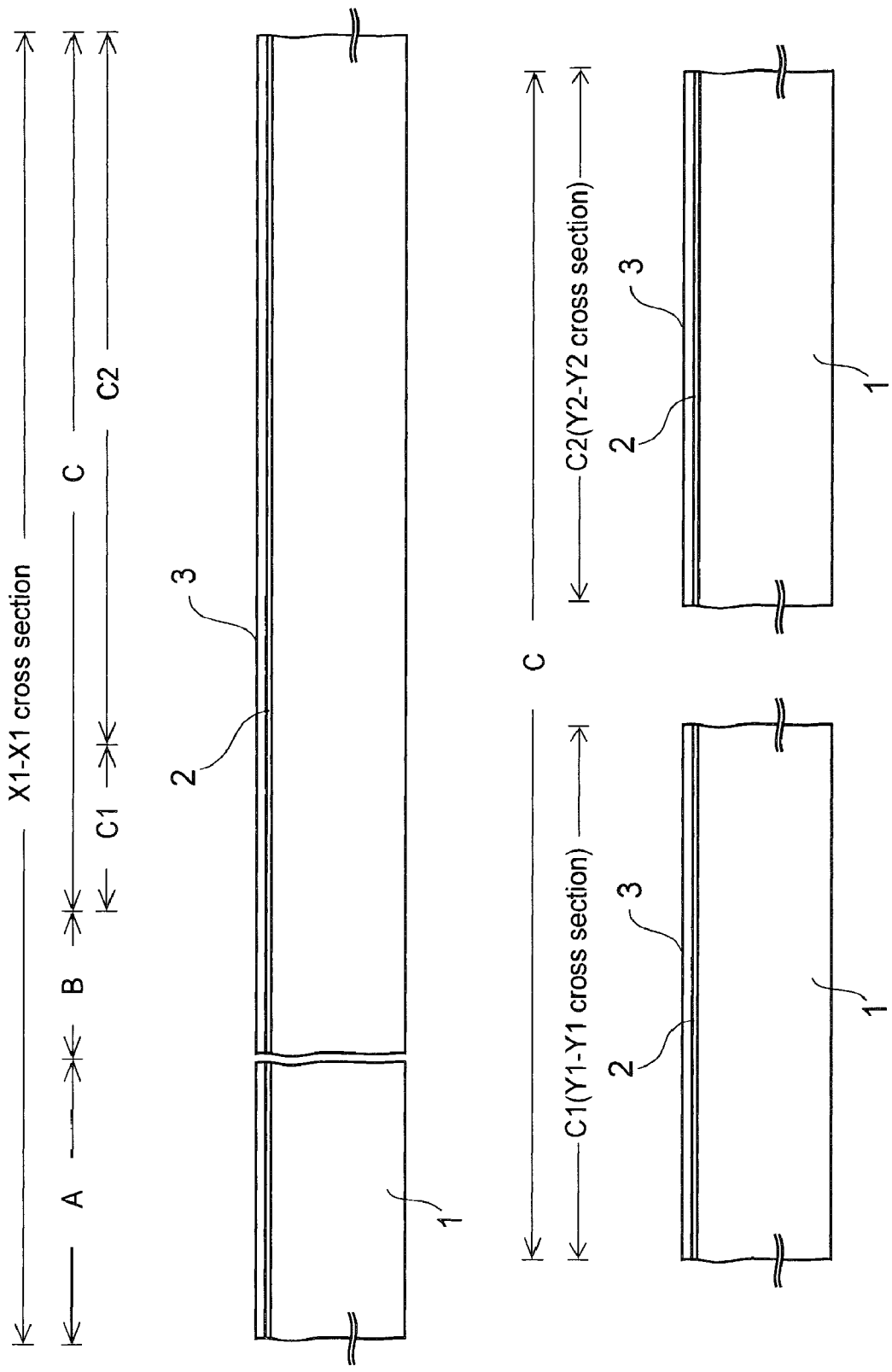

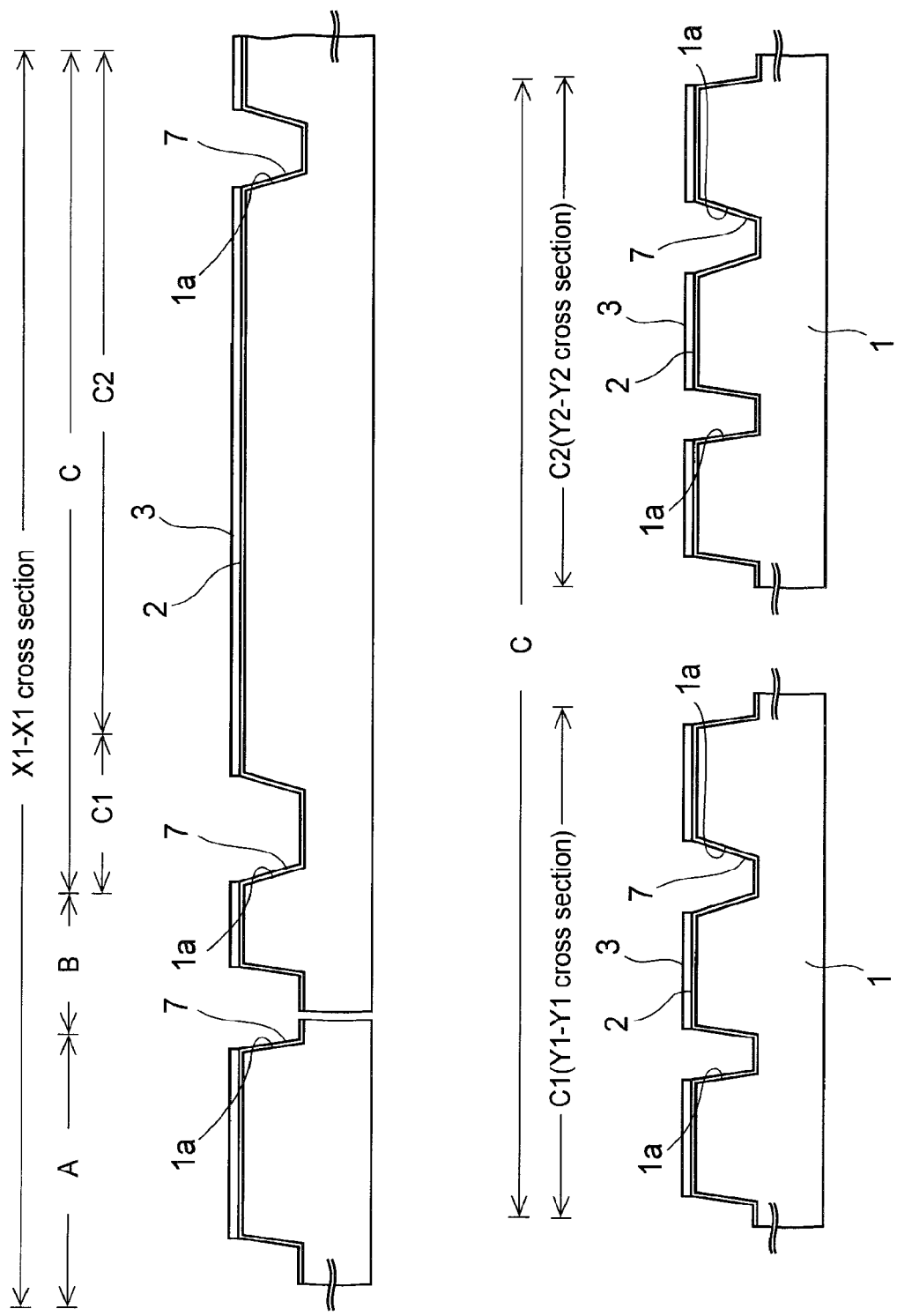

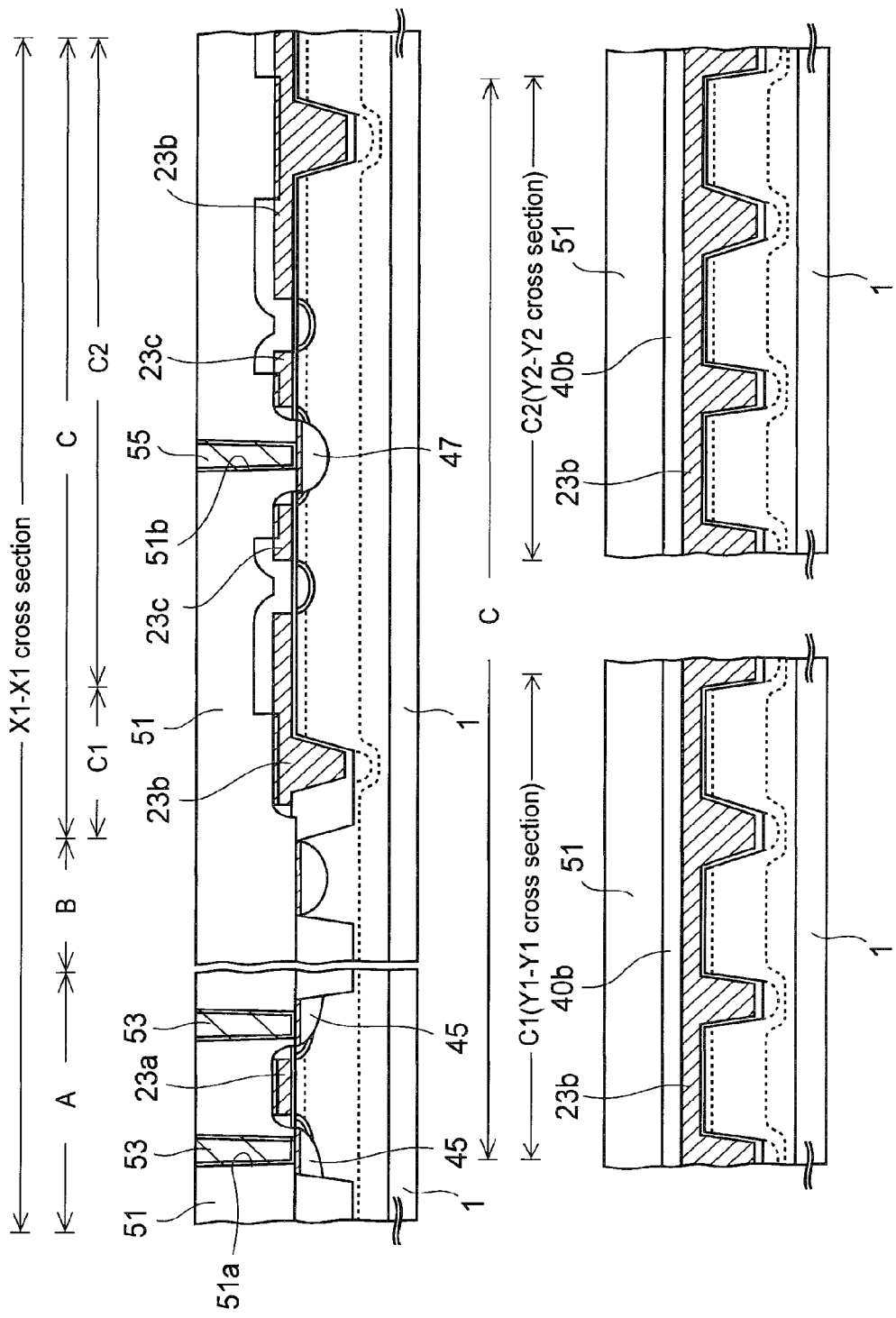

SEMICONDUCTOR DEVICE AND METHOD FOR MANUFACTURING THE SAME

CROSS-REFERENCE TO RELATED APPLICATION

This application is a divisional of application Ser. No. 12/049,592, filed Mar. 17, 2008 now U.S. Pat. No. 7,863,664, which is based upon and claims the benefit of priority of the prior Japanese Patent Application No. 2007-068438 filed on Mar. 16, 2007, the entire contents of which are incorporated herein by reference.

TECHNICAL FIELD

It is related to a semiconductor device and a method for manufacturing the same.

BACKGROUND

There are various types of semiconductor devices, such as a dynamic random access memory (DRAM) and a static random access memory (SRAM). Among these types, a semiconductor device, in which a trench capacitor for storing information is formed in an element isolation insulating film, has advantages of those of both DRAM, which can easily be highly integrated and have large capacitance, and SRAM, which can operate at a high speed with low power consumption.

Accordingly, to maximize the advantages of low power consumption, the semiconductor device of this type is required to have such a configuration in which a leak current in the trench capacitor can be reduced.

International Publication No. WO92/02044 Pamphlet discloses a technique relating to the present embodiment. In this literature, a dummy active region is provided in an outer periphery of a cell region in order to prevent a width of a true active region from reducing at the time of etching.

SUMMARY

It is an aspect of the embodiments discussed herein to provide a semiconductor device, including a semiconductor substrate provided with a plurality of cell active regions in a cell region, an element isolation groove formed in the semiconductor substrate between the cell active regions, a capacitor dielectric film formed in the element isolation groove, and a capacitor upper electrode, formed over the capacitor dielectric film, and constituting a capacitor together with the semiconductor substrate and the capacitor dielectric film, wherein a dummy active region is provided in the semiconductor substrate beside the cell region.

BRIEF DESCRIPTION OF THE DRAWINGS

FIG. 4 shows cross-sectional views taken along the line Y1-Y1 and the line Y2-Y2 in FIG. 1.

DETAILED DESCRIPTION OF THE EMBODIMENTS

Prior to describing preferred embodiments, the preliminary explanation of the present embodiments will be given.

Figure 1:
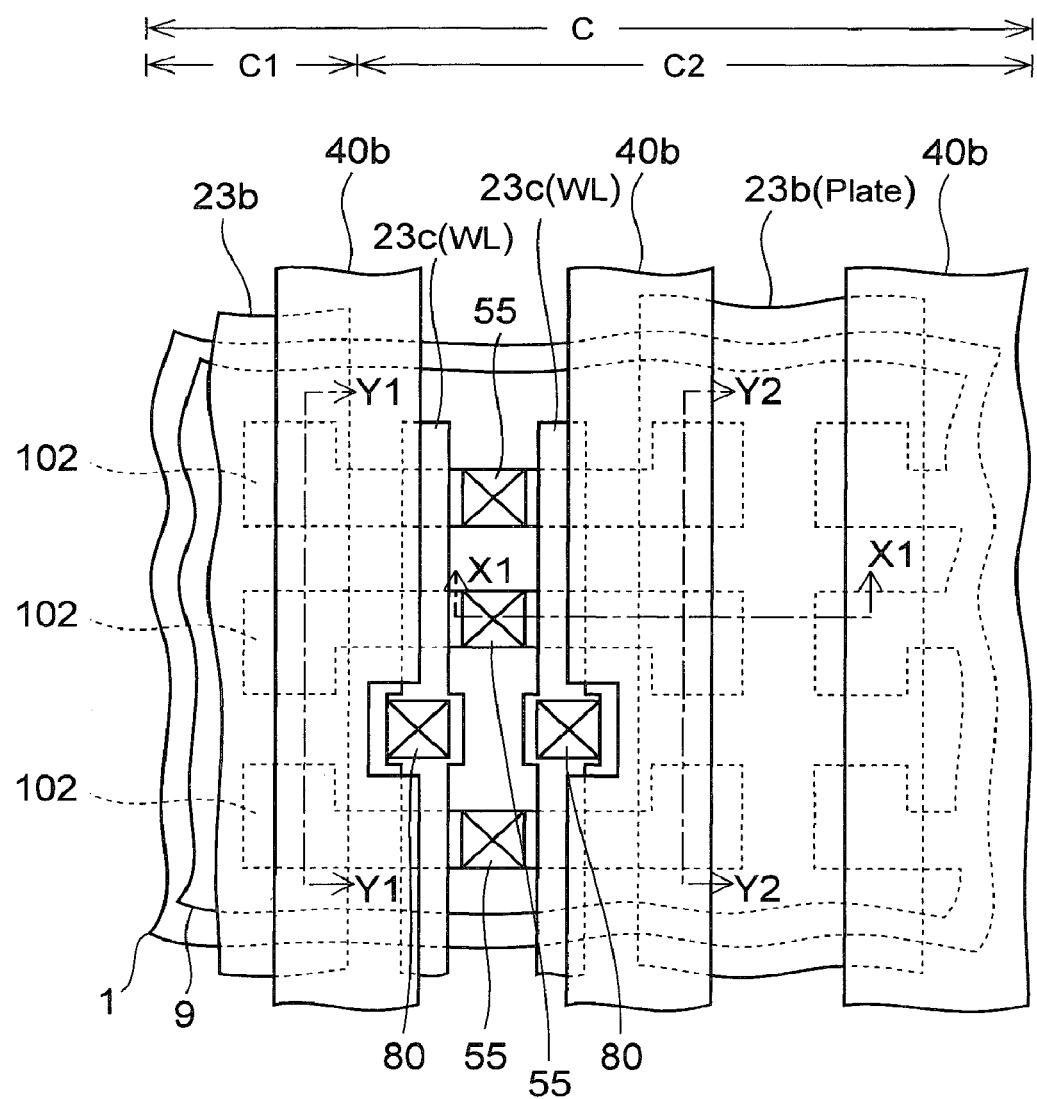
FIG. 1 is an enlarged plan view of a semiconductor device according to the preliminary explanation of the present invention.
Figure 2:
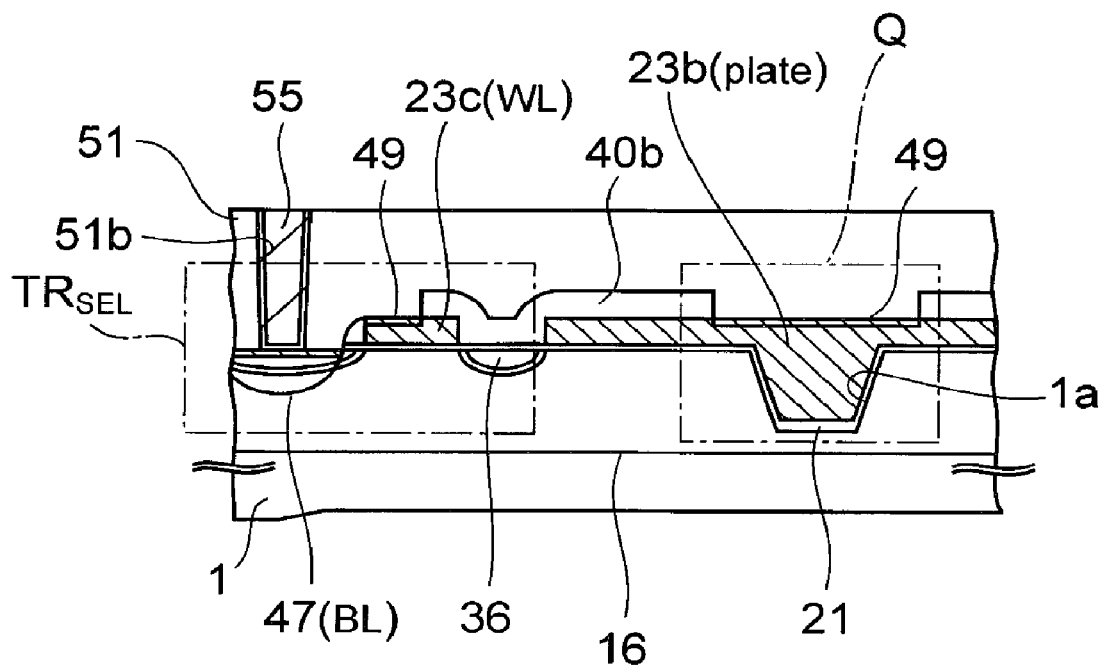
FIG. 2 is a cross-sectional view taken along the line X1-X1 in FIG. 1.

FIG. 1 is an enlarged plan view of a semiconductor device according to the preliminary explanation of the present embodiment. FIG. 2 is a cross-sectional view taken along the line X1-X1 in FIG. 1.

This semiconductor device uses a capacitor formed in an element isolation groove as a cell capacitor. FIG. 1 shows an end portion C1 of a cell region C, that is, an enlarged vicinity of a portion where a cell is absent on the left side of the figure.

As shown in FIG. 2, this semiconductor device has an n-well 16 formed in a p-type silicon substrate (semiconductor substrate) 1. In addition, an element isolation groove 1a is formed in the upper surface of the silicon substrate 1, and a capacitor dielectric film 21 made of a silicon oxide film is formed in the element isolation groove 1a.

Furthermore, an upper electrode (plate electrode) 23b made of polysilicon is formed on the capacitor dielectric film 21. A capacitor Q is constructed from the upper electrode 23b, the capacitor dielectric film 21, and the silicon substrate 1.

Moreover, a MOS-type selection transistor $TR_{SEL}$, in which the capacitor dielectric film 21 is served as a gate insulating film, is formed next to the capacitor Q. The selection transistor $TR_{SEL}$ has a source/drain extension 36 and a source/drain region 47 in addition to a gate electrode (word line) 23c made of polysilicon.

Of these, the source/drain extension 36 functions to electrically connect the capacitor Q and the selection transistor $TR_{SEL}$. On the other hand, the source/drain region 47 constitutes a part of a bit line (BL).

Then, a metal silicide layer 49 is formed on upper surfaces of the electrodes 23b and 23c in a region which is not covered with a silicide block 40b. Furthermore, an interlayer insulating film 51 is formed over an entire upper surface of the silicon substrate 1. The interlayer insulating film 51 has a hole 51b over the source/drain region 47, and a bit line contact plug 55 is formed in the hole 51b.

Note that, in the process of forming the bit line contact plug 55, a word line contact plug 80 is also formed on the gate electrode 23c at the same time as shown in FIG. 1.

A plurality of cell active regions 102 shown in FIG. 1 are defined as regions where the element isolation groove 1a (see FIG. 2) is not formed in the silicon substrate 1. The cell active region 102 includes the source/drain extension 36, the source/drain region 47, and a channel region under the gate electrode 23c.

Figure 3:
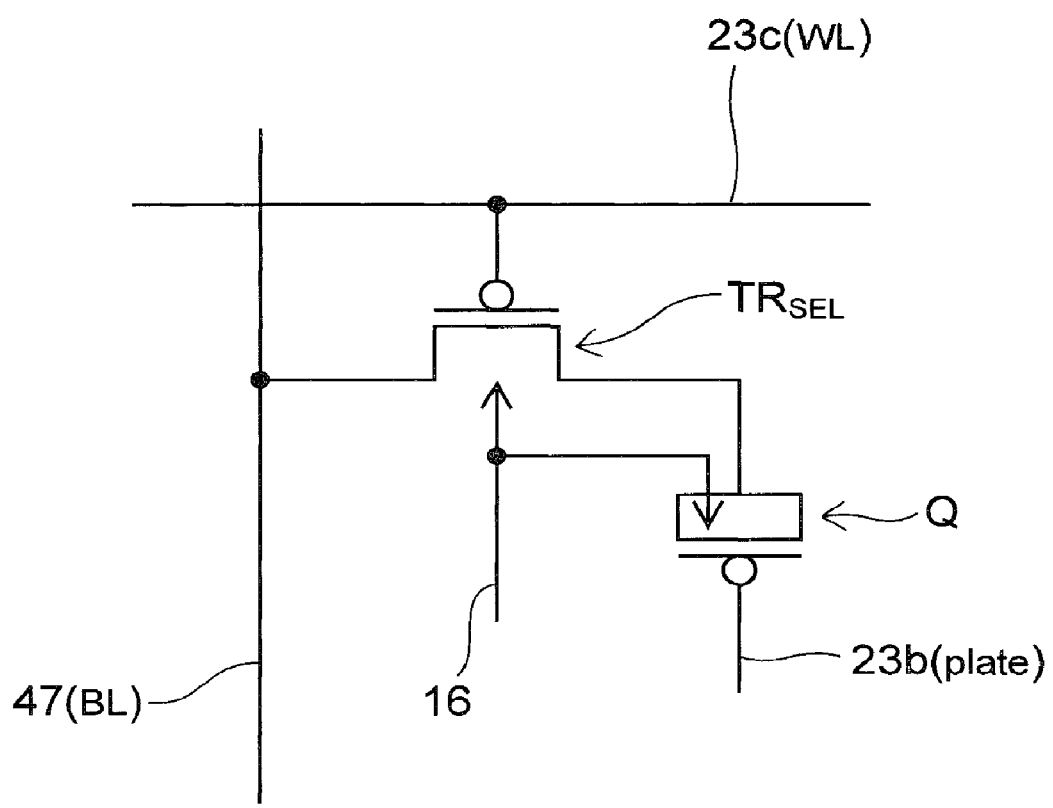
FIG. 3 is an equivalent circuit diagram of the semiconductor device according to the preliminary explanation of the present invention.

FIG. 3 is an equivalent circuit diagram of this semiconductor device.

As shown in FIG. 3, in this semiconductor device, one memory cell of one transistor-one capacitor type is constructed from the capacitor Q and the selection transistor $TR_{SEL}$. In this memory cell, voltages applied to the n-well 16 and the upper electrode (plate electrode) 23b are fixed. During operation, a ground potential is always applied to the n-well 16, and a voltage of −1.55 V is always applied to the upper electrode 23b.

For example, at the time of writing of "1", a high level voltage (0 V) is applied to the bit line (source/drain region) 47, and a low level voltage (−1.55 V) is applied to the word line (gate electrode) 23c. Thereby, the selection transistor $TR_{SEL}$ is turned on, so that a voltage of the bit line 47 is applied to the capacitor Q. As a result, a potential difference between both electrodes of the capacitor Q becomes 1.55 V, and electric charges are accumulated in the capacitor Q. In this manner, information "1" is written in the capacitor Q.

In contrast, at the time of writing of "0", a low level voltage (−1.2 V) is applied to the bit line 47 when the selection transistor $TR_{SEL}$ is in an ON state as in the case of the writing of "1." Thereby, a potential difference between the both electrode of the capacitor Q becomes as small as 0.35 V (=|−1.55 V-(−1.2 V)|), so that electric charges are hardly accumulated in the capacitor Q. In this manner, information stored in the capacitor Q becomes "0".

Here, in order not to select this cell, it is needed that the voltage of 0.35 V is applied to the word line 23c to turn off the selection transistor $TR_{SEL}$.

FIG. 4 shows cross-sectional views taken along the line Y1-Y1 and the line Y2-Y2 in FIG. 1.

As shown in FIG. 4, although the shapes of the element isolation grooves 1a are designed to be the same for each of the grooves 1a, each of the actual cross-sectional shapes of the element isolation grooves 1a become different. This is due to the fact that the cell regions 102 are absent in the left side of the FIG. 1, so that the cell active regions 102 are arranged sparsely at the end portion C1 of the cell region C than the other region C2. Therefore, at the end portion C1, width of the element isolation groove 1a is narrowed by an optical proximity effect at the time when the element isolation groove 1a is formed by etching.

In addition, when the cell active regions 102 are sparsely distributed in this manner, the inclination angle θ of a side surface of the element isolation groove 1a tends to be large when the element isolation groove 1a is formed by etching. This also causes a difference in the cross-sectional shapes of the element isolation grooves 1a.

When the width of the element isolation groove 1a is decreased due to the optical proximity effect, a leak current along the path P in the FIG. 4 is increased between the adjacent cell active regions 102. This is because since the fixed voltage (−1.55 V) is always applied to the upper electrode 23b during operation as described above, a conductivity of the bottom surface of the element isolation groove 1a is reversed from the n-type of the n-well 16 to a p-type to unintentionally form a channel 1b, and thus, the leak current becomes more likely to flow along the channel 1b, when a potential difference is caused between the adjacent cell active regions 102 as in the case where the voltage of the bit line is changed.

When such a leak current is generated in the case where stored information of the adjacent cells is different like "1" and "0", a charge flows from one cell to the other. This causes an inconvenience that the information stored in each cell is destroyed.

Although the leak current is likely to be caused in the end portion C1 of the cell region C as described above, the inventor of the present application carried out the investigation in an actual product to specify a position where a leak current is likely to be caused.

Figure 5:
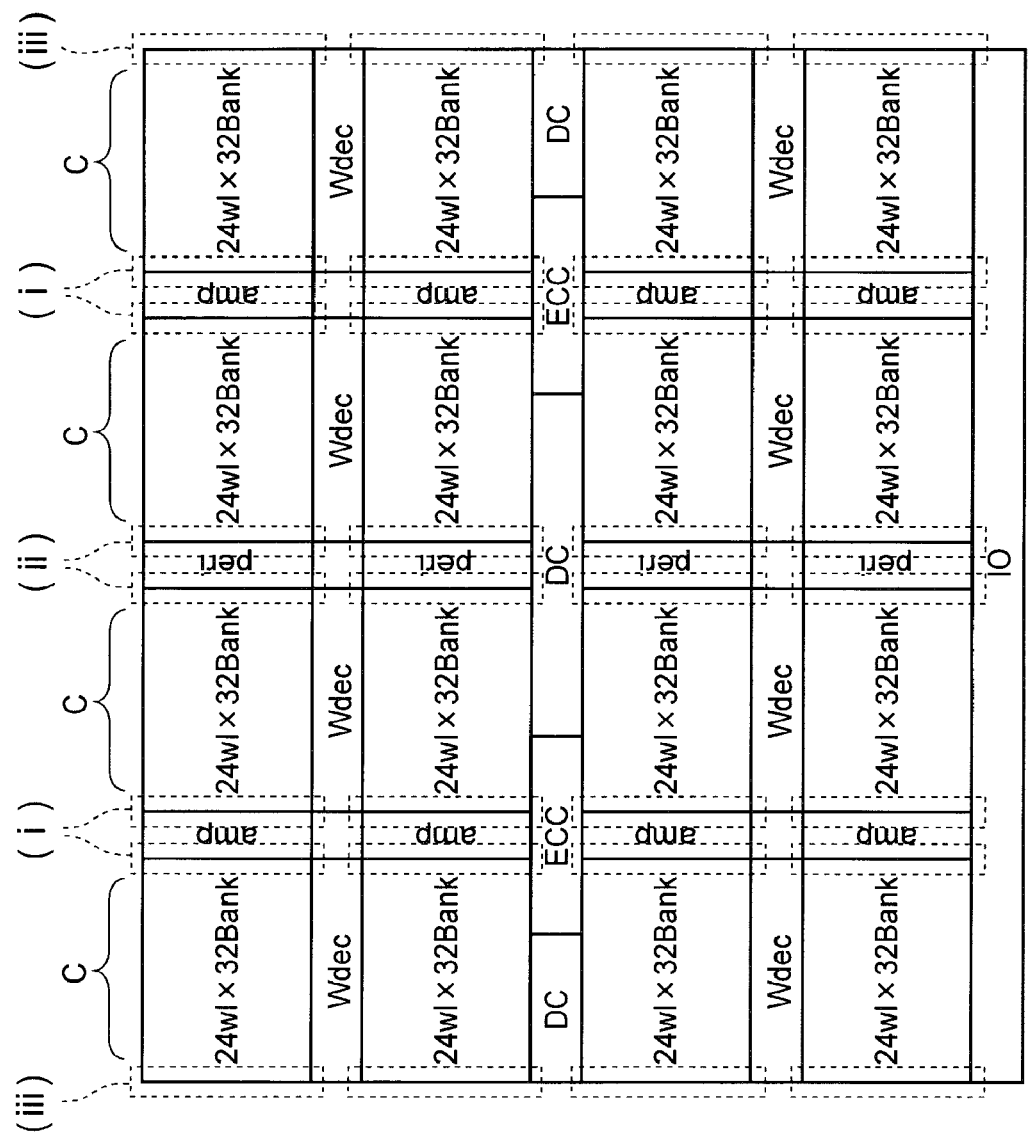
FIG. 5 is a plan layout of an actual product.

FIG. 5 is a plan layout of an actual product.

In the FIG. 5, the cell region C has a bank structure with 24 w1.times.32 Bank, and are arranged in 4 rows and 4 columns. In addition, peripheral circuit regions such as an amplifier circuit amp, a word line decoder Wdec, a direct current circuit DC, a redundant circuit ECC, an input output circuit 10 and the like are arranged between the adjacent cell regions C.

The investigation results revealed that, in such a layout, the above-described leak current is notably generated in boundaries between the cell regions C and peripheral circuit regions as shown in (i) to (iii) of FIG. 5.

In view of these points, the inventor of the present application has devised embodiments as described below.

Figure 6B:
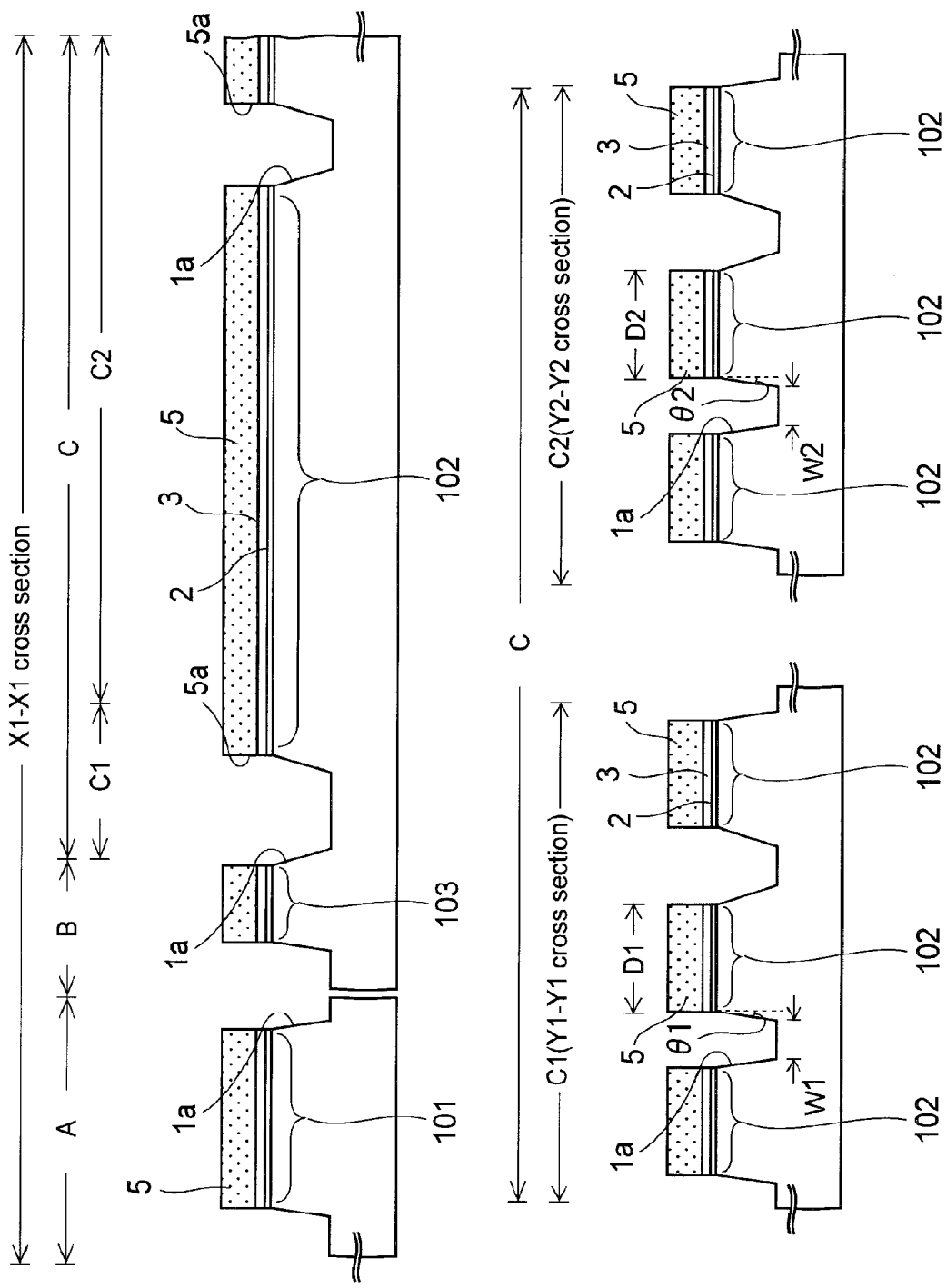
FIGS. 6A to 6Y are cross-sectional views showing processes of manufacturing a semiconductor device according to a first embodiment of the present invention.
Figure 7A:
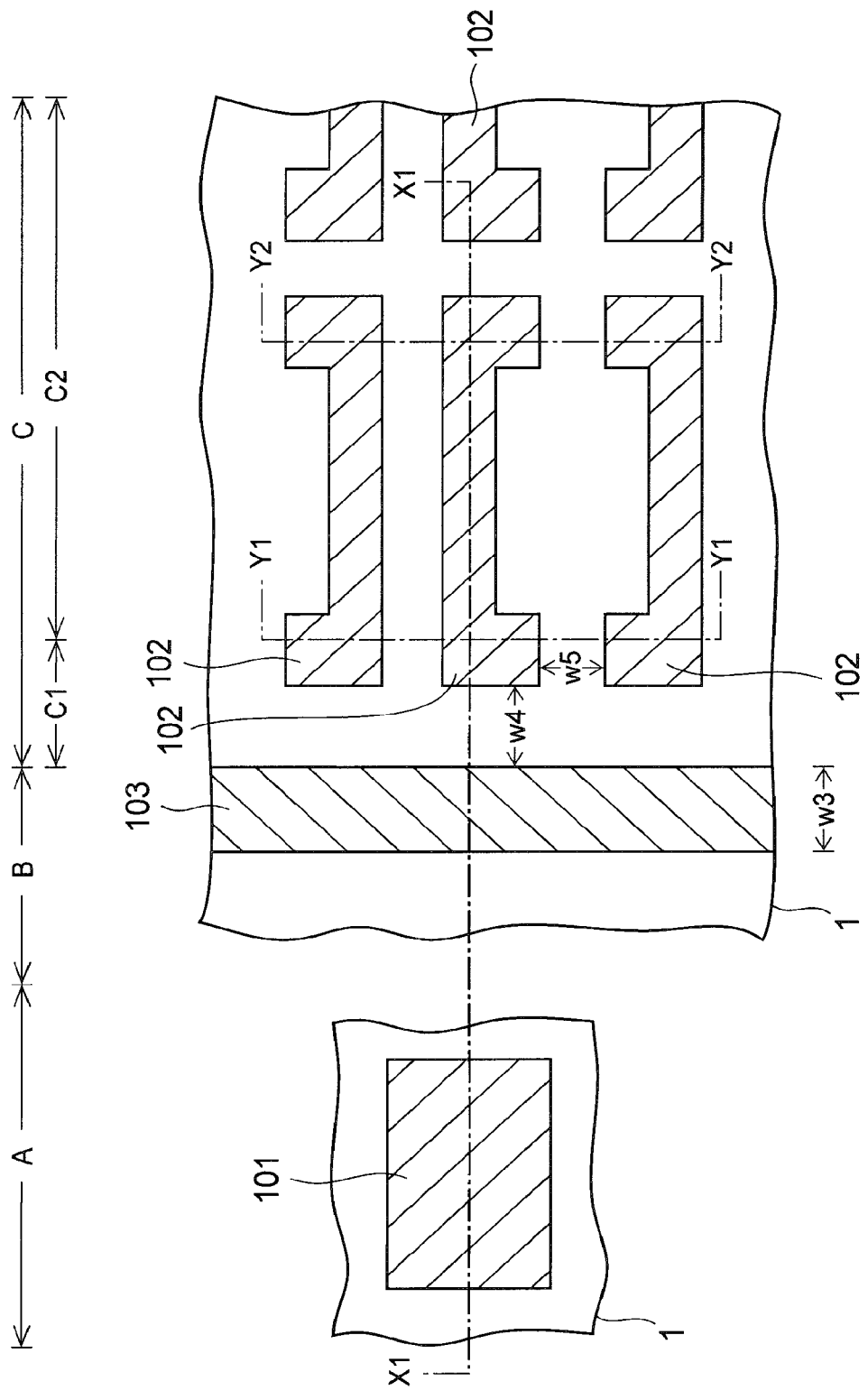
FIGS. 7A and 7B are plan views showing processes of manufacturing a semiconductor device according to the first embodiment of the present invention.
Figure 7B:
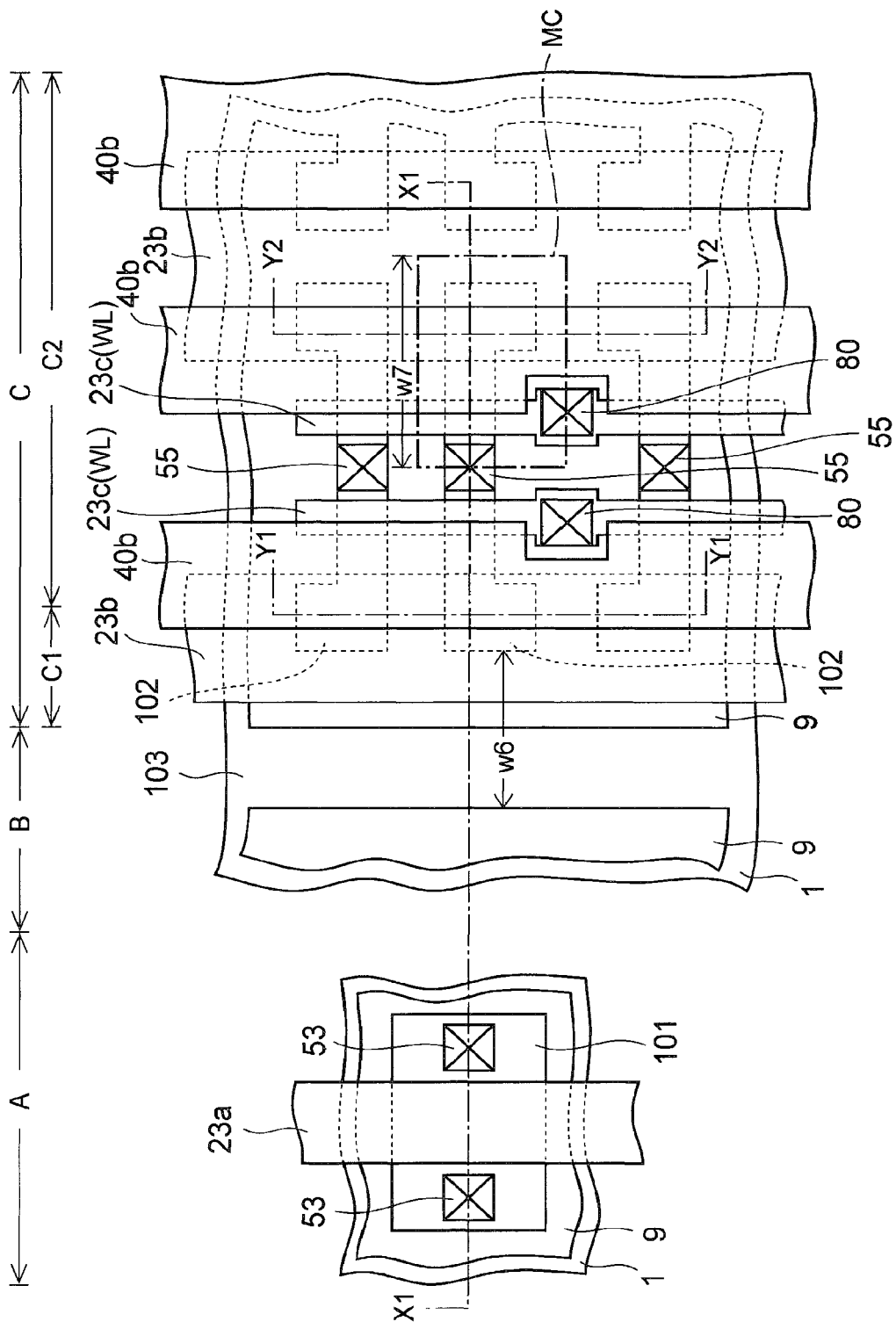

FIGS. 6A to 6Y are cross-sectional views showing processes of manufacturing a semiconductor device according to a first embodiment, and FIGS. 7A and 7B are plan views thereof.

In each of the cross-sectional views of FIGS. 6A to 6Y, in addition to a peripheral circuit region A and a cell region C, a cross section of a free region B beside an end portion of the cell region C is also shown. In these figures, a cross-sectional view shown in the upper side corresponds to a cross-sectional view taken along the line X1-X1 in the plan views (FIGS. 7A and 7B). In addition, as to the cell region C, cross sections taken along the line Y1-Y1 and the line Y2-Y2 in the plan views (FIGS. 7A and 7B) are shown. Of these cross-sectional views of the cell region C, the cross-sectional view taken along the line Y1-Y1 is a cross-sectional view of the end portion C1 of the cell region C, and the cross-sectional view taken along the line Y2-Y2 is a cross-sectional view in the other portion C2.

Furthermore, in FIGS. 6A to 6Y and FIGS. 7A and 7B, same reference numerals of FIGS. 1 to 5 are given to denote the same components as those described in the preliminary explanation.

To manufacture this semiconductor device, as shown in FIG. 6A, a first thermally-oxidized film 2 is firstly formed with a thickness of approximately 10 nm by thermally oxidizing the upper surface of the p-type silicon substrate 1. Subsequently, a silicon nitride film is formed with a thickness of approximately 112 nm on the first thermally-oxidized film 2 by a plasma CVD method. The silicon nitride film thus formed is used as a polishing stopper film 3.

The polishing stopper film 3 made of silicon nitride has high stress, but by forming the polishing stopper film 3 on the first thermally-oxidized film 2 in this manner, defects due to the stress of the polishing stopper film 3 can be prevented from being caused in the silicon substrate 1.

Next, as shown in FIG. 6B, a photoresist is applied on the polishing stopper film 3, and then is exposed and developed to form a first resist pattern 5. After that, the polishing stopper film 3, the first thermally-oxidized film 2, and the silicon substrate 1 are dry-etched through windows 5a of the first resist pattern 5.

The dry etching is carried out, for example, by use of $Cl_2$ as an etching gas, in an inductively coupled plasma (ICP)-type plasma etching equipment.

Thereby, element isolation grooves 1a, which define a plurality of cell active regions 102, are formed in the silicon substrate 1.

In addition, in the free region B beside the cell region C, a dummy active region 103 is defined by the element isolation grooves 1a.

Furthermore, in the peripheral circuit region A, the element isolation grooves 1a, which define a peripheral active region 101 such as a source/drain region and a channel region of a peripheral MOS transistor, is formed in the silicon substrate 1.

In the above dry etching, such an etching conditions is employed that the side surfaces of the windows 5a are receded during the etching. Therefore, the side surfaces of the isolation device grooves 1a are inclined from a normal line direction of the silicon substrate 1 as shown in the figure.

Thereafter, the above-described first resist pattern 5 is removed.

FIG. 7A is a plan view after this process is finished.

As shown in FIG. 7A, the dummy active region 103 is formed independently from the cell active regions 102.

In addition, the plane sizes of the cell active regions 102 and the dummy active region 103 are not particularly limited. In the present embodiment, the width W3 of the dummy active region 103 is set to 0.24 μm. In addition, the interval W4 between the cell regions 102 and the dummy active region 103 is set to 0.49 μm. The adjacent cell active regions are separated by the width W5 (=0.19 μm).

As described above, in the present embodiment, the dummy active region 103 is provided in the free region B. Accordingly, in the end portion C1 of the cell region C, the cell active region 102 are hypothetically arranged densely. For this reason, the cell active regions 102 in the end portion C1 and in the other portion C2 are arranged with the substantially same density. Accordingly, the optical proximity effects at the time of exposing the photoresist can be substantially made equal in the portions C1 and C2. Thereby, widths D1 and D2 of the first resist pattern 5 in the portions C1 and C2 (see FIG. 6B) can be substantially made equal. Thus, as shown in the cross-sectional view of FIG. 6B, the widths W1 and W2 of the element isolation grooves 1a become substantially equal in the Y1-Y1 cross section and the Y2-Y2 cross section.

Furthermore, since the dummy active region 103 is provided to reduce differences of the arrangement densities of the cell active regions 102 in the end portion C1 of the cell region C, the dry etching at the time of forming element isolation grooves 1a proceeds in the substantially same manner in the end portion C1 and the other portion C2. Thus, inclinations .theta.1 and .theta.2 of the side surfaces of the element isolation grooves 1a in these portions can be made substantially equal.

Next, as shown in FIG. 6C, to recover damages received in the inner surfaces of the element isolation grooves 1a due to the dry etching, the inner surfaces of the element isolation grooves 1a are thermally oxidized to form a second thermally-oxidized film 7. The thickness of the second thermally-oxidized film 7 is not particularly limited. In the present embodiment, its thickness is set to approximately 10 nm.

Figure 6D:
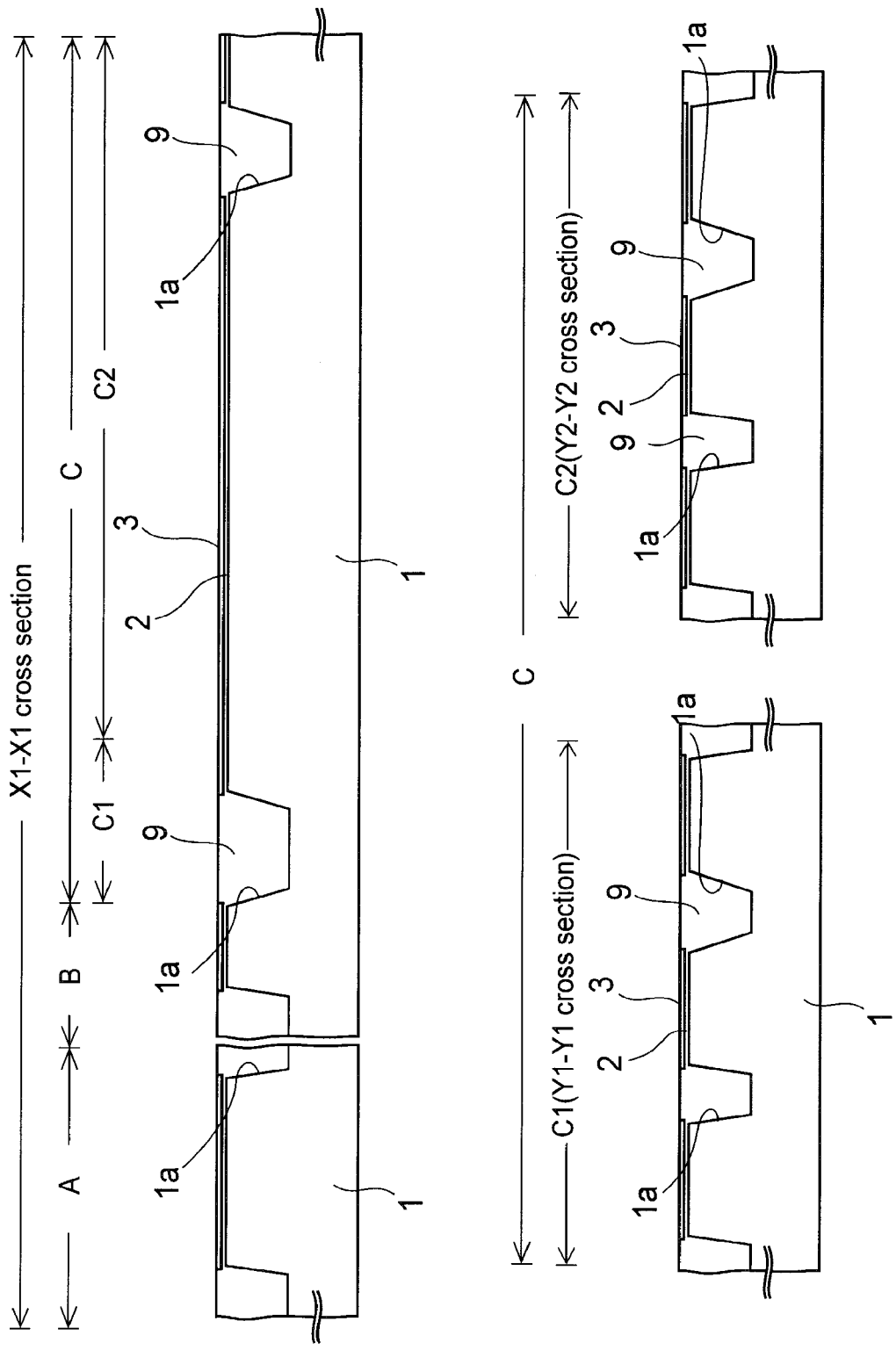

Next, processes for obtaining a cross-sectional structure shown in FIG. 6D will be described.

Firstly, a silicon oxide film as an element isolation insulating film 9 is formed on each of the second thermally-oxidized film 7 and the polishing stopper film 3 by the high density plasma CVD (HDPCVD) method. The element isolation grooves 1a are completely embedded with the element isolation insulating film 9.

Thereafter, the excessive element isolation insulating film 9 formed on the polishing stopper film 3 is polished and removed by the CMP method. Thus, the element isolation insulating film 9 is left only in the element isolation grooves 1a. Note that the polishing is automatically stopped at the polishing stopper film 3.

In addition, since the second thermally-oxidized film 7 is formed in the element isolation grooves 1a in advance, adhesiveness of the silicon substrate 1 and the element isolation insulating film 9 can be increased, so that exfoliation of the element isolation insulating film 9 can be prevented.

Figure 6E:
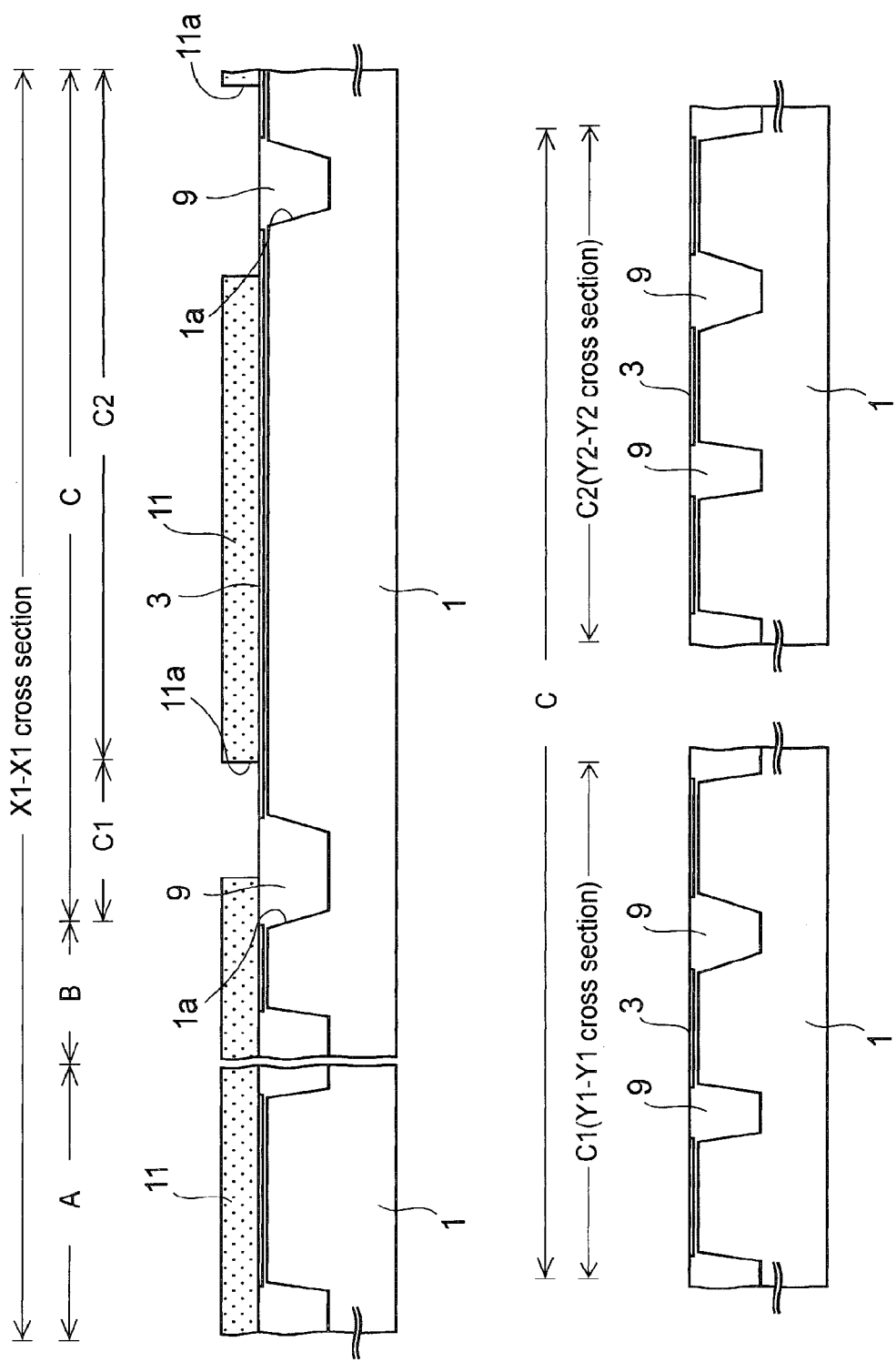

Next, as shown in FIG. 6E, a photoresist is applied on the polishing stopper film 3 and the element isolation insulating film 9. The photoresist is then exposed and developed to form a second resist pattern 11. As shown in FIG. 6E, the second resist pattern 11 has windows 11a in regions where a capacitor is to be formed later.

Figure 6F:
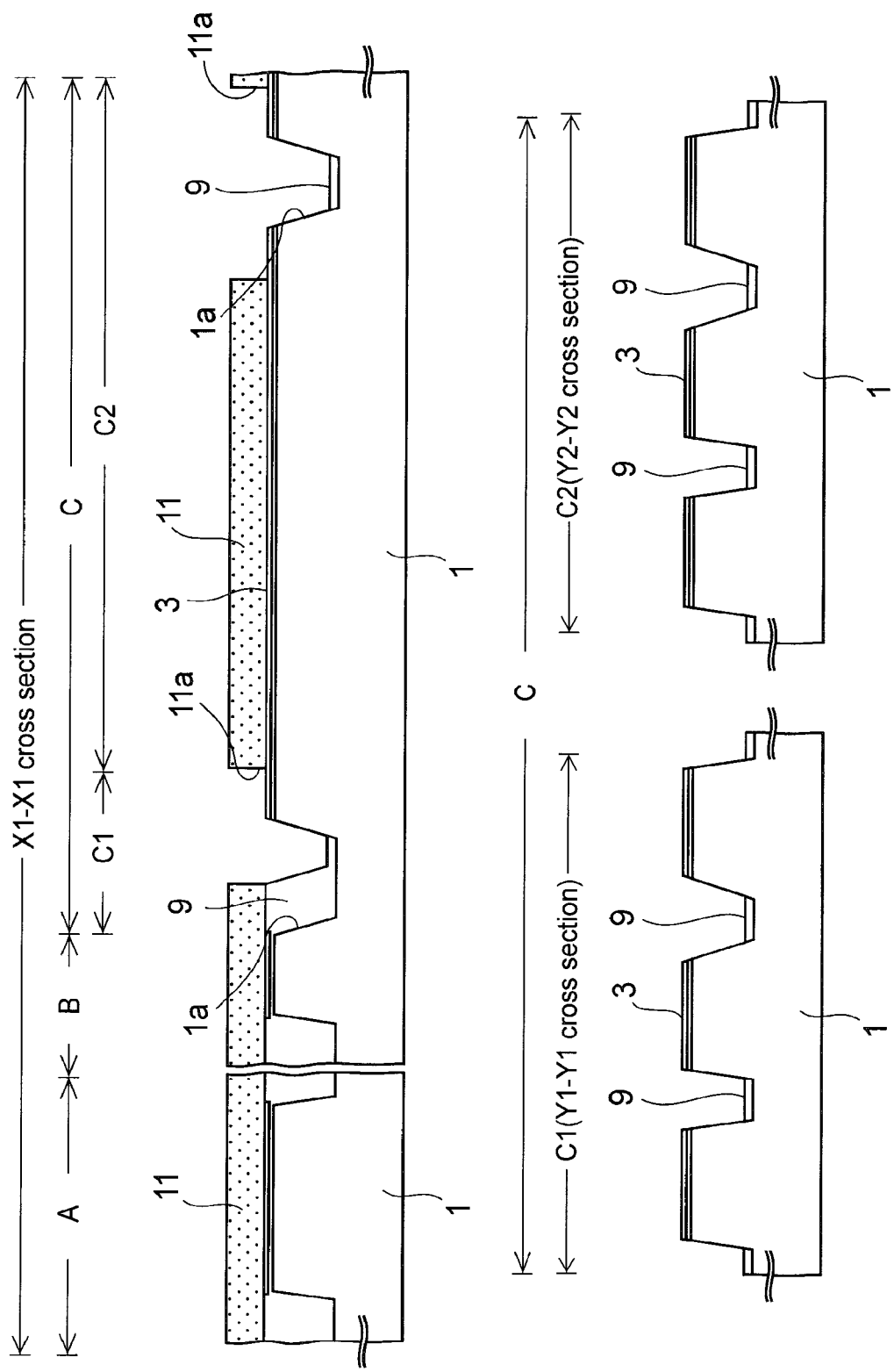

Subsequently, as shown in FIG. 6F, the element isolation insulating film 9 is dry-etched through the windows 11a. Thereby, the element isolation insulating film 9 in the region where a capacitor is to be formed is thinned, and the upper surface of the element isolation insulating film 9 is lowered than the upper surface of the silicon substrate 1.

This dry etching is carried out, for example, by use of $C_4F_8$ as an etching gas in a magnetron reactive ion etching (RIE) plasma etching equipment. Against this etching gas, an etching rate of silicon oxide is higher than that of silicon nitride. Thus, only the element isolation insulating film 9 made of silicon oxide can be selectively etched.

An etching time for etching the element isolation insulating film 9 is not particularly limited. In the present embodiment, the etching time is set to 25 seconds.

Figure 6G:
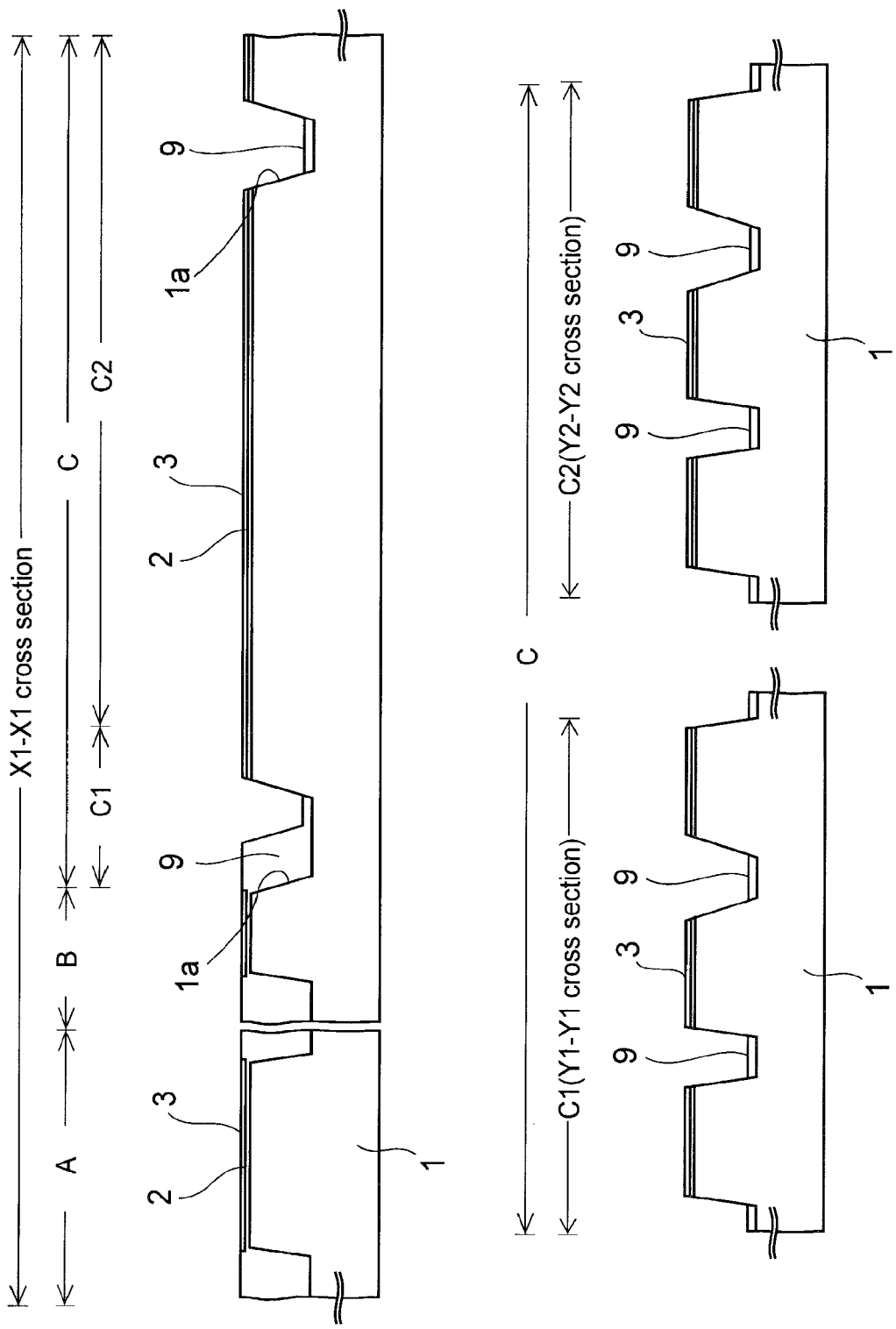

Next, as shown in FIG. 6G, the second resist pattern 11 is subjected to ashing and removed. Thereafter, the entire upper surface of the silicon substrate 1 is exposed to a hydrofluoric acid solution. By such wet etching, etching products generated during the etching process of FIG. 6F are removed, and the surface of the silicon substrate 1 is cleaned.

Figure 6H:
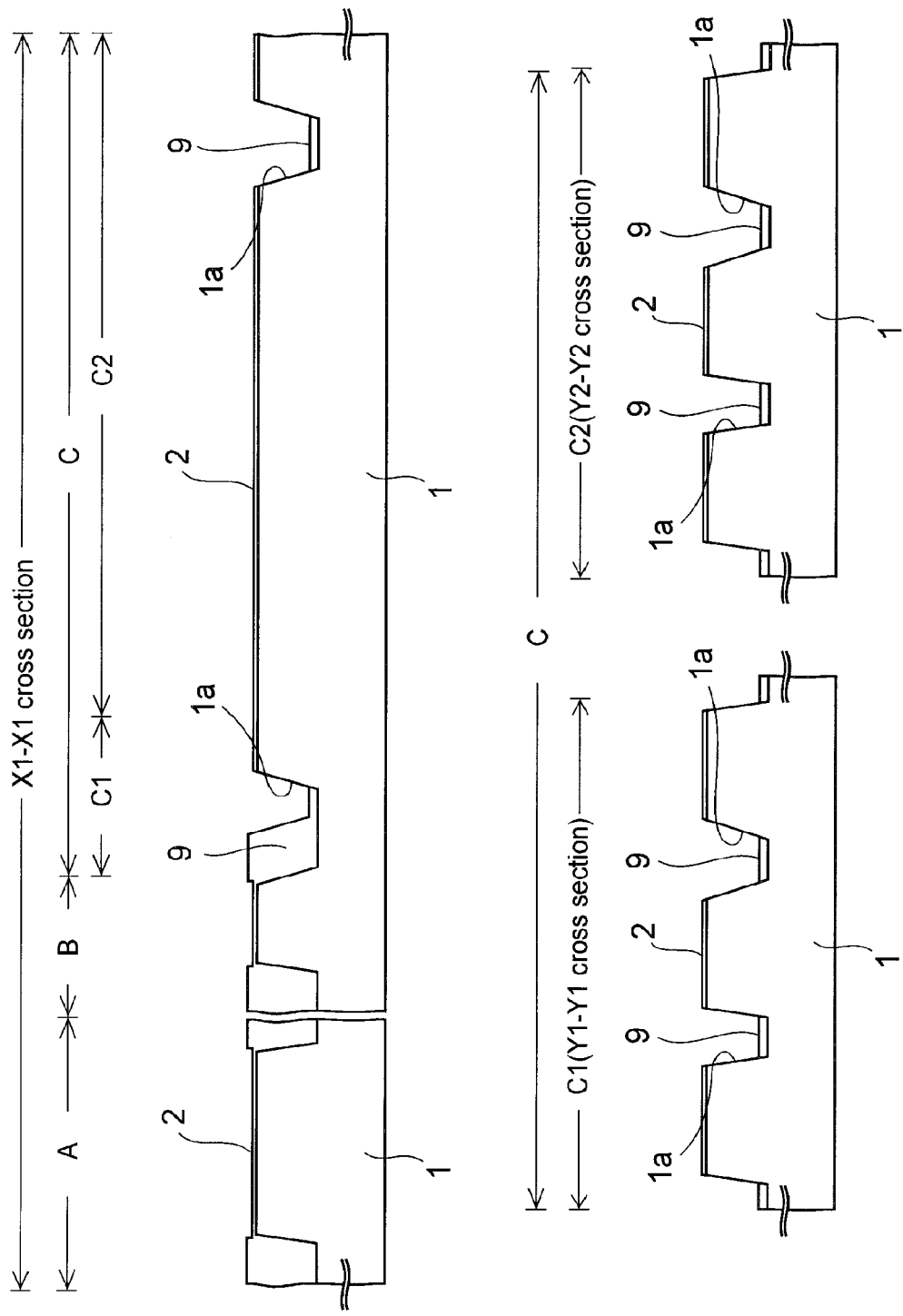

Next, as shown in FIG. 6H, the polishing stopper film 3 made of silicon nitride is removed by wet etching using phosphoric acid as an etching solution.

Figure 6I:
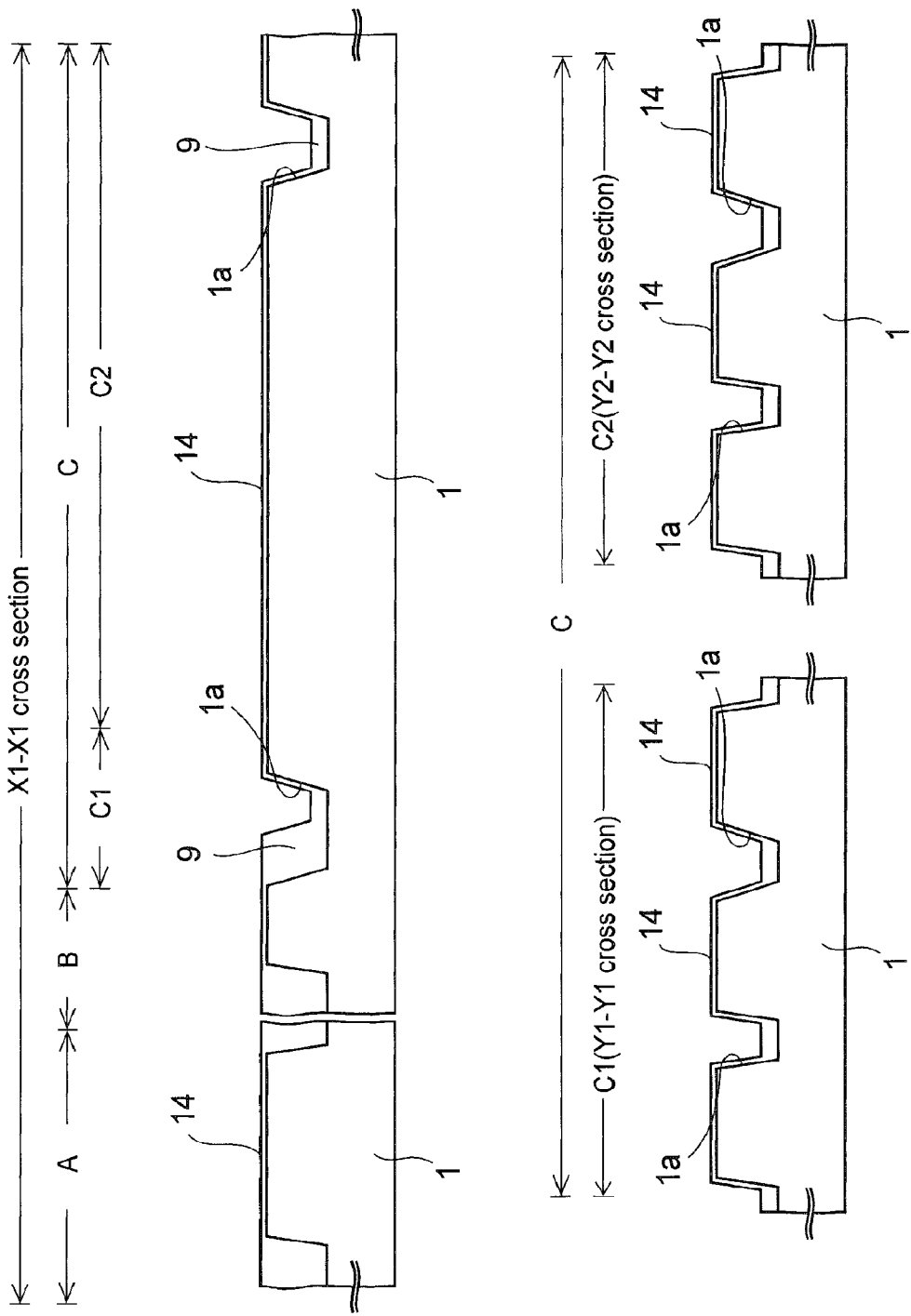

Next, as shown in FIG. 6I, in order to clean the surface of the silicon substrate 1, the surface is thermally oxidized again to form a third thermally-oxidized film 14 with a thickness of approximately 10 nm on inner surfaces of the element isolation grooves 1a.

Figure 6J:
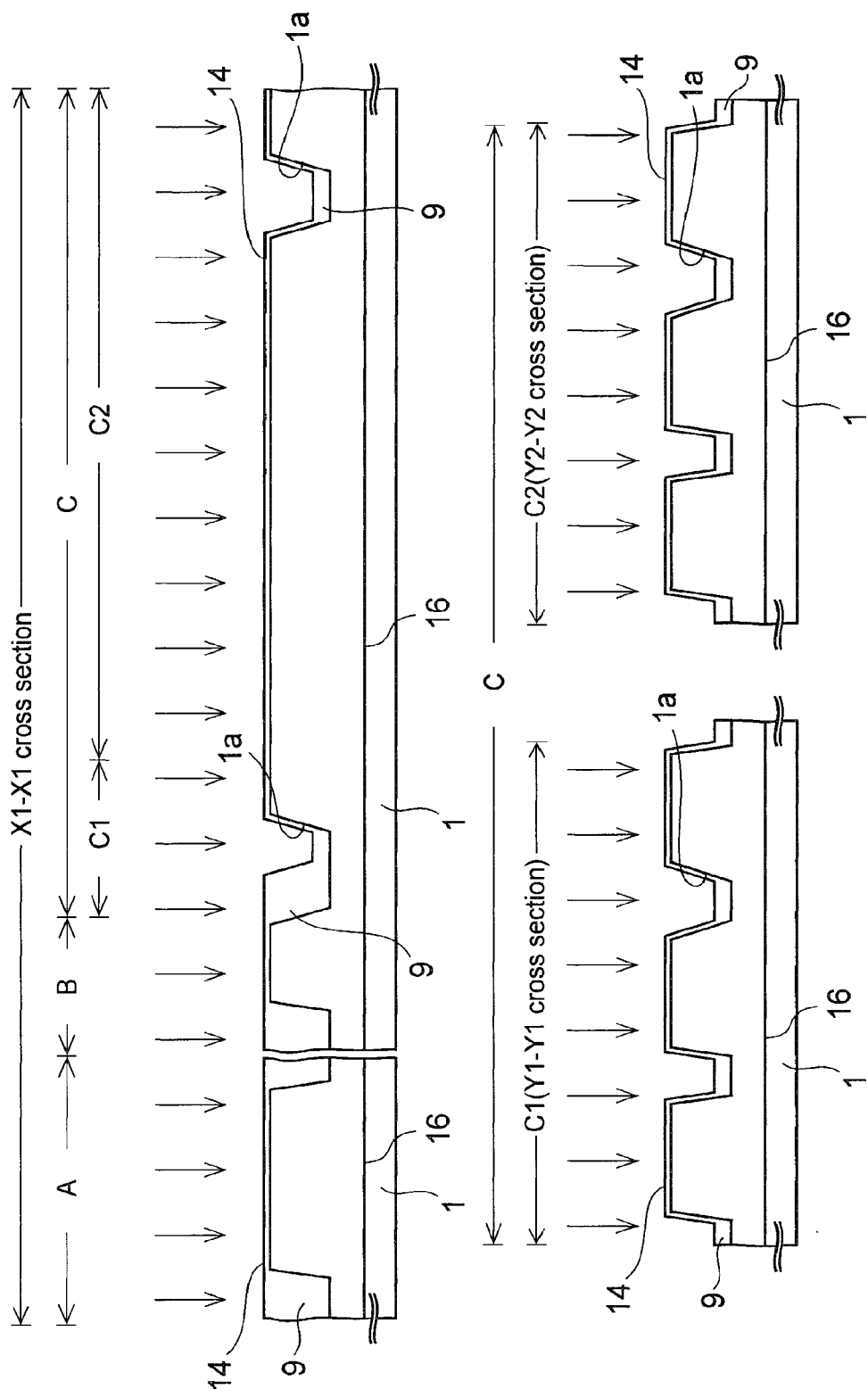

Next, as shown in FIG. 6J, phosphorus as an n-type impurity is ion-implanted into the silicon substrate 1 in the regions A to C under conditions with acceleration energy of 600 KeV and a dose amount of $1.\times 10^{13}$ cm$^{-2}$. Thereby, n-wells 16, which are deeper than the element isolation grooves 1a, are formed in these regions.

Here, if the n-type impurity concentration is low in portions under the element isolation insulating film 9, conductivity of that portions reverses to a p-type in some cases, so that channels which cause leak current are formed under the element isolation insulating film 9.

Figure 6K:
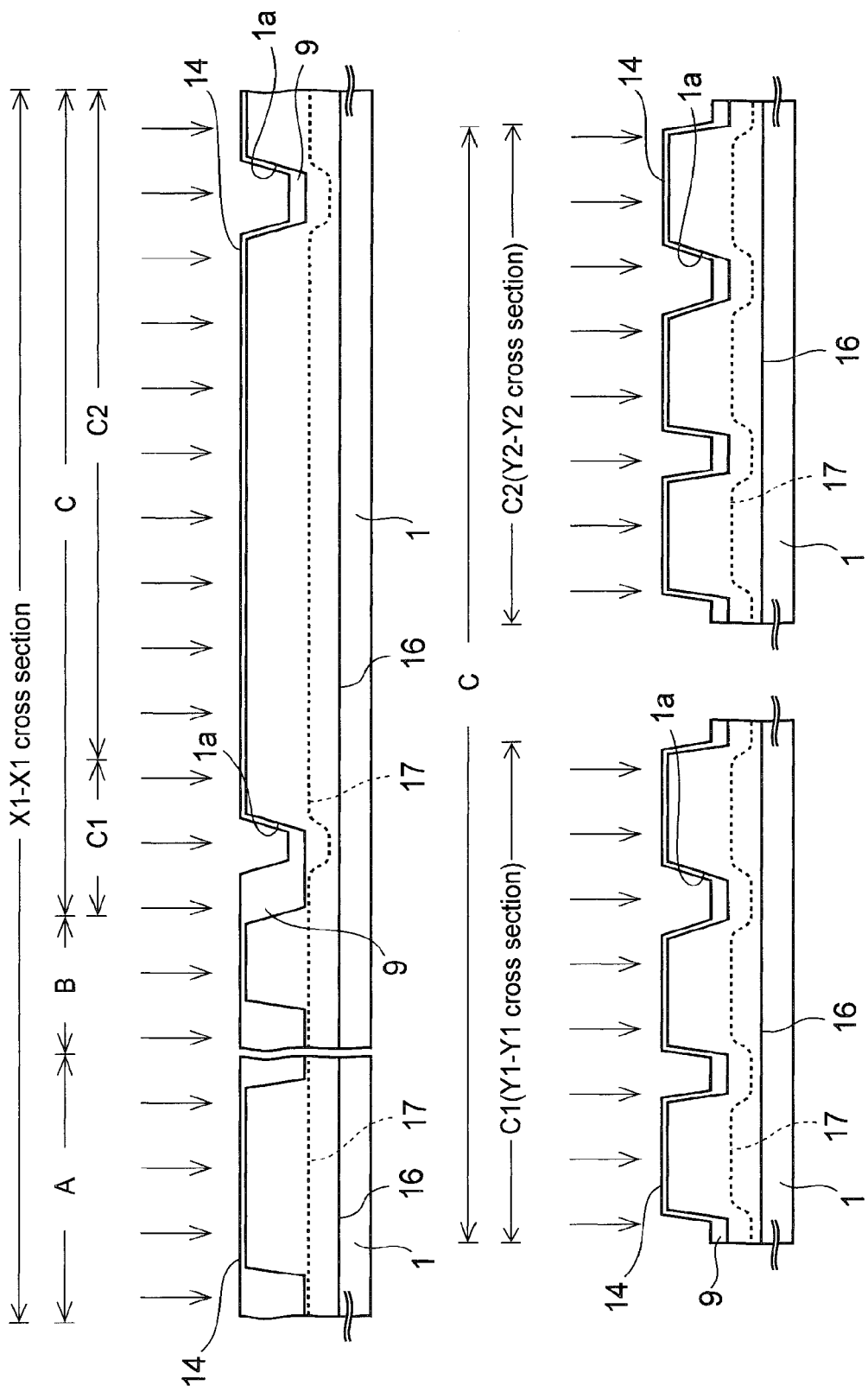

To deal with this problem, in the subsequent process, as shown in FIG. 6K, such n-type channel stop regions 17 are formed by the ion implantation that their impurity concentration has a peak on bottom surfaces of the element isolation grooves 1a. By such channel stop regions 17, it is prevented that the channels are formed under the element isolation grooves 1a.

Note that in the portions where a capacitor is formed later, the element isolation insulating film 9 is etched and thinned in the process of FIG. 6F, so that ions are more deeply implanted into the silicon substrate 1 than other portions. Accordingly, in the portions where a capacitor is formed later, the impurity concentration has a peak in a position deeper than the bottom surfaces of the element isolation grooves 1a as shown in the figure.

The conditions for this ion implantation are not particularly limited. In the present embodiment, phosphorus as an n-type impurity is implanted under conditions with acceleration energy of 240 KeV and a dose amount of $1.\times 10^{12}$ cm$^{-2}$.

Figure 6L:
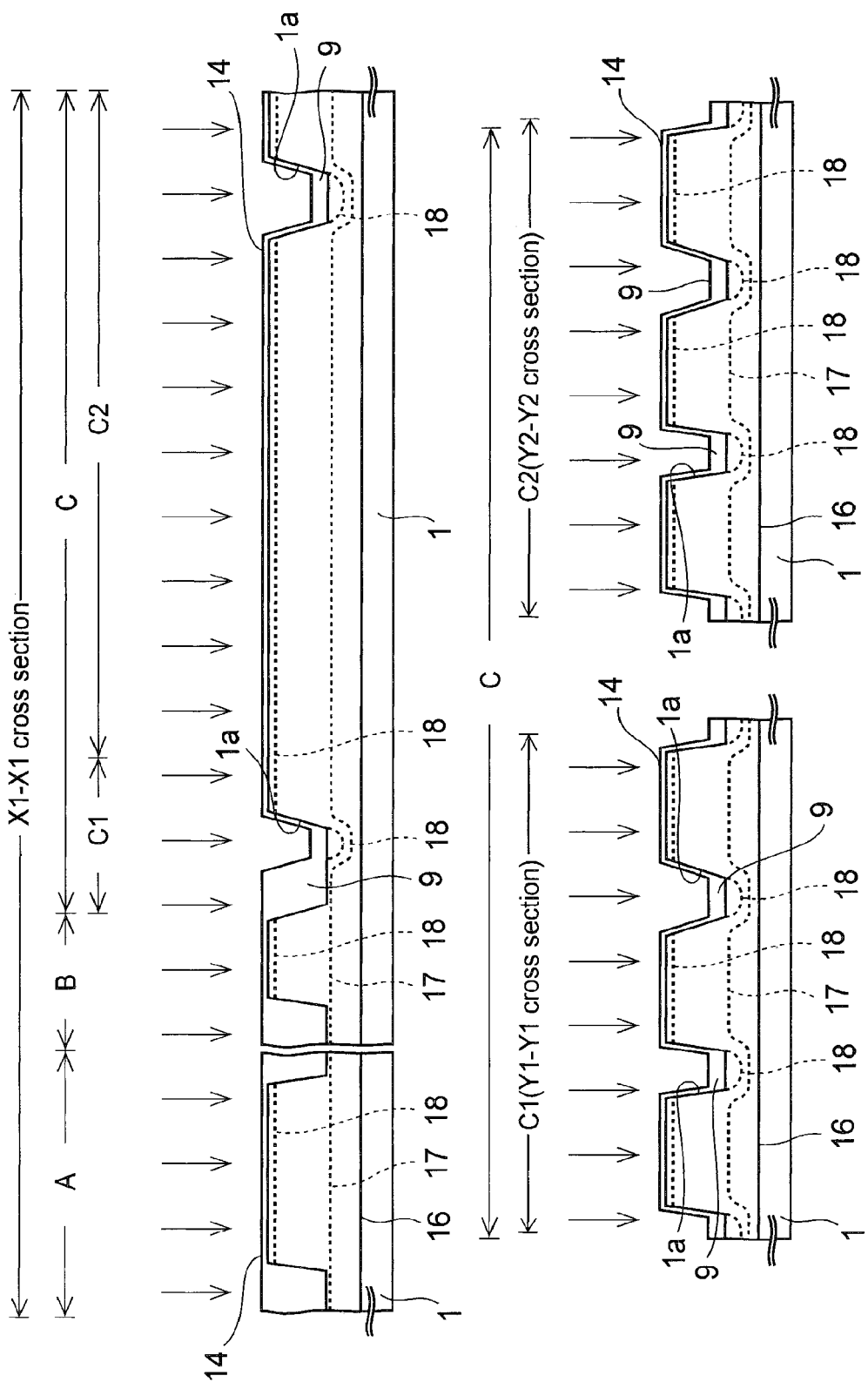

Next, as shown in FIG. 6L, in order to adjust a threshold voltage of a pMOS transistor to be formed later in the peripheral circuit region A and the cell region C, arsenic as an n-type impurity is ion-implanted into the silicon substrate 1 in the peripheral circuit region A, so that an impurity diffusion region 18 for adjusting a threshold voltage is formed. The ion implantation is performed in a manner that the peak of the impurity concentration of the impurity diffusion region 18 locates shallower than the channel stop region 17.

The impurity diffusion region 18 for adjusting a threshold voltage is also formed in the free region B and the cell region C. However, in a portion where a capacitor is formed in the cell region C, the element isolation insulating film 9 in the element isolation grooves 1a is thinned by etching. Thus, the impurity concentration of the impurity diffusion region 18 for adjusting a threshold voltage has a peak in a position deeper than the bottom surfaces of the element isolation grooves 1a.

Figure 6M:
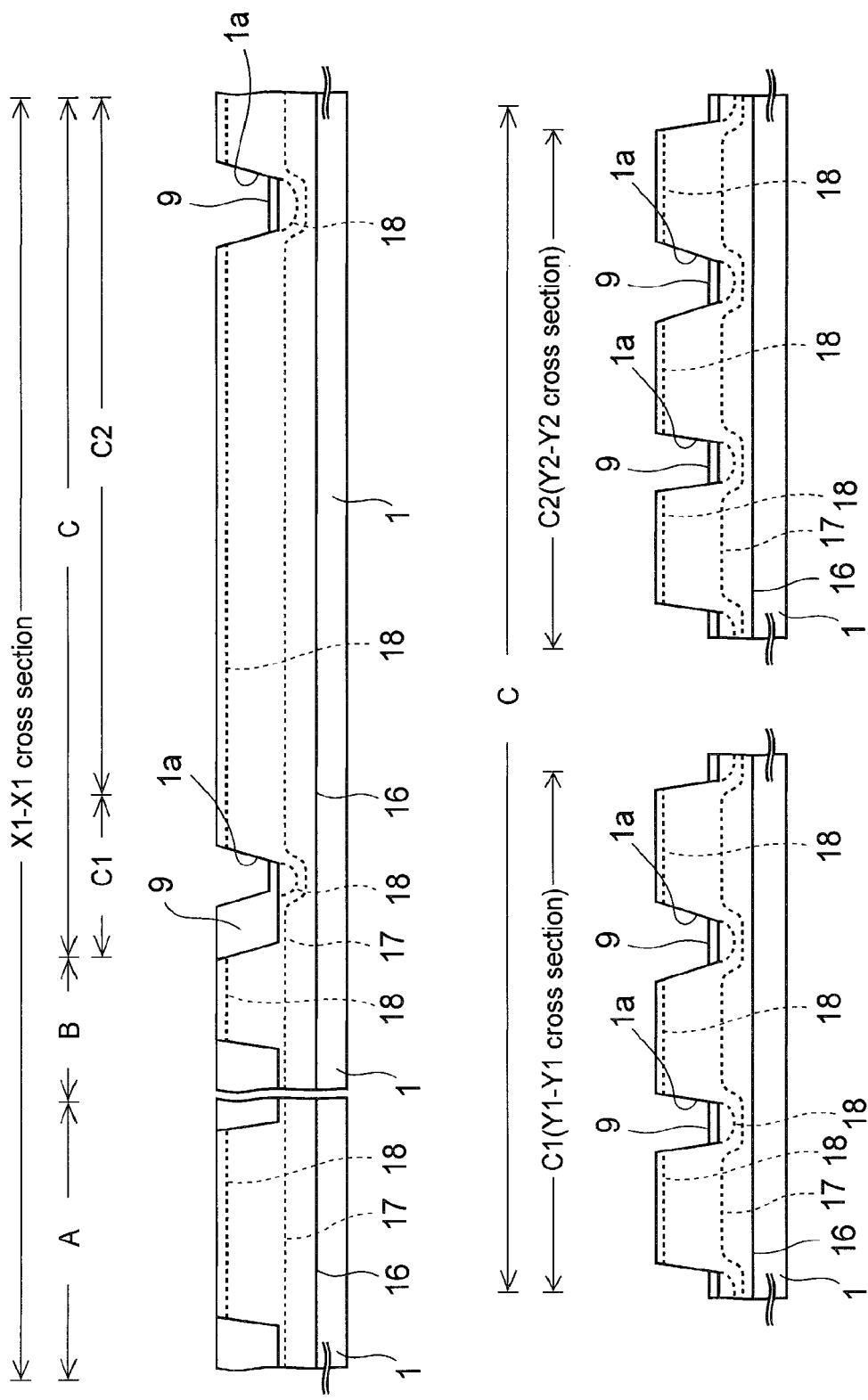

Thereafter, as shown in FIG. 6M, the third thermally-oxidized film 14 used as a through film at the time of the ion implantations is removed by wet etching using a hydrofluoric acid solution, so that the cleaned surface of the silicon substrate 1 is exposed.

Figure 6N:
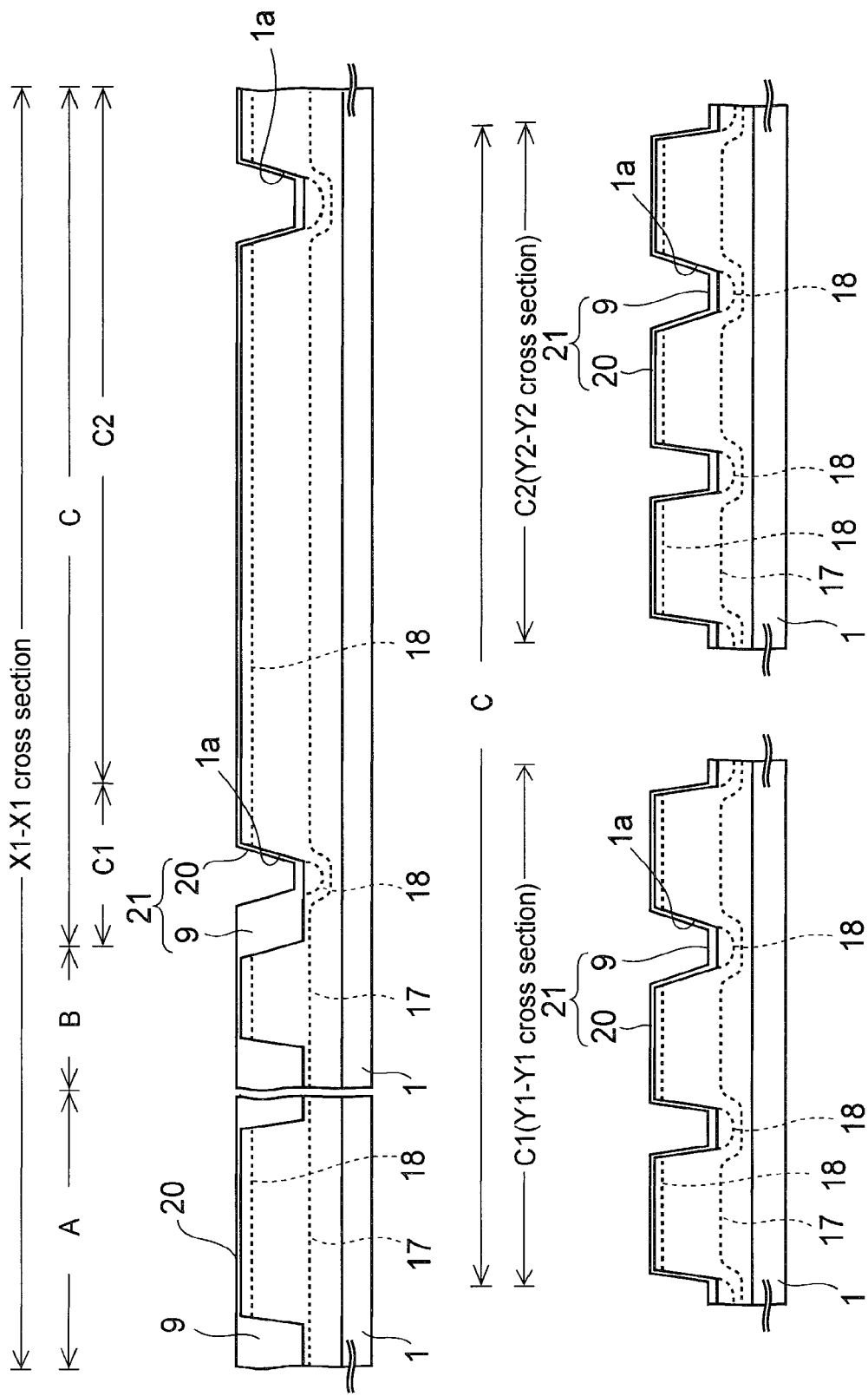
Figure 60:
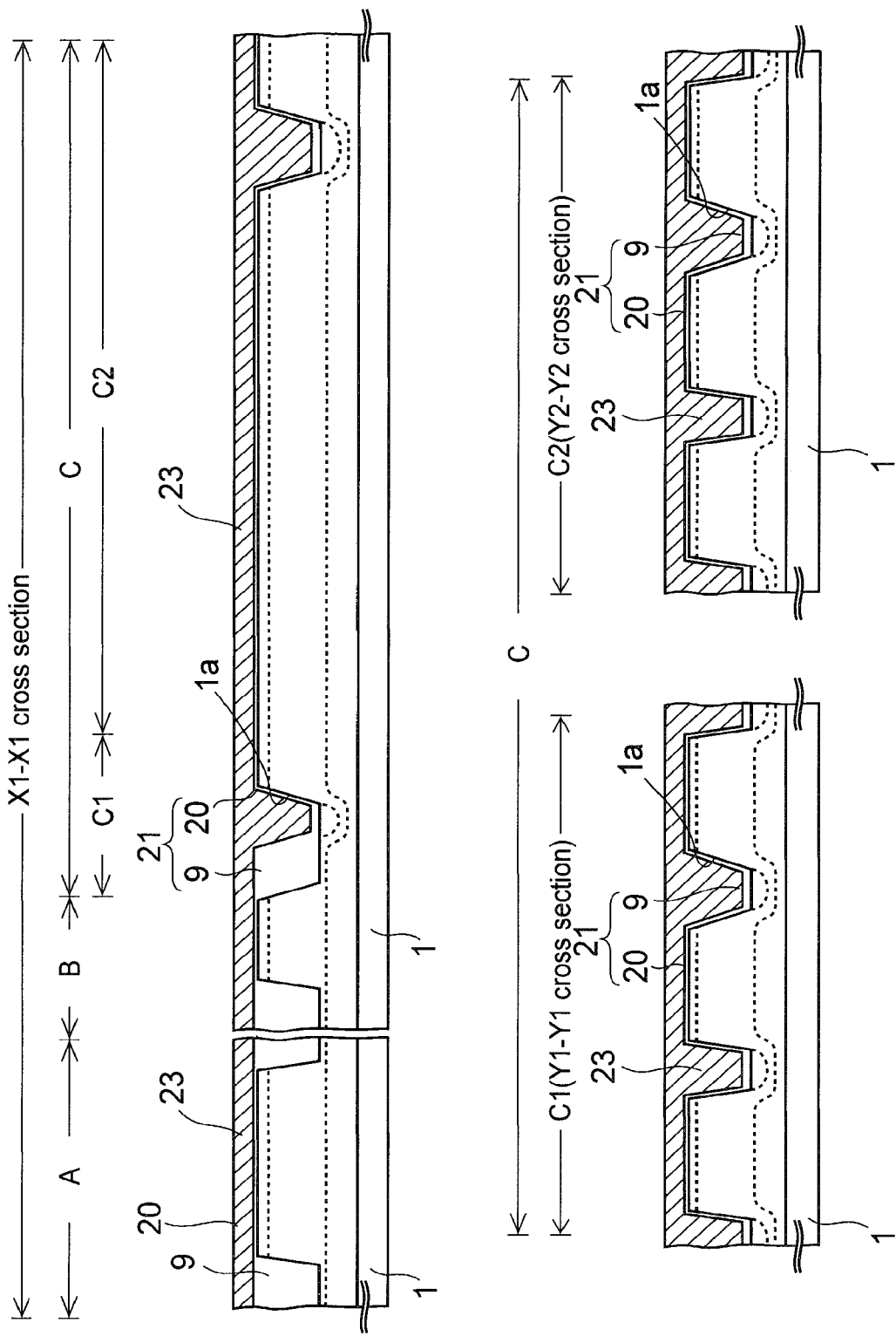

Next, as shown in FIG. 6N, the upper surface of the silicon substrate 1 and the side surfaces of the element isolation grooves 1a are thermally oxidized to from a fourth thermally-oxidized film 20 with a thickness of approximately 3.0 nm.

The fourth thermally-oxidized film 20 constitutes a capacitor dielectric film 21 together with the element isolation insulating film 9 in the element isolation grooves 1a in the cell region C. As described above, the element isolation insulating film 9 in the element isolation grooves 1a is thinned by etching. Thus, recessed portions reflecting the element isolation grooves 1a are formed on the upper surface of the capacitor dielectric film 21.

In contrast, the fourth thermally-oxidized film 20 formed on the upper surface of the silicon substrate 1 functions as a gate insulating film of a MOS transistor to be formed later in the peripheral circuit region A and the cell region C.

Next, as shown in FIG. 6O, a polysilicon film as a conductive film 23 is formed with a thickness of approximately 180 nm on each of the element isolation insulating film 9 and the fourth thermally-oxidized film 20 by the CVD method.

Figure 6P:
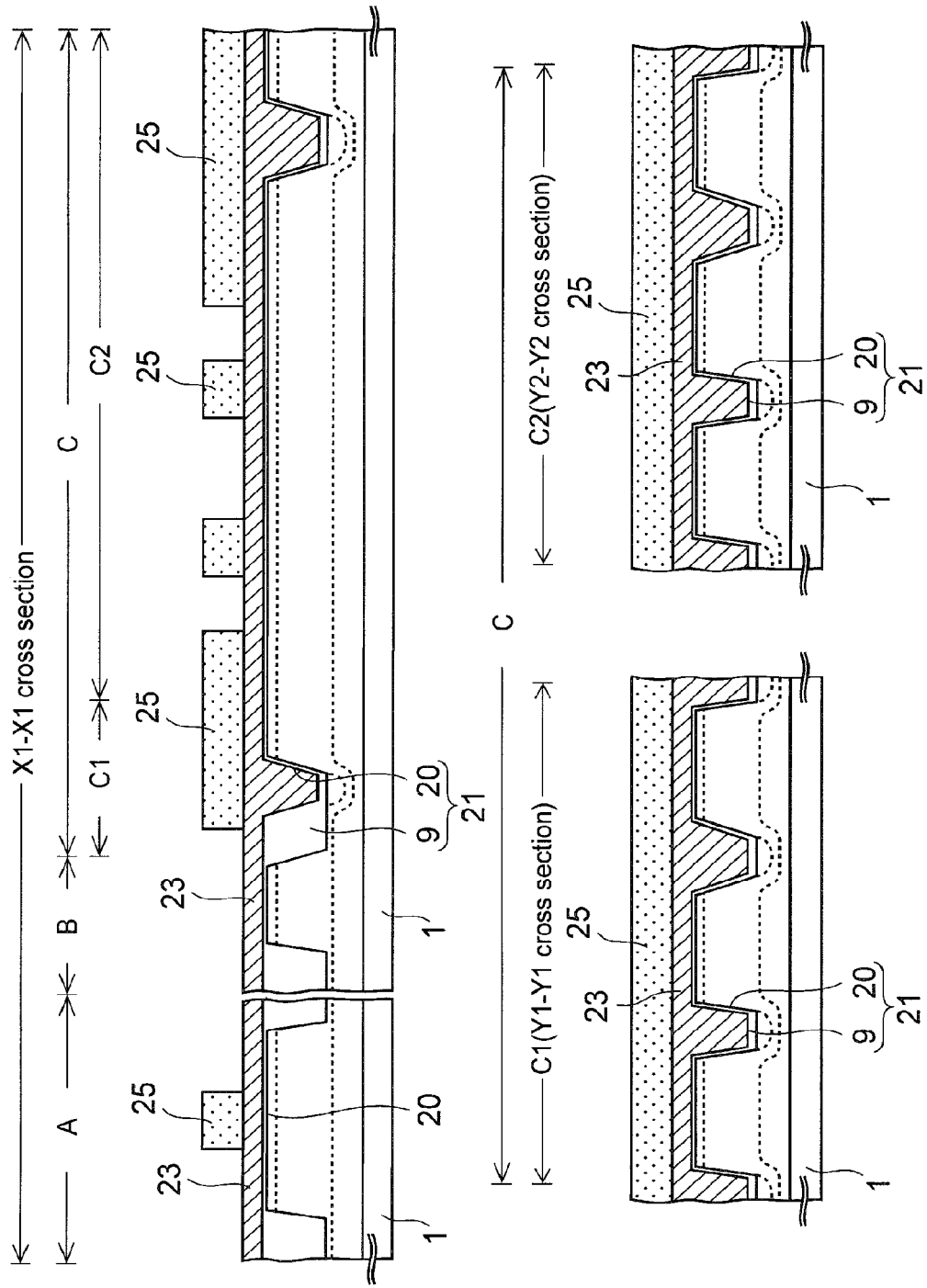

Subsequently, as shown in FIG. 6P, a photoresist is applied on the conductive film 23. The photoresist is then exposed and developed to form a third resist pattern 25.

Figure 6Q:
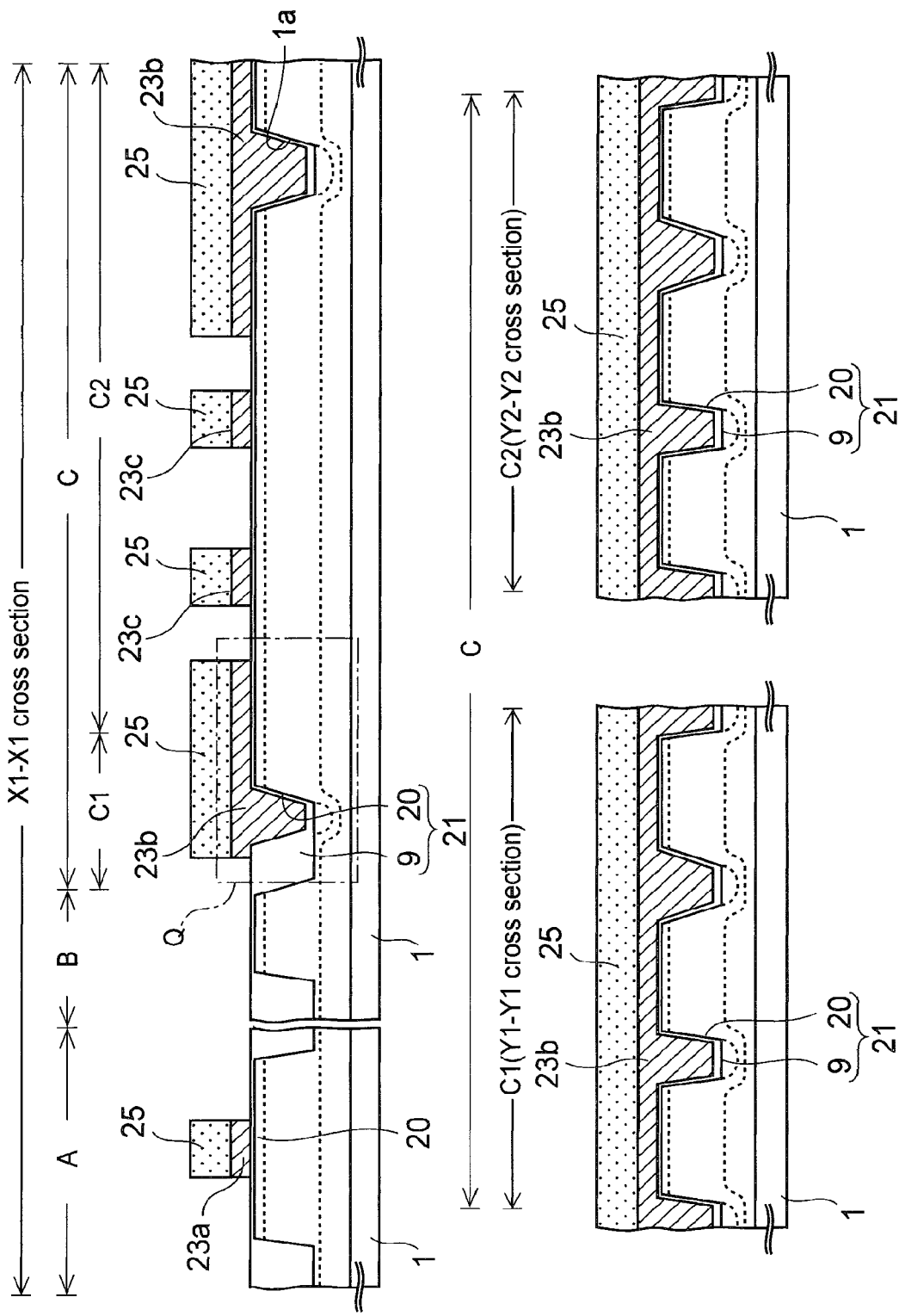

Next, as shown in FIG. 6Q, the conductive film 23 is dry-etched by using the third resist pattern 25 as a mask. The dry etching is carried out, for example, by use of HBr as an etching gas in the inductively coupled plasma (ICP)-type plasma etching equipment.

Thereby, a gate electrode 23a for a peripheral MOS transistor is formed in the peripheral circuit region A.

On the other hand, in the cell region C, upper electrodes 23b, and gate electrodes 23c which constitute a part of a word line are formed. Of these, the upper electrodes 23b constitute capacitors Q together with the capacitor dielectric film 21 and the silicon substrate 1. As described above, the recessed portions reflecting the element isolation grooves 1a are formed on the upper surface of the capacitor dielectric film 21. Thereby, facing areas of the silicon substrate 1, functioning also as lower electrodes of the capacitors, and the upper electrodes 23b are increased, so that capacitance of the capacitors Q can be increased.

Thereafter, the third resist pattern 25 is removed.

Next, by using the gate electrode 23a as a mask, boron as a p-type impurity is ion-implanted into the silicon substrate 1, so that source/drain extensions 29 for a peripheral circuit are formed beside the gate electrode 23a.

Figure 6R:
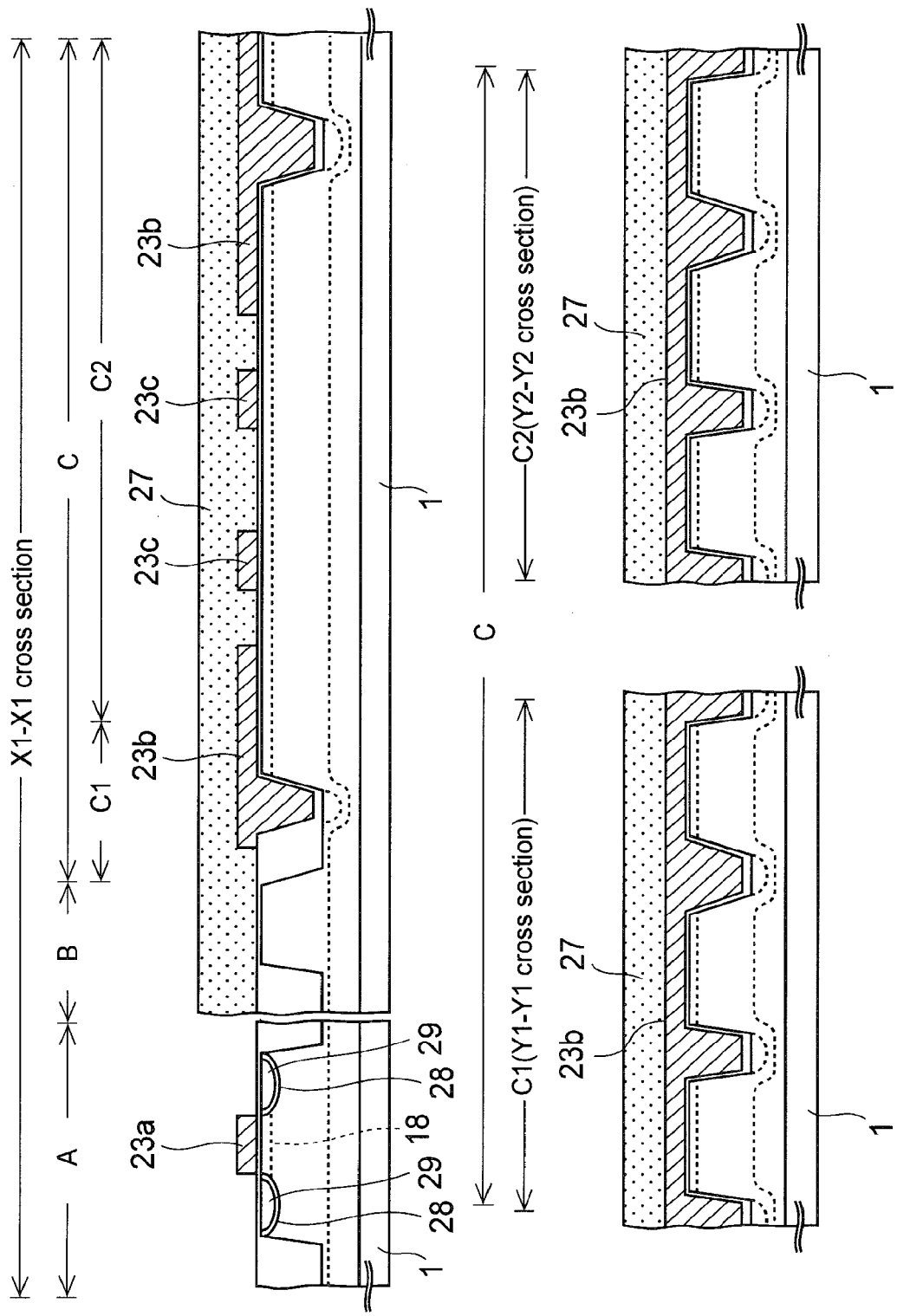

Furthermore, as shown in FIG. 6R, a fourth resist pattern 27 covering the cell region C is formed on the silicon substrate 1. Thereafter, arsenic as an n-type impurity is ion-implanted into the silicon substrate 1 in the peripheral circuit region A which is not covered with the fourth resist pattern 27, so that pocket regions 28 for preventing punch-through are formed in the self-align manner with the gate electrode 23a.

After that, the fourth resist pattern 27 is removed.

Figure 6S:
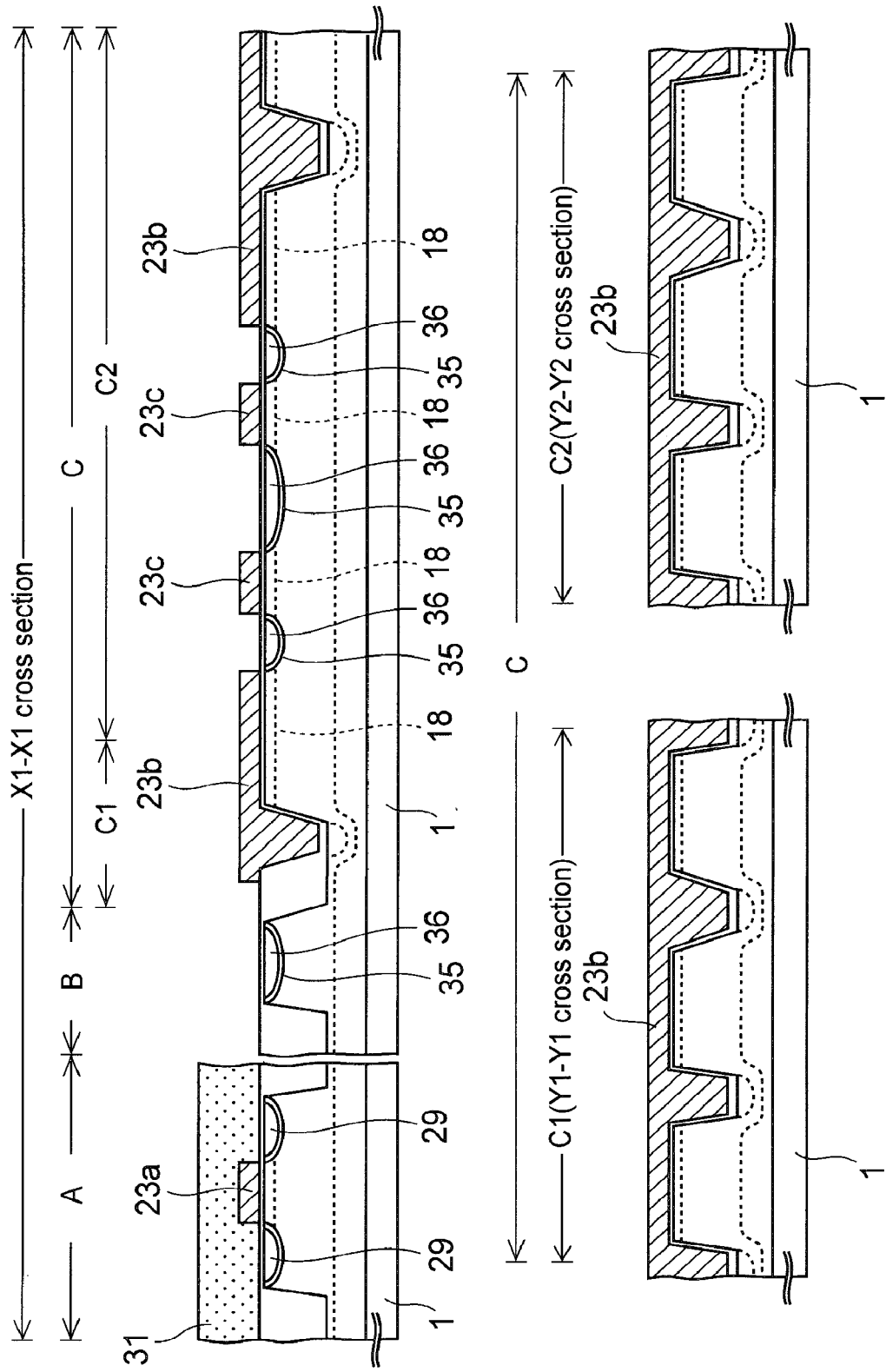

Next, processes for obtaining a cross-sectional structure shown in FIG. 6S will be described.

Firstly, a photoresist is coated on the entire upper surface of the silicon substrate 1. The photoresist is then exposed and developed to form a fifth resist pattern 31 that covers the peripheral circuit region A. Note that the cell region C and the free region B are exposed without being covered with the fifth resist pattern 31.

Subsequently, boron as a p-type impurity is ion-implanted into the silicon substrate 1 beside the gate electrodes 23c, so that source/drain extensions 36 for a cell region C are formed.

Furthermore, for the purpose of preventing the punch-through of a MOS transistor to be formed later in the cell region C, while the gate electrodes 23c is used as a mask, phosphorus as an n-type impurity is ion-implanted into the silicon substrate 1 beside the gate electrodes 23c. Thereby, pocket regions 35 for a cell region C are formed.

Note that these pocket regions 35 and the source/drain extensions 36 are also formed in the dummy active region 103 in the free region B.

After this ion implantation is finished, the fifth resist pattern 31 is removed.

Figure 6T:
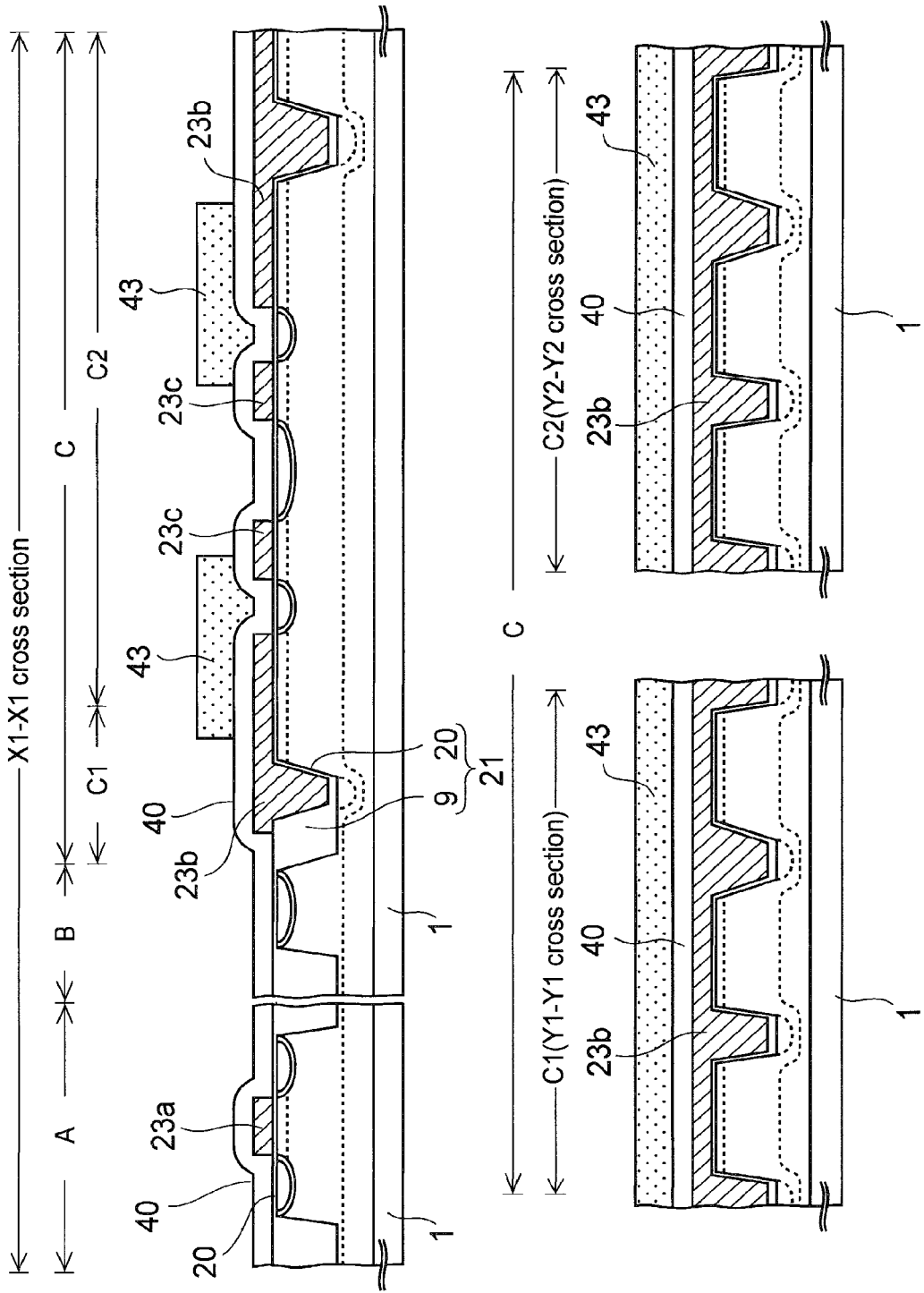

Next, as shown in FIG. 6T, a silicon oxide film is formed on the entire upper surface of the silicon substrate 1 by the CVD method, and the silicon oxide film is used as a sidewall insulating film 40. Thereafter, as shown in the figure, a sixth resist pattern 43 is formed on the sidewall insulating film 40.

Figure 6U:
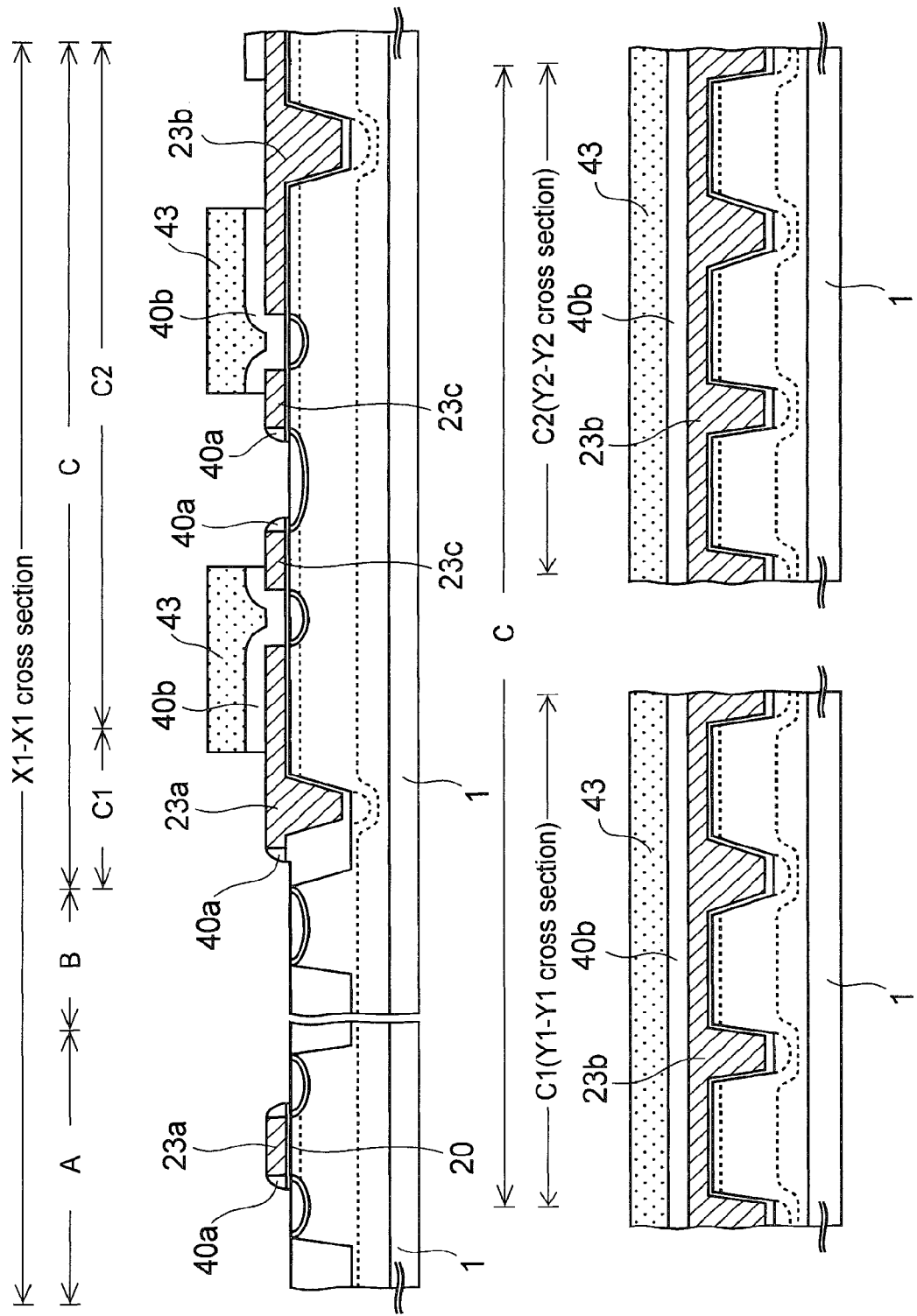

Next, as shown in FIG. 6U, by using the sixth resist pattern 43 as a mask, the sidewall insulating film 40 is etched back, so that insulating sidewalls 40a are formed beside the electrodes 23a to 23c, and silicide blocks 40b are formed in the regions between the upper electrodes 23b and the gate electrodes 23c.

Thereafter, the sixth resist pattern 43 is removed.

Figure 6V:
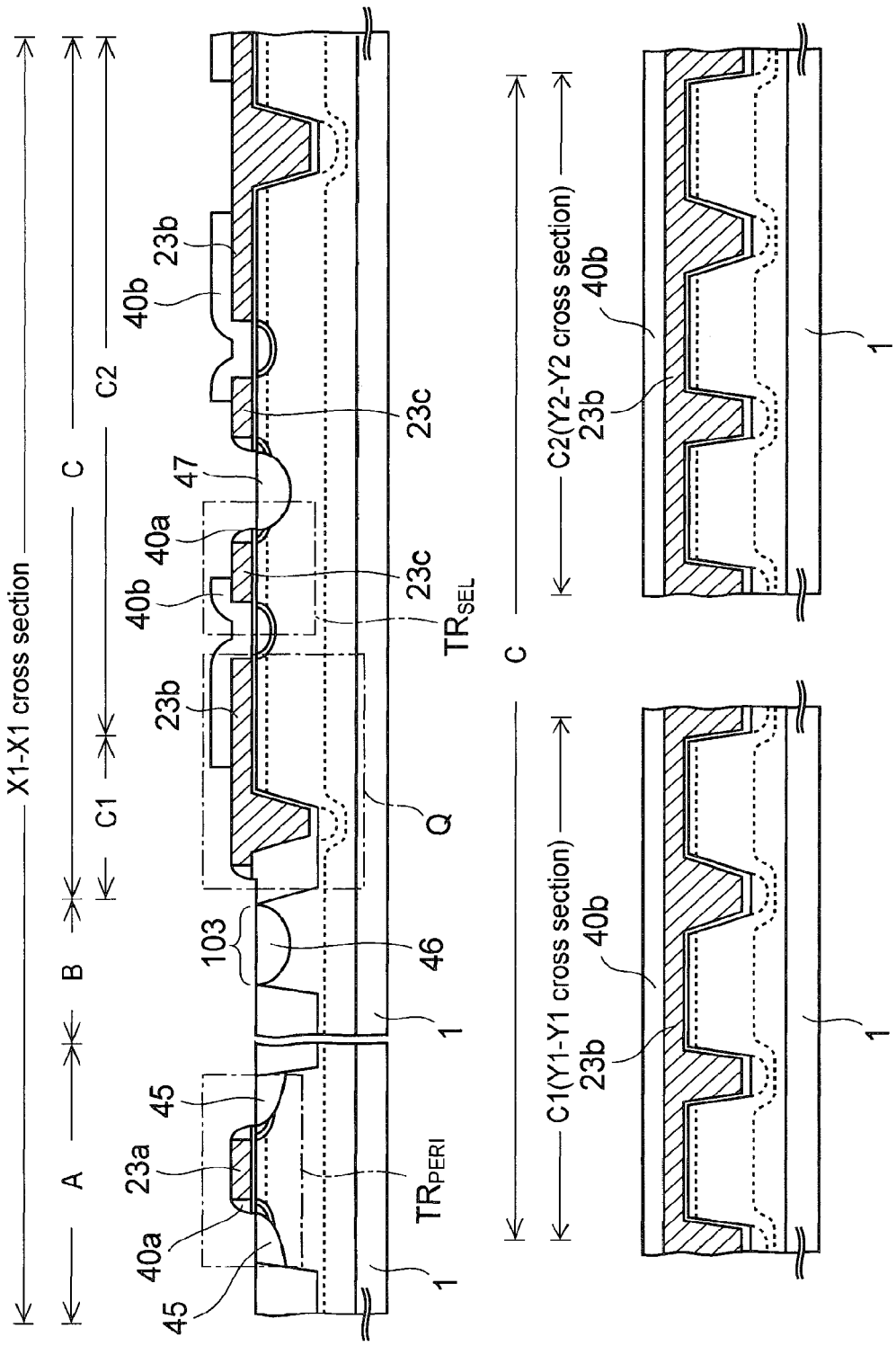

Next, as shown in FIG. 6V, boron as a p-type impurity is ion-implanted into the regions A to C. Thereby, source/drain regions 45 and 47 are formed in the silicon substrate 1 beside the gate electrodes 23a and 23c in the cell regions A and C.

Note that in the portions where the silicide blocks 40b are formed, n-type impurity is not introduced into the substrate because the silicide blocks 40b prevent the implantation of the ions.

In addition, in this ion implantation, the n-type impurity region is also formed in the dummy active region 103 in the free region B, so that a dummy impurity diffusion region 46 is formed.

With the processes described so far, a MOS-type peripheral transistor $TR_{PERI}$ constructed from the gate electrode 23a, the source/drain regions 45 and the like is formed in the peripheral circuit region A. On the other hand, a MOS-type selection transistor $TR_{SEL}$ constructed from the gate electrode 23c, the source/drain region 47, the source/drain extension 36 and the like is formed in the cell region C.

As described by referring to FIG. 6B, the side surface of the element isolation groove 1a is formed so as to be inclined from a normal line direction of the silicon substrate 1. Thus, the stress generated by the element isolation insulating film 9 is reduced by the side surfaces of the element isolation grooves 1a, so that the stress can be prevented from strongly acting on the channel regions of the transistors $TR_{PERI}$ and $TR_{SEL}$.

Figure 6W:
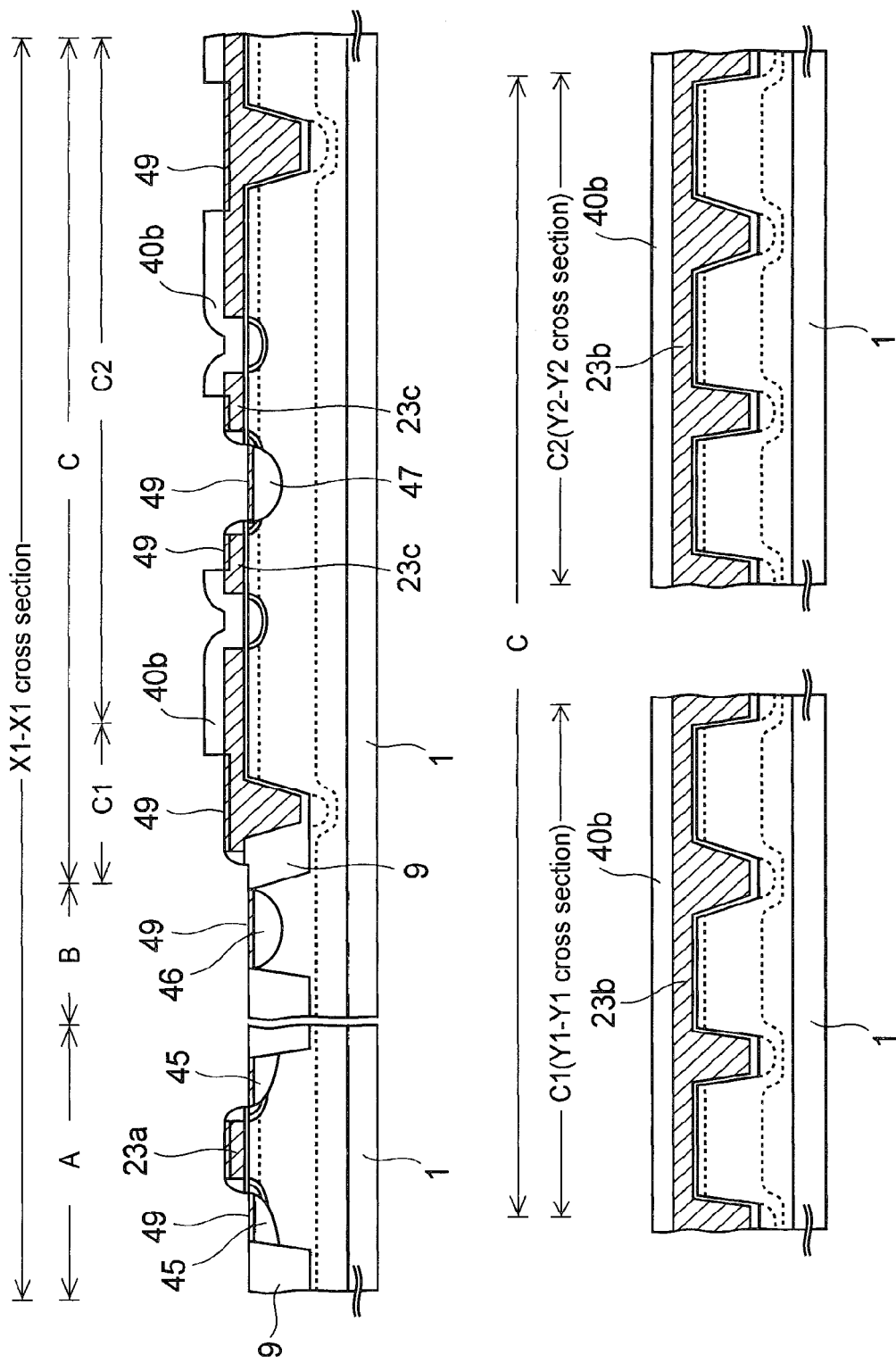

Next, processes for obtaining a cross-sectional structure shown in FIG. 6W will be described.

Firstly, a cobalt film as a refractory metal film is formed on the entire upper surface of the silicon substrate 1 by the sputtering method. Subsequently, the cobalt film is annealed to react with silicon, so that a metal silicide layer 49 made of cobalt silicide is formed on the upper surfaces of the silicon substrate 1 and the gate electrodes 23a to 23c. Thereafter, the refractory metal film, which is left unreacted on the element isolation insulating film 9 and the like, is removed by wet etching.

Note that in the portions where the silicide blocks 40b are formed, the reaction between silicon and the refractory metal film is prevented by the silicide blocks 40b, and hence the metal silicide layer 49 is not formed.

Figure 6X:
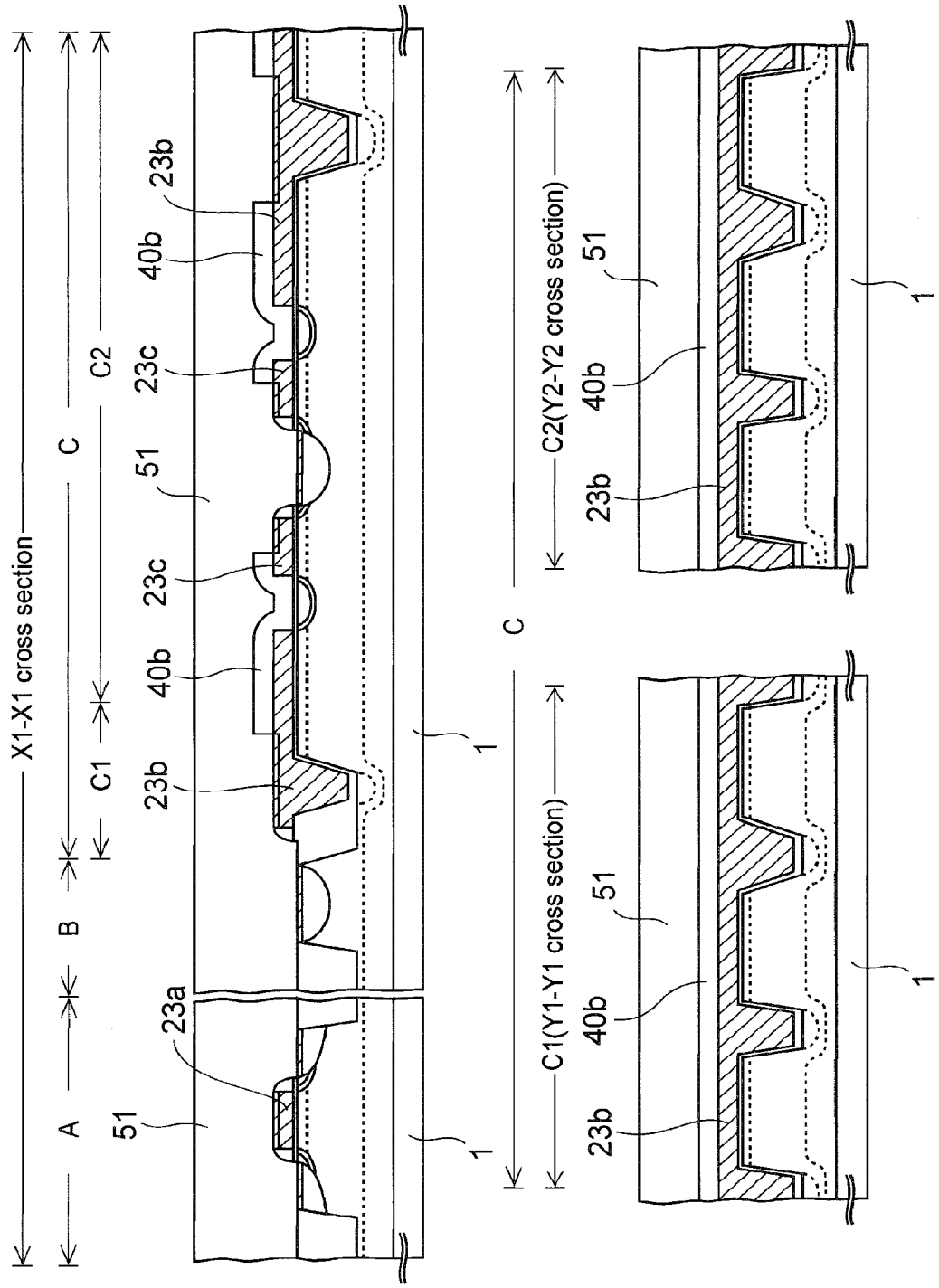

Next, as shown in FIG. 6X, a silicon oxide film as an interlayer insulating film 51 is formed on the entire upper surface of the silicon substrate 1 by the CVD method. Thereafter, the upper surface of the interlayer insulating film 51 is polished and planarized by the CMP method.

Next, processes for obtaining a cross-sectional structure shown in FIG. 6Y will be described.

Firstly, the interlayer insulating film 51 is patterned by photolithography and etching, so that first and second holes 51a and 51b are formed in the interlayer insulating film 51 on the source/drain regions 45 and 47 in the peripheral circuit region A and the cell region B.

Thereafter, a titanium film and a titanium nitride film are formed in this order as a glue film on inner surfaces of the first and second holes 51a and 51b and on the upper surface of the interlayer insulating film 51. Furthermore, a tungsten film is formed on the glue film by the CVD method so as to completely embed the holes 51a and 51b with the tungsten film. Thereafter, the excessive glue film and tungsten film on the interlayer insulating film 51 are polished and removed by the CMP method. Thus, the glue film and the tungsten film are left in the holes 51a and 51b as peripheral contact plugs 53 and a bit line contact plug 55 respectively.

With the processes described so far, the basic structure of the semiconductor device according to the present embodiment is completed.

The enlarged plan view of this semiconductor device is shown in FIG. 7B, which shows that one memory cell MC of one transistor-one capacitor-type is constructed form the selection transistor $TR_{SEL}$ and the capacitor Q in the cell region C.

The equivalent circuit of this semiconductor device and operations thereof are similar to those described in FIG. 3, and the description thereof will be omitted.

Figure 8:
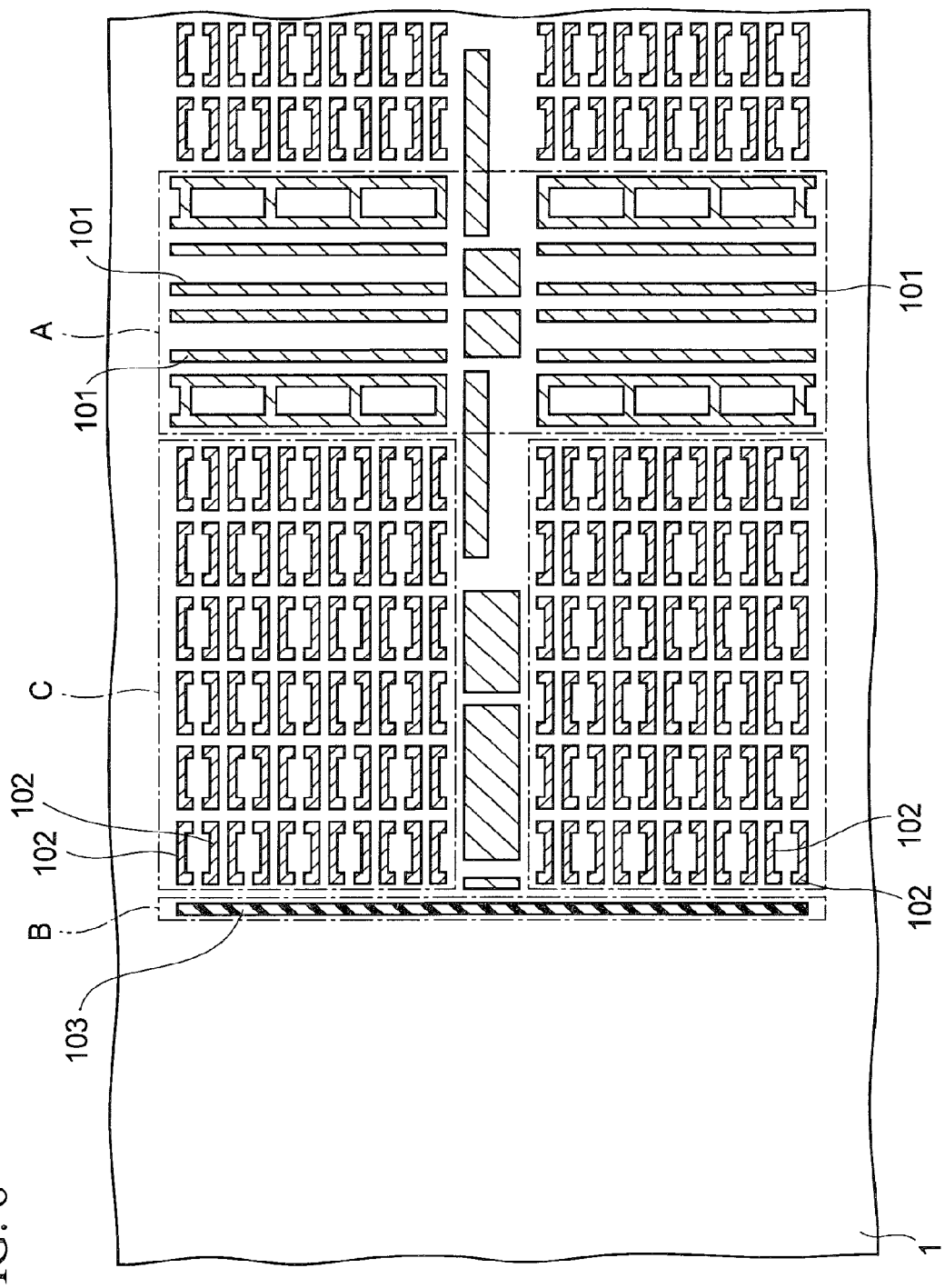
FIG. 8 is a plan view showing a wide region including a dummy active region in the first embodiment of the present invention.

FIG. 8 is a plan view showing a wide region including the dummy region 103.

As shown in FIG. 8, in the left side of the dummy active region 103, a region where the active regions are absent spreads out. The cell region C in the portion from which the adjacent active region are separated by a significant distance, for example 5 μm or more, is referred to as a "macro end". In the example of FIG. 8, the dummy active region 103 is provided in the macro end.

The dummy active region 103 arranged in the macro end extends in a stripe shape along a repeating direction of the cell active regions 102 (the longitudinal direction of FIG. 8). Moreover, the dummy active region 103 in the macro end has the length of 36.68 μm, which corresponds to a length of one side of a minimum unit (768 bit) of the cell region C.

Note that a potential of the dummy active region 103 is not particularly limited, and may be a floating potential or a fixed potential.

As described by referring to FIGS. 6B and 7A, in the above-described embodiment, the dummy active region 103 is provided in the free region B beside the cell region C. Thereby, the arrangement density of the cell active regions 102 in the end portion C1 of the cell region C is brought close to that of the cell active regions 102 in the other portion C2.

Thereby, the optical proximity effects in the end portion C1 and the other portion C2 can be made substantially equal at the time when the first resist pattern 5 is formed by exposing the photoresist. Accordingly, the size variations of the first resist pattern 5 attributable to the optical proximity effects can be made substantially equal in the portions C1 and C2.

As a result, the widths of the element isolation grooves 1a in the end portion C1, which are formed by etching using the first resist pattern 5 as a mask, can be made wide to the extent of the widths of the element isolation grooves 1a in the other portion C2. Thus, the adjacent cell active regions 102 in the end portion C1 can be preferably electrically separated by the element isolation grooves 1a. Thereby, a leak current between the adjacent cells can be decreased in the end portion C1.

Figure 9:
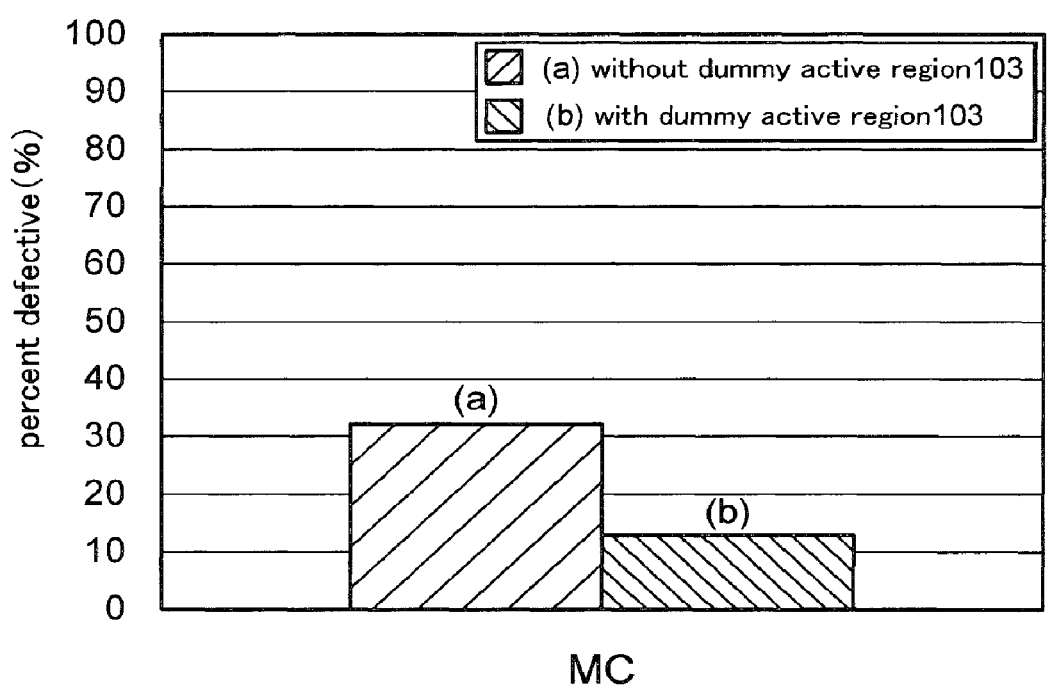
FIG. 9 is a graph obtained by investigating to what extent a percent defective of the semiconductor device is decreased by providing the dummy active region.

FIG. 9 is a graph obtained by investigating to what extent a percent defective of the semiconductor device is decreased by providing the dummy active region 103. Note that in this investigation, the function test for a cell of one transistor-one capacitor was carried out. Then, the semiconductor device is determined as defective or non-defective, depending on whether the cell operates or not. The defect found in this function test is referred to as a march defect (MC).

As shown in FIG. 9, it became apparent that, when compared with the case (a) where the dummy active region 103 is not provided, the march defect is largely decreased in the case (b) where the dummy active region 103 is provided.

However, the march defect also includes defects which is occurred due to a cause other than a leak current, for example, a wiring defect and the like. Thus, it cannot be simply concluded from the result of FIG. 9 that the leak current in the substrate is decreased.

In order to investigate whether the leak current is actually decreased, the inventor of the present application carried out a test similar to that of FIG. 9, while heating the silicon substrate 1.

Figure 10:
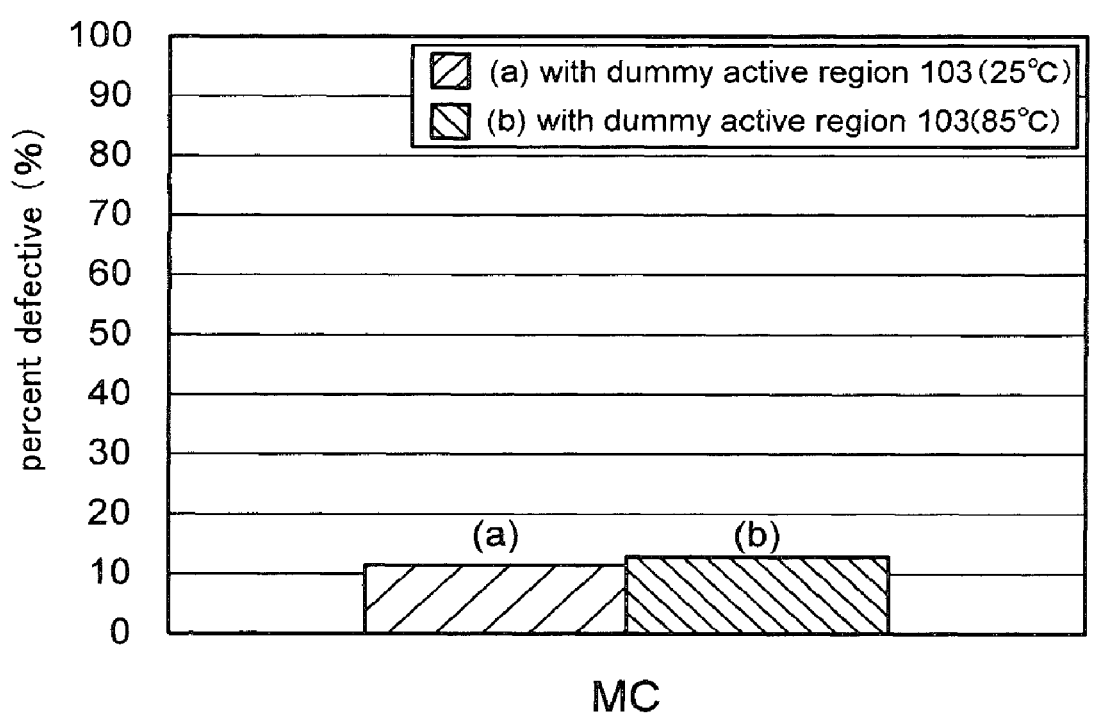
FIG. 10 is a graph obtained by investigating whether or not a leak current is actually decreased by providing the dummy active region in the first embodiment of the present invention.

The result is shown in FIG. 10.

As the substrate temperature at the time of the test is higher, the frequency of generating a defect due to a leak current is increased.

However, the result of FIG. 10 shows that even if the test is carried out by heating the silicon substrate 1 to 85.degree. C. in the case where the dummy active region 103 (see FIG. 7B) is provided, the percent defective becomes the same extent as that in the case where the substrate temperature is 25.degree. C.

From this result, it was confirmed that the defect in FIG. 9 generated in the case where the dummy active region 103 was provided hardly included the defect due to the leak current, and the leak current in the substrate was actually decreased by providing the dummy active region 103.

Incidentally, if the focus is made only on making the arrangement density of the cell active regions 102 (see FIG. 7B) in the end portion C1 hypothetically closer to that in other region C2, it is also possible that the cell active regions 102 are arranged in the free region B in the same way as in the cell region C.

However, in this case, it is needed that the free region B is formed wider than the width of the memory cell MC (see FIG. 7B) so as to secure space sufficient to arrange the cell active regions 102 in the free region B. Thereby, a chip size becomes undesirably larger.

For this reason, as shown in FIG. 7B, it is preferable that, in the process (FIG. 6B) of forming the element isolation grooves 1a, an interval W6 between the cell active regions 102 and the dummy active region 103 in the end portion C1 of the cell region C be set to narrower than a width W7 of the memory cell MC. In the present embodiment, the interval W6 is set to 0.73 μm for example, and the width W7 is set to 0.96 μm.

With this configuration, it is unnecessary that wide space is secured in the free region B like the case where the cell active regions 102 are formed in the free region B as a dummy active region as described above. Thus, the leak current can be decreased without increasing the chip size.

(3) Arrangement Example of the Dummy Active Region

Next, various examples of arrangements of the dummy active region 103 according to the above-described first embodiment will be described.

Figure 11:
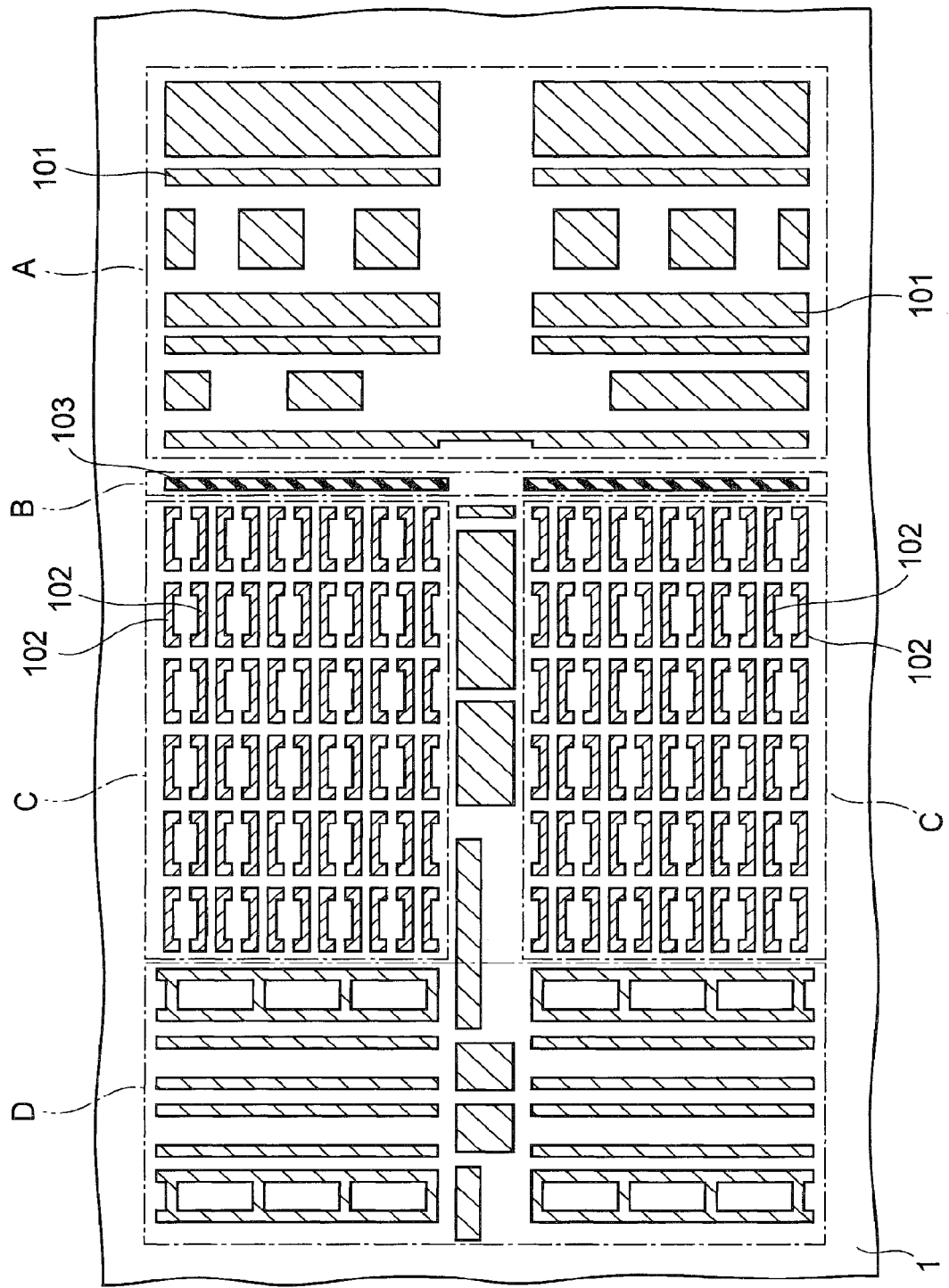
FIG. 11 is a plan view showing an arrangement example according to a first example of the dummy active region in the first embodiment of the present invention.

FIG. 11 is a plan view showing an arrangement example according to a first example.

In the present example, dummy active regions 103 are arranged in a stripe shape in the free region B between the peripheral circuit region A and the cell region C.

Note that a sense amplifier unit D is formed in a vicinity of the cell region C, and thus a leak current hardly occurs in the cell region C in a portion close to the sense amplifier unit D. Therefore, in this portion, a dummy active region 103 is not arranged.

Figure 12:
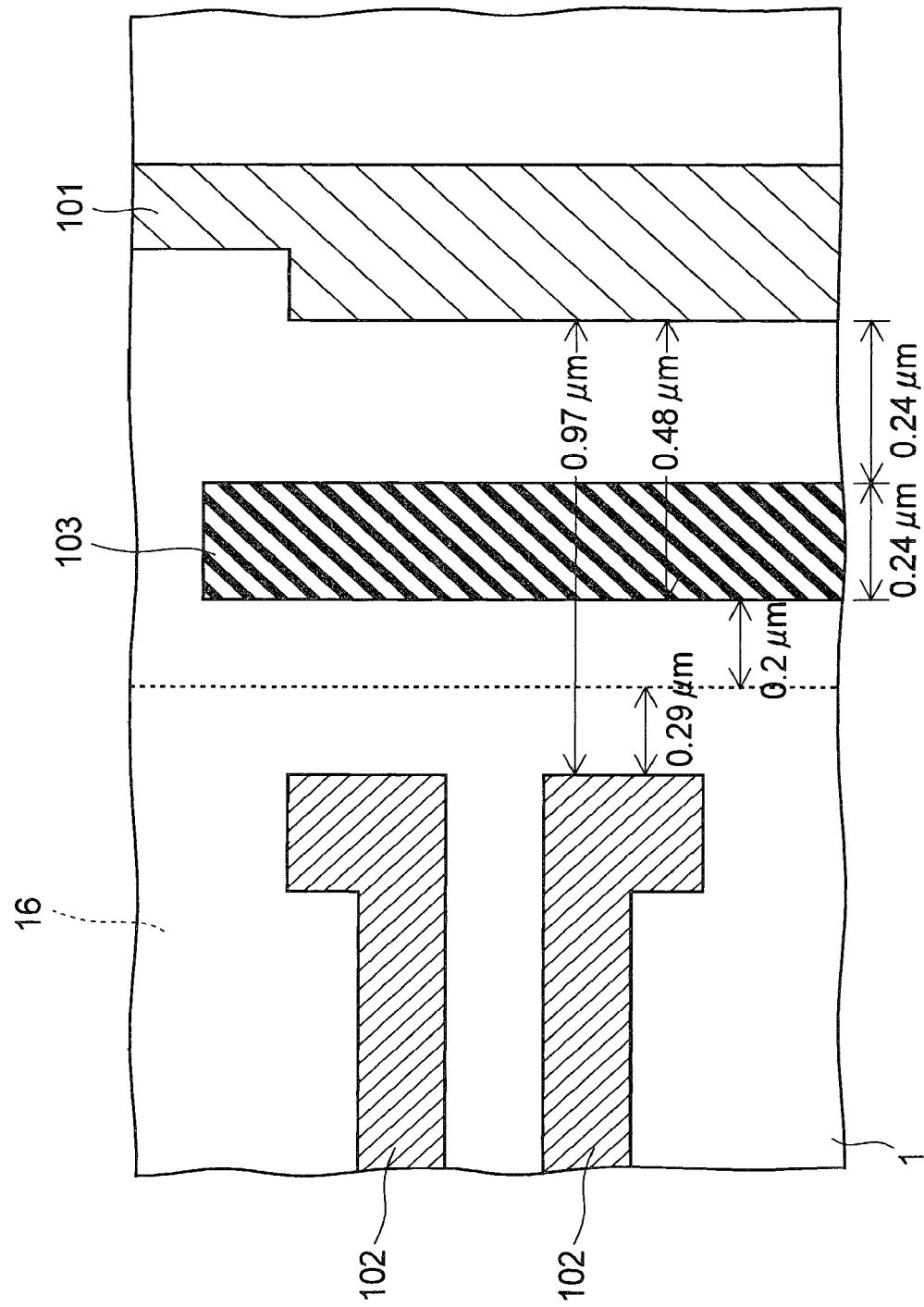
FIG. 12 is an enlarged plan view of the dummy active region shown in FIG. 11 and a periphery thereof.

FIG. 12 is an enlarged plan view of the dummy active region shown in FIG. 11 and a periphery thereof.

If a width of the dummy active region 103 is excessively narrow, the width of a portion of the first resist pattern 5 (see FIG. 6B) that covers the dummy active region 103 also becomes narrow, so that the first resist pattern 5 is likely to be stripped in this portion.

In addition, if an interval between the dummy active region 103 and the cell active regions 102 becomes wide, the leak current easily occurs.

As the width that simultaneously fulfills these constraints, the width of the dummy active region 103 is set to 0.24 μm in the present example. In addition, the interval between the dummy active region 103 and the peripheral active region 101 is set to 0.48 μm, so that the dummy active region 103 is brought close to the cell active regions 102 as possible. Thereby, the arrangement density of the cell active regions 102 in the end portion C1 is brought close to that in the other portion C2, so that the differences of the optical proximity effects in the portions C1 and C2 are made small.

Figure 13:
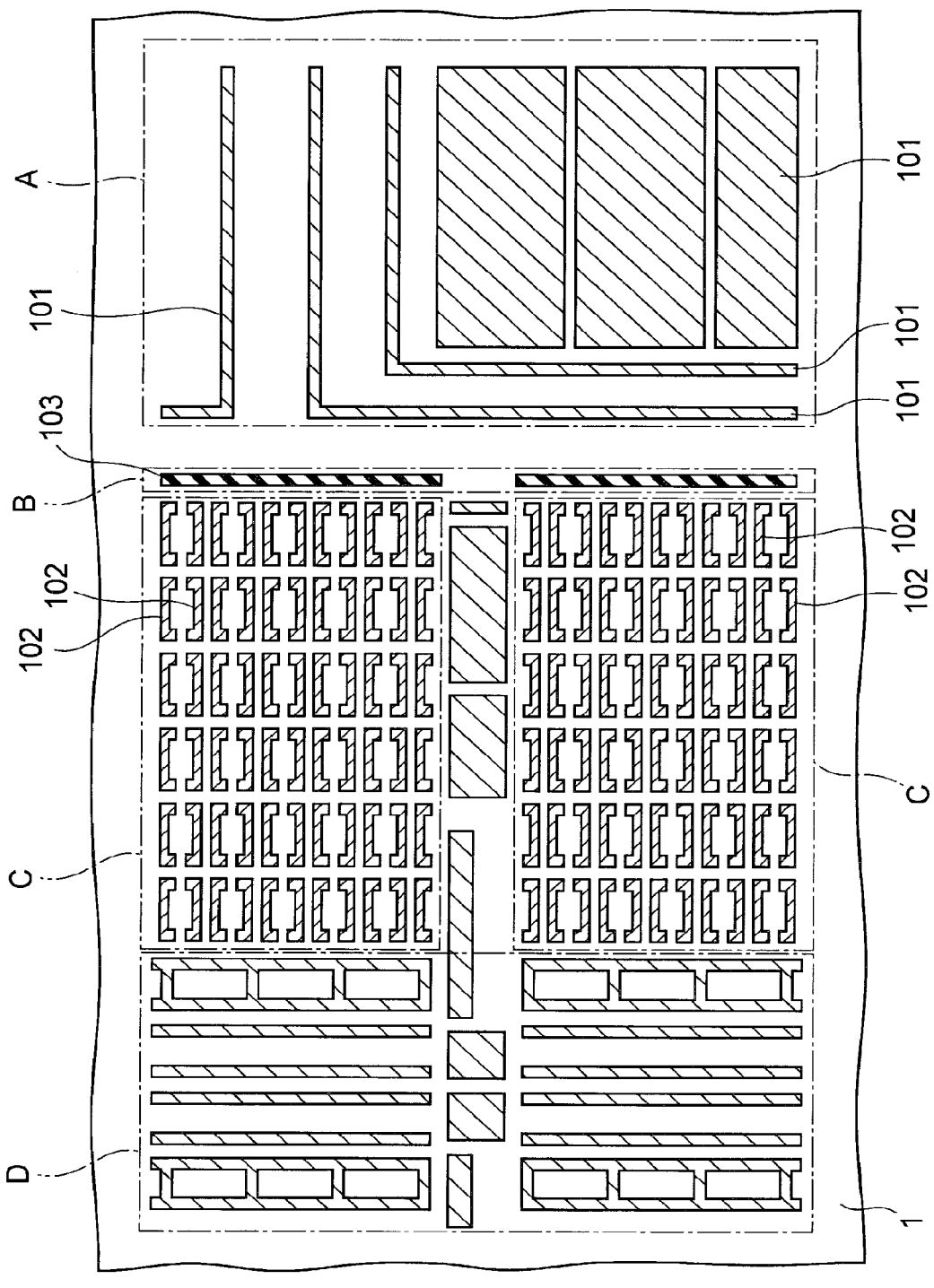
FIG. 13 is a plan view showing an arrangement example according to a second example of the dummy active region in the first embodiment of the present invention.

FIG. 13 is a plan view showing an arrangement example according to a second example.

In the present example too, dummy active regions 103 are arranged in a stripe shape in the free region B between the peripheral circuit region A and the cell region C.

Figure 14:
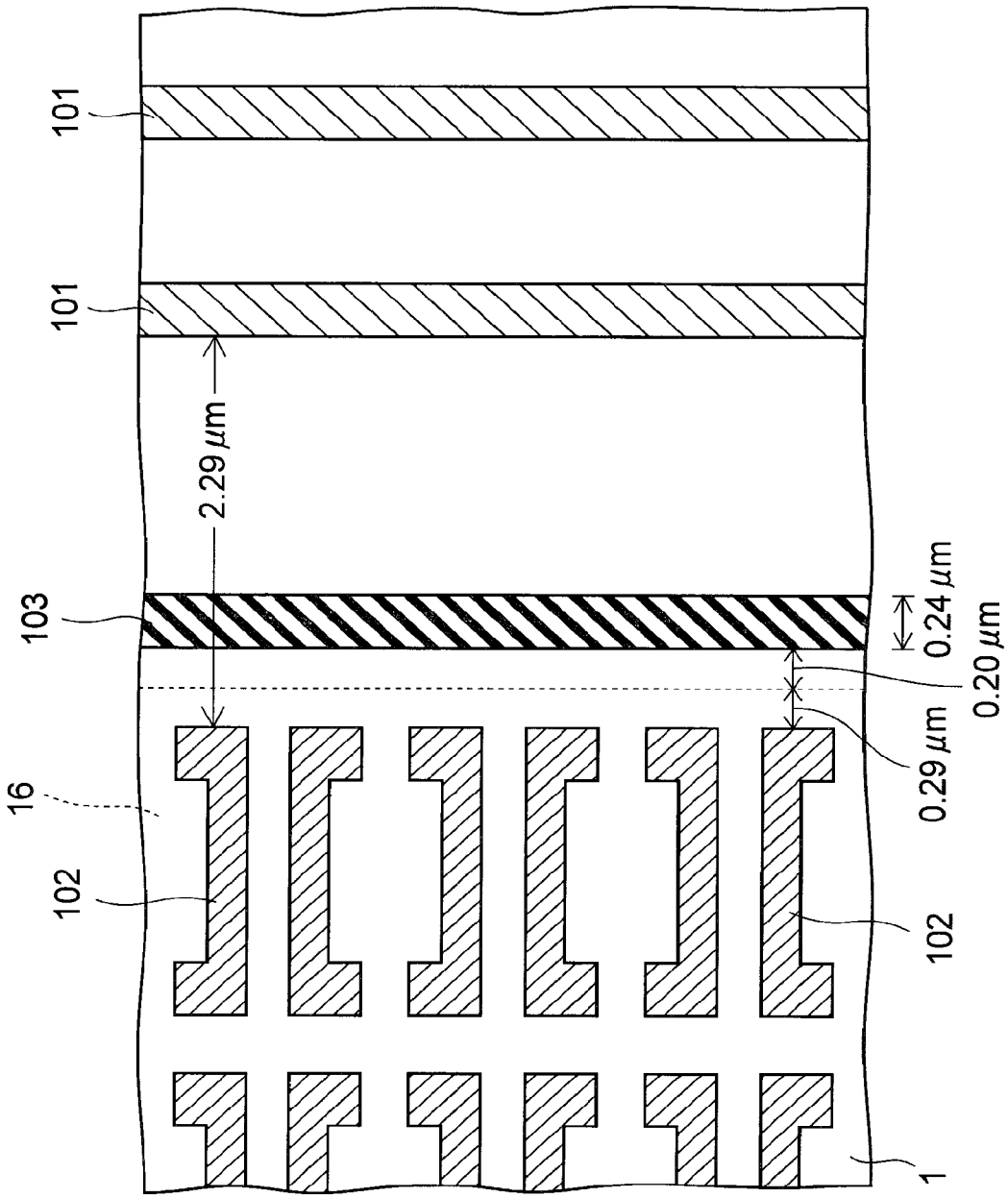
FIG. 14 is an enlarged plan view of the dummy active region shown in FIG. 13 and a periphery thereof.

FIG. 14 is an enlarged plan view of the dummy active region 103 and a periphery thereof. In the present example, the dummy active region 103 is arranged with the intervals and widths shown in FIG. 14.

In the present embodiment, the description will be given of a semiconductor device in which the leak current under element isolation grooves 1a in the end portion C1 of the cell region C can be reduced without providing a dummy active region 103 of the first embodiment.

FIGS. 15A to 15K are cross-sectional views showing processes of manufacturing a semiconductor device according to the present embodiment.

Note that in these figures, reference numerals same as those of the first embodiment will be given to components described in the first embodiment, and the description thereof will be thus omitted. In addition, in each of these cross-sectional views, similar to the first embodiment, cross sections taken along the line Y1-Y1 and the line Y2-Y2 in the regions C1 and C2 in FIGS. 7A and 7B will also be shown.

Figure 15A:
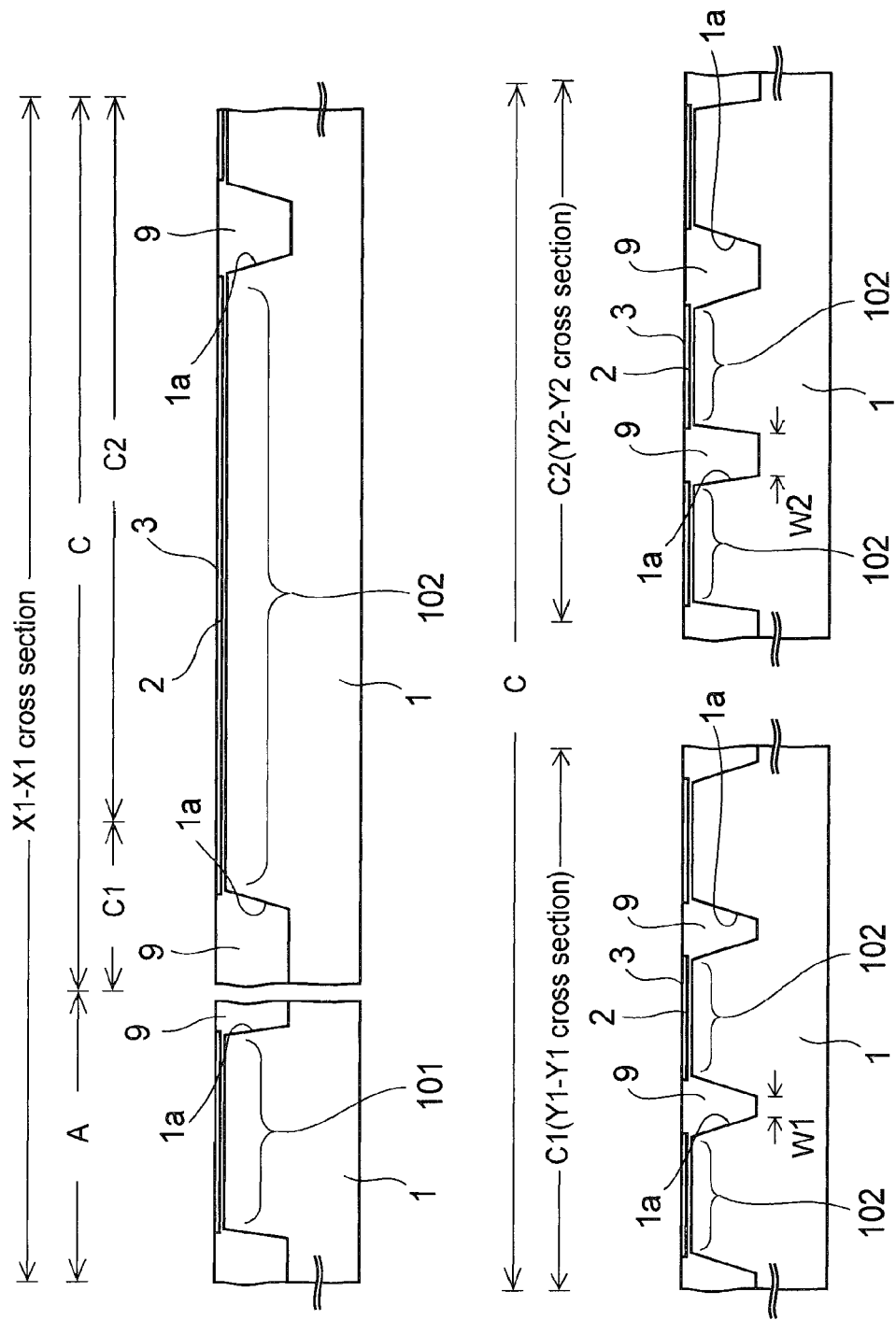
FIGS. 15A to 15K are cross-sectional views showing processes of manufacturing a semiconductor device according to a second embodiment of the present invention.

To manufacture this semiconductor device, the processes of FIGS. 6A to 6D described in the first embodiment are firstly carried out to obtain a cross-sectional structure shown in FIG. 15A.

In the present embodiment, the dummy active region 103 of the first embodiment is not needed to be formed. In the following, the description will be given for the case where the dummy active region 103 is not formed. Accordingly, in the cross-sectional views of FIGS. 15A to 15K, a free region B where a dummy active region 103 is formed is omitted.

When the dummy active region 103 is not formed in this manner, the extent of the optical proximity effect varies in the end portion C1 of the cell region C and the other portion C2 as described in the first embodiment. Thus, a width W1 in the element isolation groove 1a in the end portion C1 becomes narrower than a width W2 in the other portion C2.

Figure 15B:
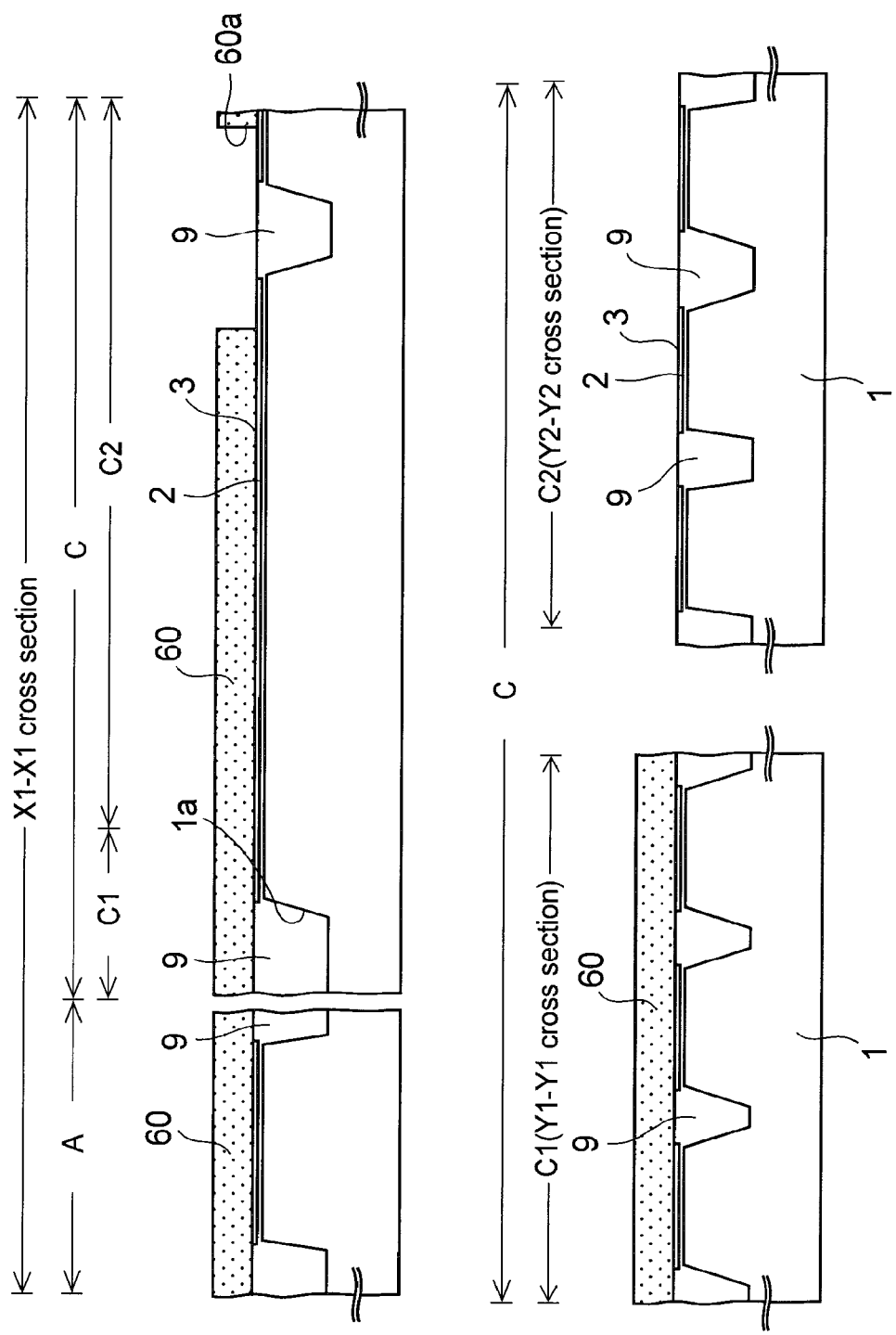

Next, as shown in FIG. 15B, a photoresist is applied on the entire upper surface of a silicon substrate 1. The photoresist is then exposed and developed to form a seventh resist pattern 60.

As shown in the figure, the seventh resist pattern 60 covers the end portion C1 of the cell region C, and has a window 60a on a region where a capacitor is formed in the other portion C2.

Figure 15C:
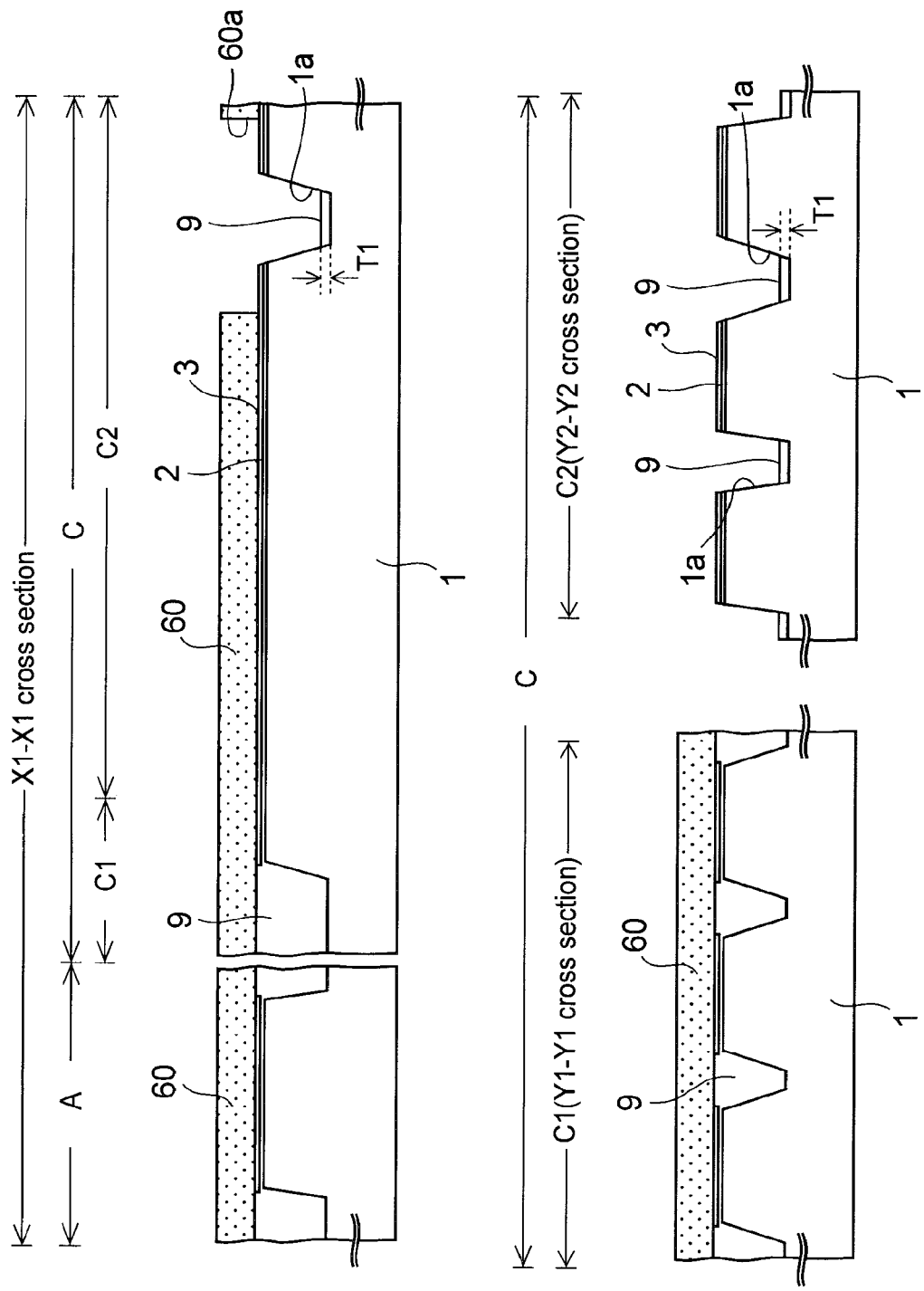

Next, as shown in FIG. 15C, an element isolation insulating film 9 in the other portion C2 is dry-etched through the above-described window 60a, so that the element isolation insulating film 9 on the bottom surface of the element isolation groove 1a is left with a first thickness T1.

This dry etching is carried out, for example, by use of C.sub.4F.sub.8 as an etching gas in a magnetron RIE-type plasma etching equipment.

Thereafter, the seventh resist pattern 60 is removed.

Figure 15D:
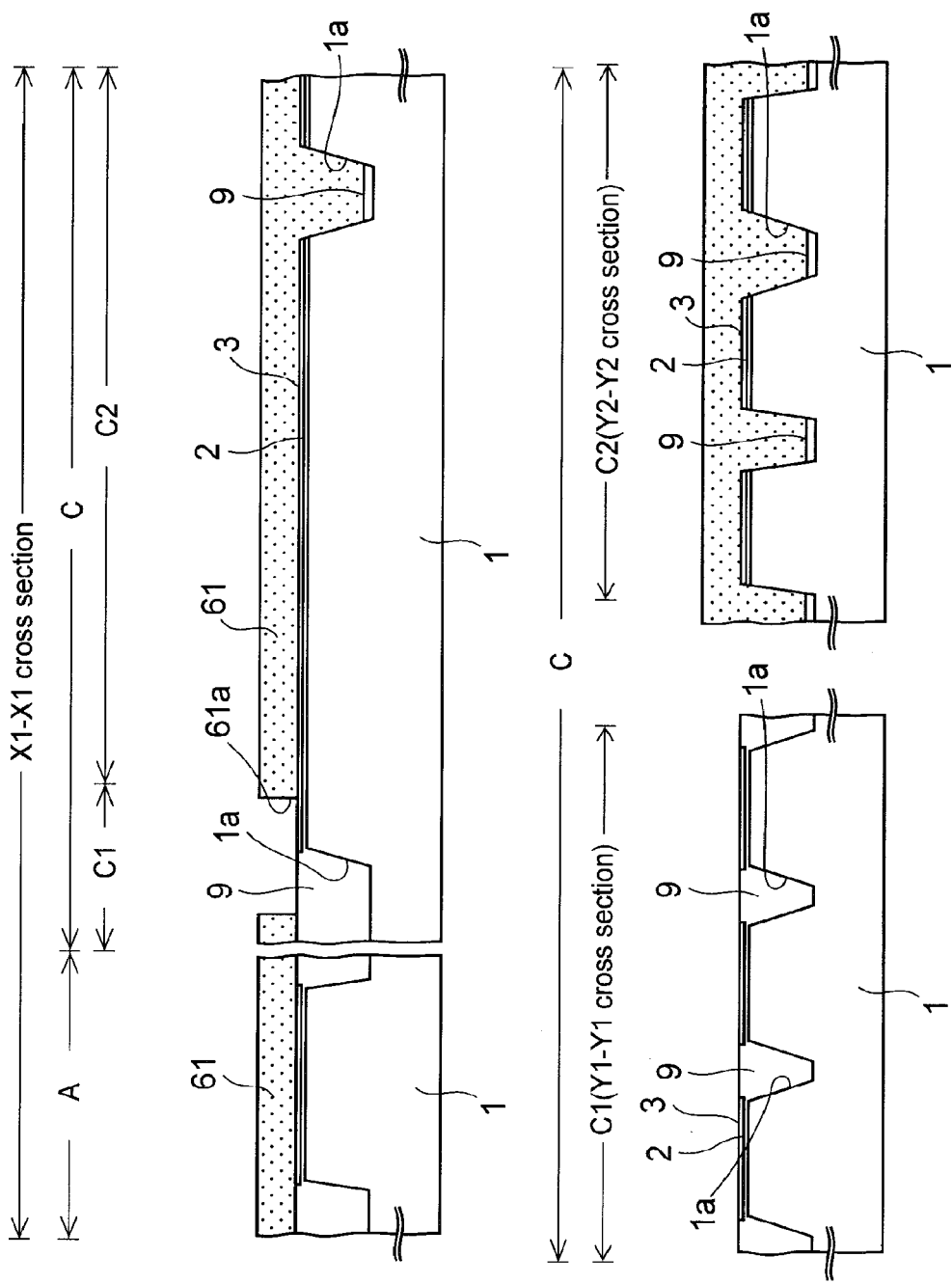

Next, as shown in FIG. 15D, an eighth resist pattern 61 is formed over the silicon substrate 1. The eighth resist pattern 61 has a window 61a on a region in which a capacitor is to be formed in the end portion C1 of the cell region C. Note that the portion C2, which resides in a region other than the end portion C1 of the cell region, is covered with the eighth resist pattern 61.

Figure 15E:
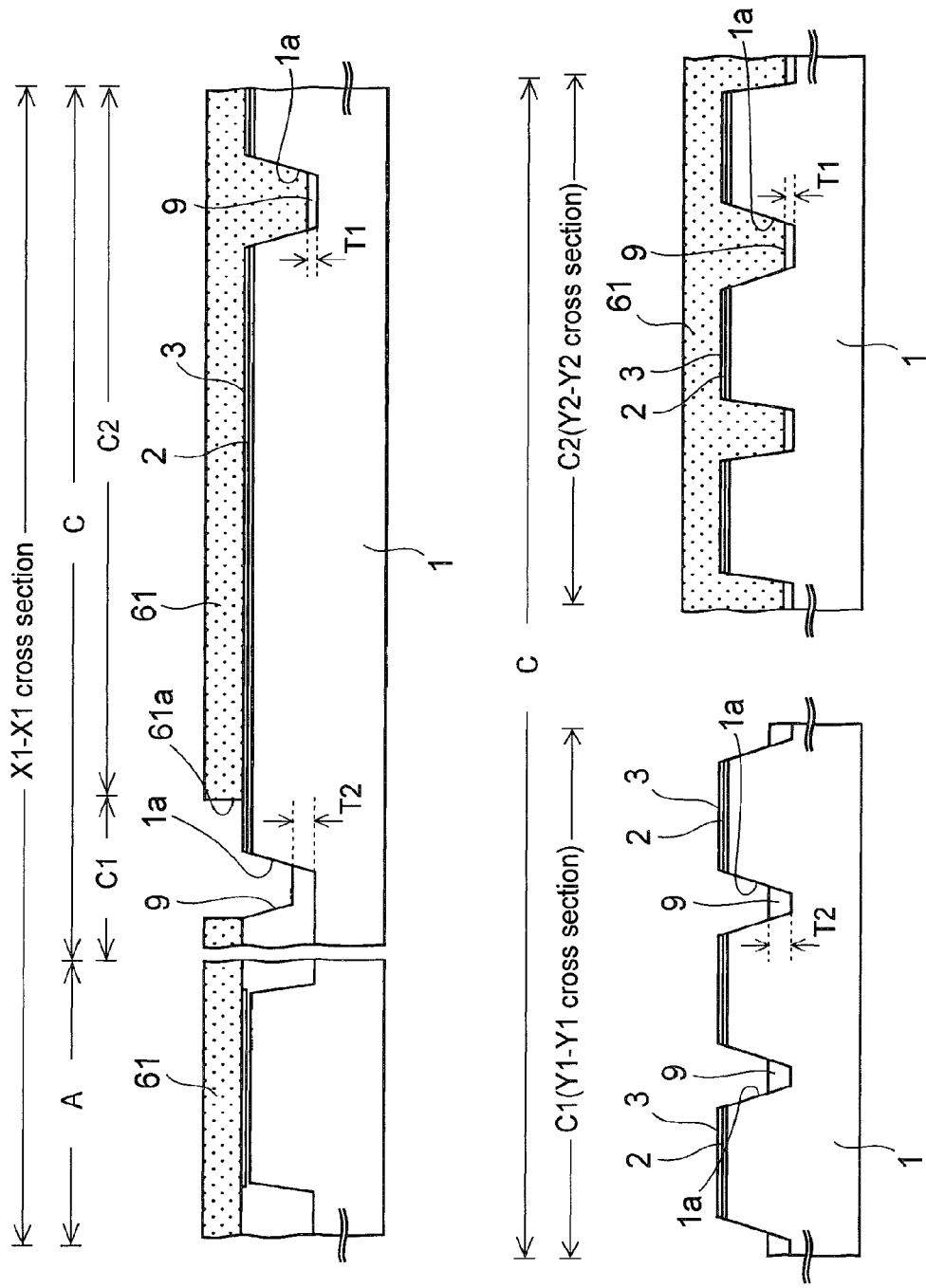

Next, as shown in FIG. 15E, the element isolation insulating film 9 in the end portion C1 is dry-etched through the window 61a of the eighth resist pattern 61. As a result, the element isolation insulating film 9 on the bottom surface of the element isolation groove 1a is left with a second thickness T2 that is thicker than the first thickness T1.

This etching can be carried out by use of the same etching gas and the etching equipment as those used in the previous etching process of FIG. 15C, and by setting an etching time to be shorter than that of the etching process of FIG. 15C.

After the dry etching is finished, the eighth resist pattern 61 is removed.

Figure 15F:
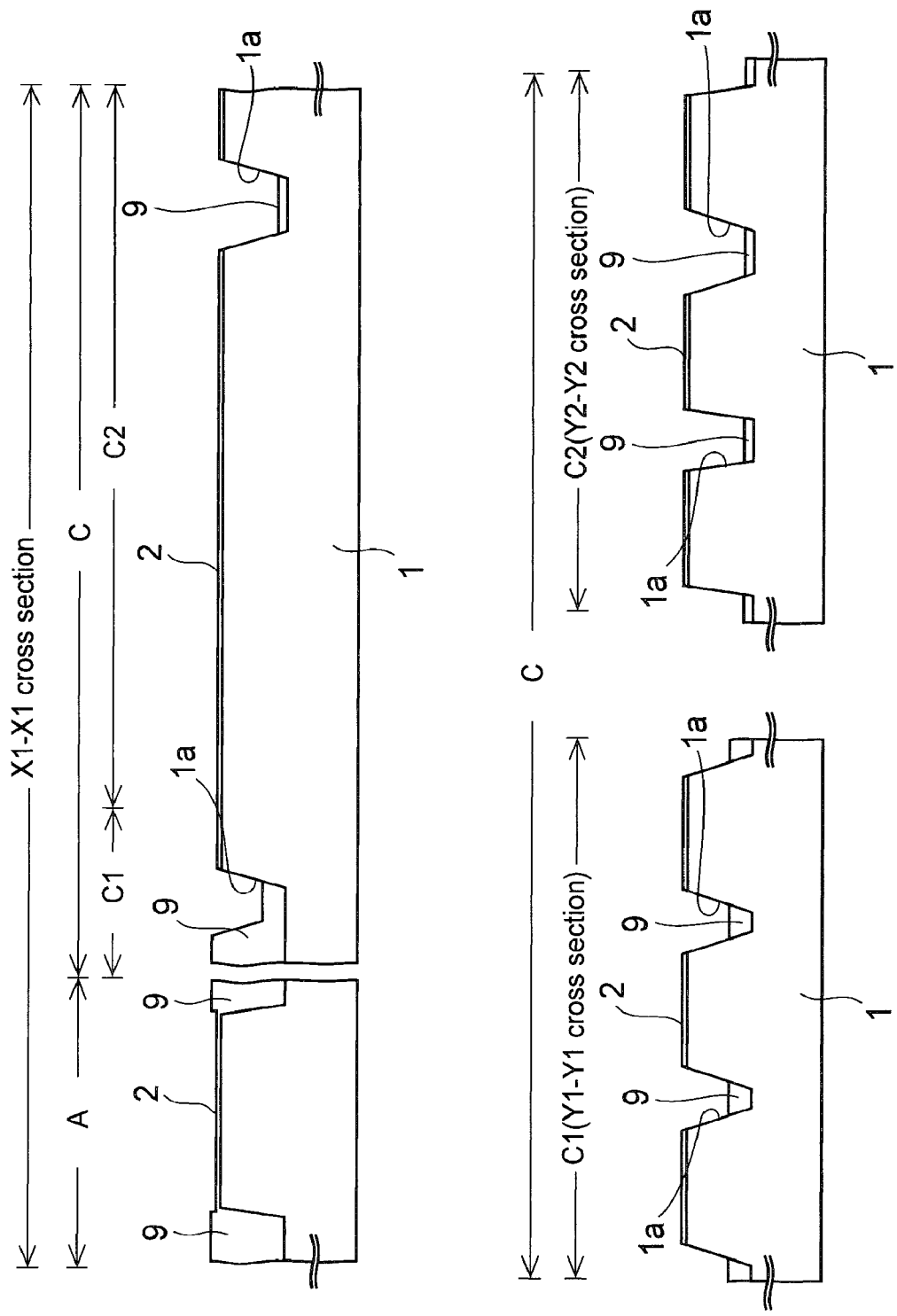

Thereafter, as shown in FIG. 15F, while using phosphoric acid as etching solution, the polishing stopper film 3 made of silicon nitride is removed by wet etching.

Figure 15G:
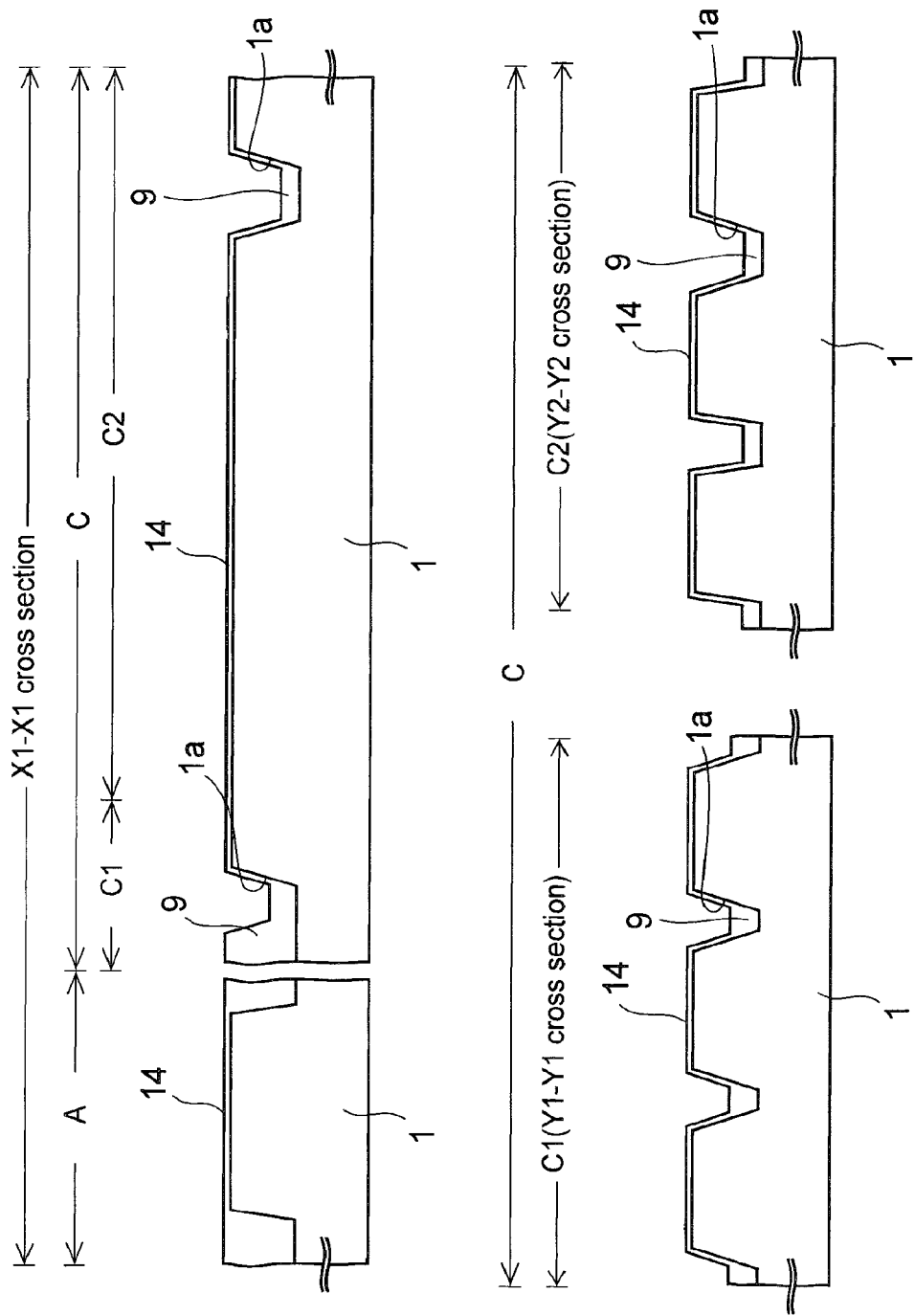

Next, as shown in FIG. 15G, the surface of the silicon substrate 1 is thermally oxidized, so that a third thermally-oxidized film 14 is formed with a thickness of approximately 10 nm on an inner surface of the element isolation grooves 1a to clean the surface of the silicon substrate 1.

Figure 15H:
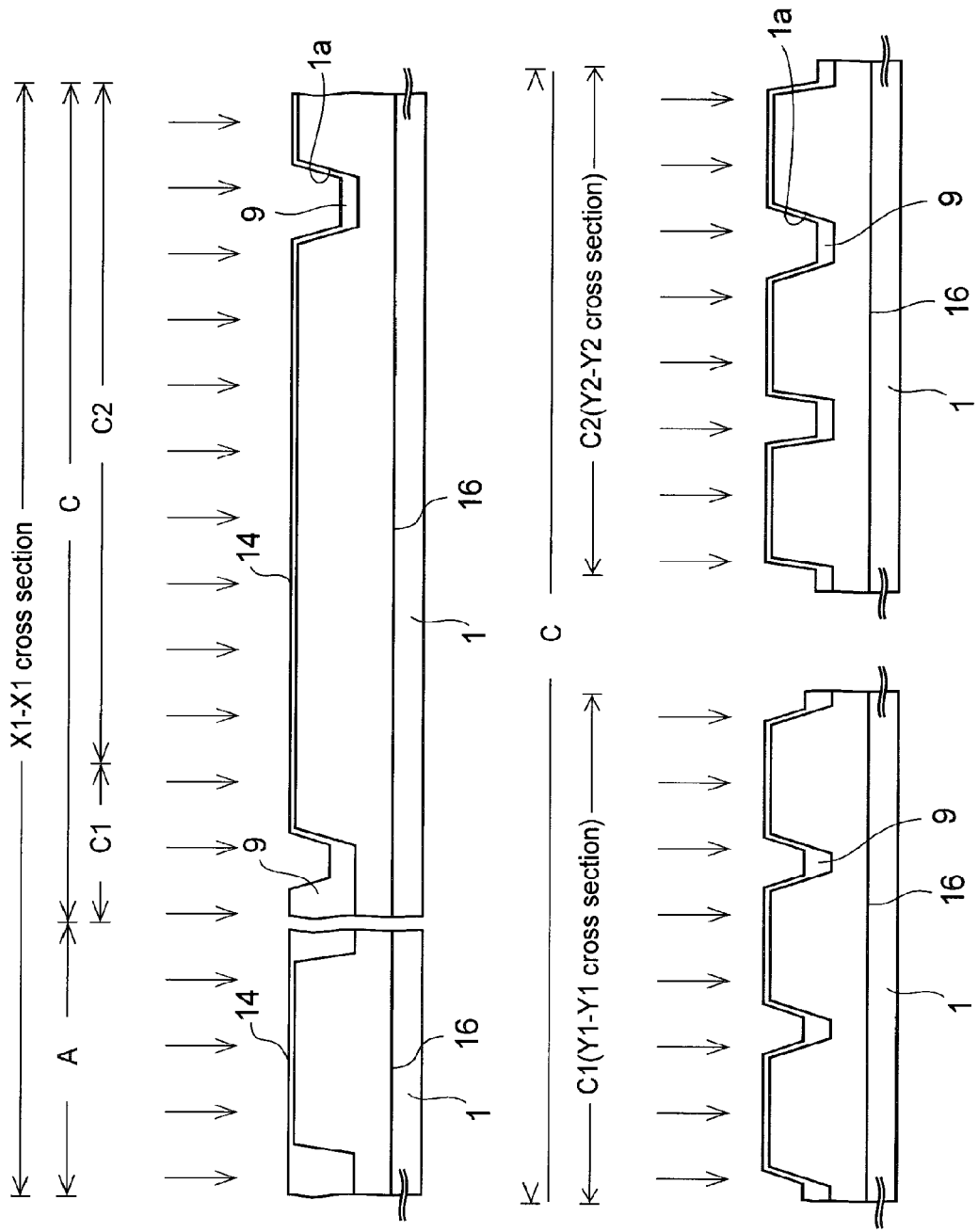

Next, as shown in FIG. 15H, phosphorus as an n-type impurity is ion-implanted into the silicon substrate 1 in the regions A and C to form an n-well 16, which is deeper than the element isolation grooves 1a in these regions. Note that conditions for the ion implantation are the same as those of the first embodiment, and the description thereof will be thus omitted.

Figure 15I:
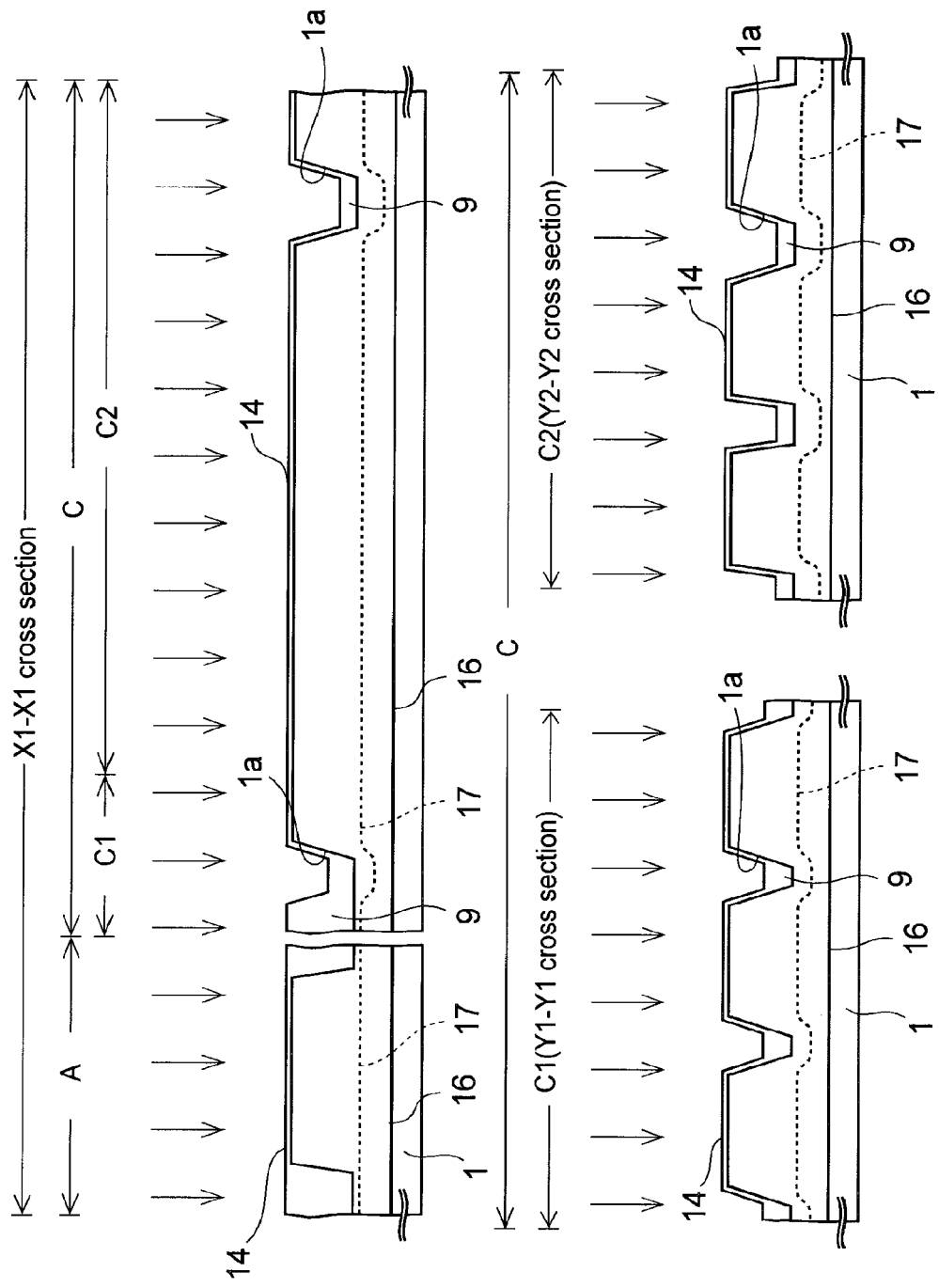

Next, as shown in FIG. 15I, in order to prevent the conductivity under the element isolation insulating film 9 from being reversed to a p-type, and thus to prevent a channel that causes the leak current from being formed, a channel stop region 17 is formed in the silicon substrate in the regions A and C by ion-implanting phosphorus as an n-type impurity into the silicon substrate 1 in these regions.

Note that the same conditions as those described in the first embodiment may be employed as conditions for this ion implantation.

Here, as described in the first embodiment, the element isolation insulating film 9 in the cell region C is thinned by etching. Thus, under the element isolation insulating film 9 in the cell region C, ions are implanted deeply into the substrate 1 than the other portions, so that the impurity concentration has a peak in a position deeper than the bottom surfaces of the element isolation grooves 1a.

However, this makes the impurity concentration of the channel stop region 17 to be insufficient at the bottom surface of the element isolation grooves 1a in the cell region C, so that an undesirable channel might be formed in the vicinity of the bottom surfaces of the element isolation grooves 1a. In particular, since the width of the element isolation groove 1a is narrower in the end portion C1 of the cell region C than that in the other portion C2, it is likely that leak current increases by the above channel, and hence the memory cell might be defective in the end portion C1.

Therefore, such a structure is required in the end portion C1 that the channel is difficult to be formed than the other portion C2.

Figure 15J:
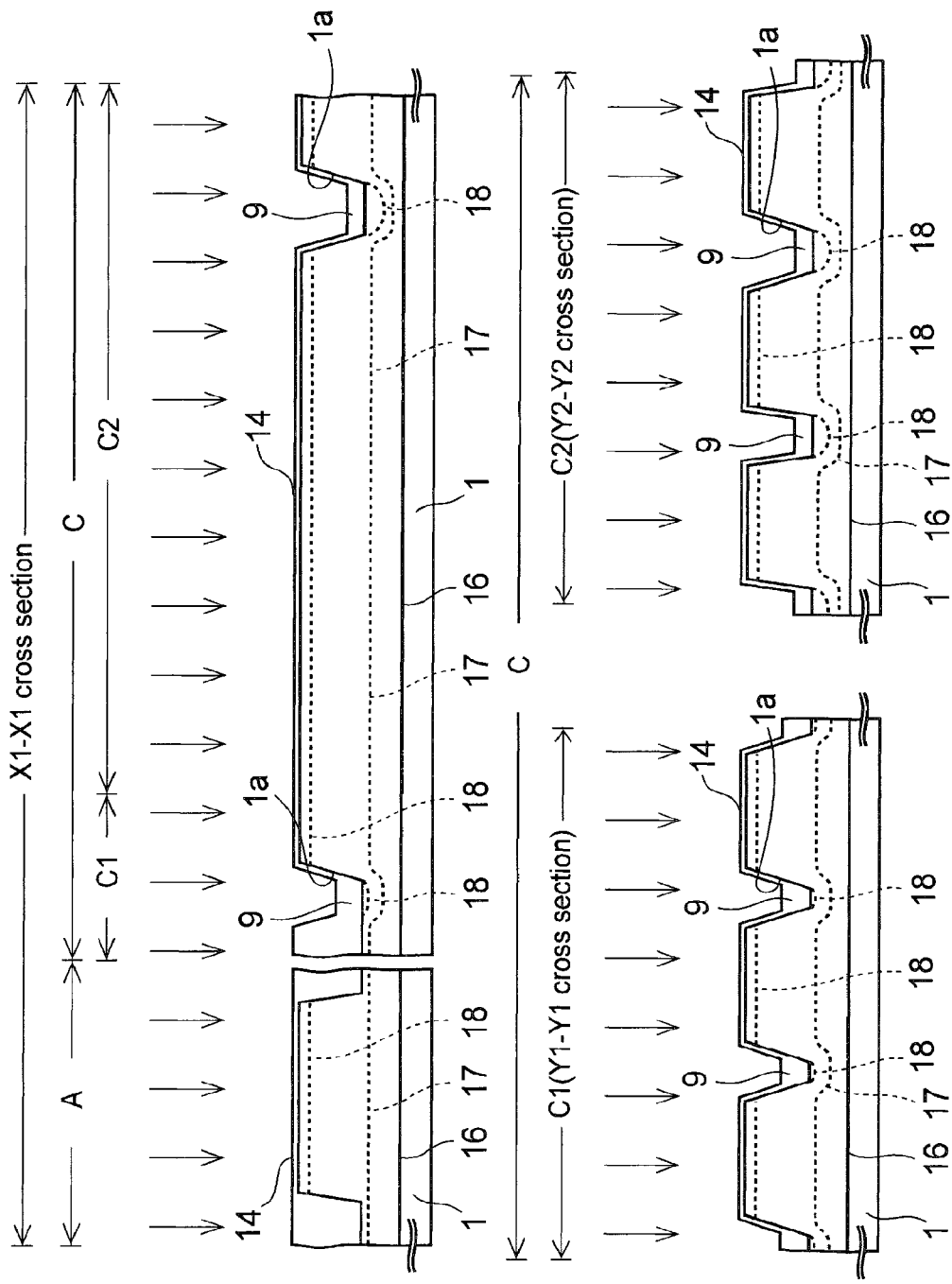

Such a structure can be formed in the subsequent process of FIG. 15J.

In the process of FIG. 15J, an n-type impurity is implanted into the regions A and C so as to form impurity diffusion regions 18 for adjusting a threshold voltage of pMOS transistors in the peripheral circuit region A and the cell region C. As conditions for this ion implantation, the same conditions as those described in the first embodiment can be employed.

Here, in the etching process of FIG. 15E, the thickness T2 of the element isolation insulating film 9 left in the element isolation grooves 1a in the end portion C1 is set to be larger than the thickness T1 of the element isolation insulating film 9 left in the other portion C2.

Accordingly, in this ion implantation, the stopping power of the element isolation insulating film 9 left in the end portion C1 against ions is increased, and hence the peak of the impurity concentration comes close to the bottom surfaces of the element isolation grooves 1a in the end portion C1. Therefore, the impurity diffusion regions 18 for adjusting a threshold voltage can also function as channel stop regions under the element isolation grooves 1a in the end portion C1. Thus, it can be prevented that the above-described channels are formed in the vicinity of the bottom surfaces of the element isolation grooves 1a.

Here, such an energy may be employed as the acceleration energy for this ion implantation that an impurity concentration of the impurity diffusion regions 18 for adjusting a threshold voltage in the end portion C1 has a peak in the bottom surfaces of the element isolation grooves 1a. By employing such an energy, the effect of channel stop by the impurity diffusion regions 18 for adjusting a threshold voltage can be maximized Note that although the thickness T1 of the element isolation insulating film 9 is thinner in the other portion C2 than in the end portion C1, the width of the element isolation groove 1a is sufficiently wide in this portion C2. Thus, it is less likely that channels are formed in the vicinity of the bottom surfaces of the element isolation grooves 1a in the portion C2, as compared with the end portion C1.

Figure 15K:
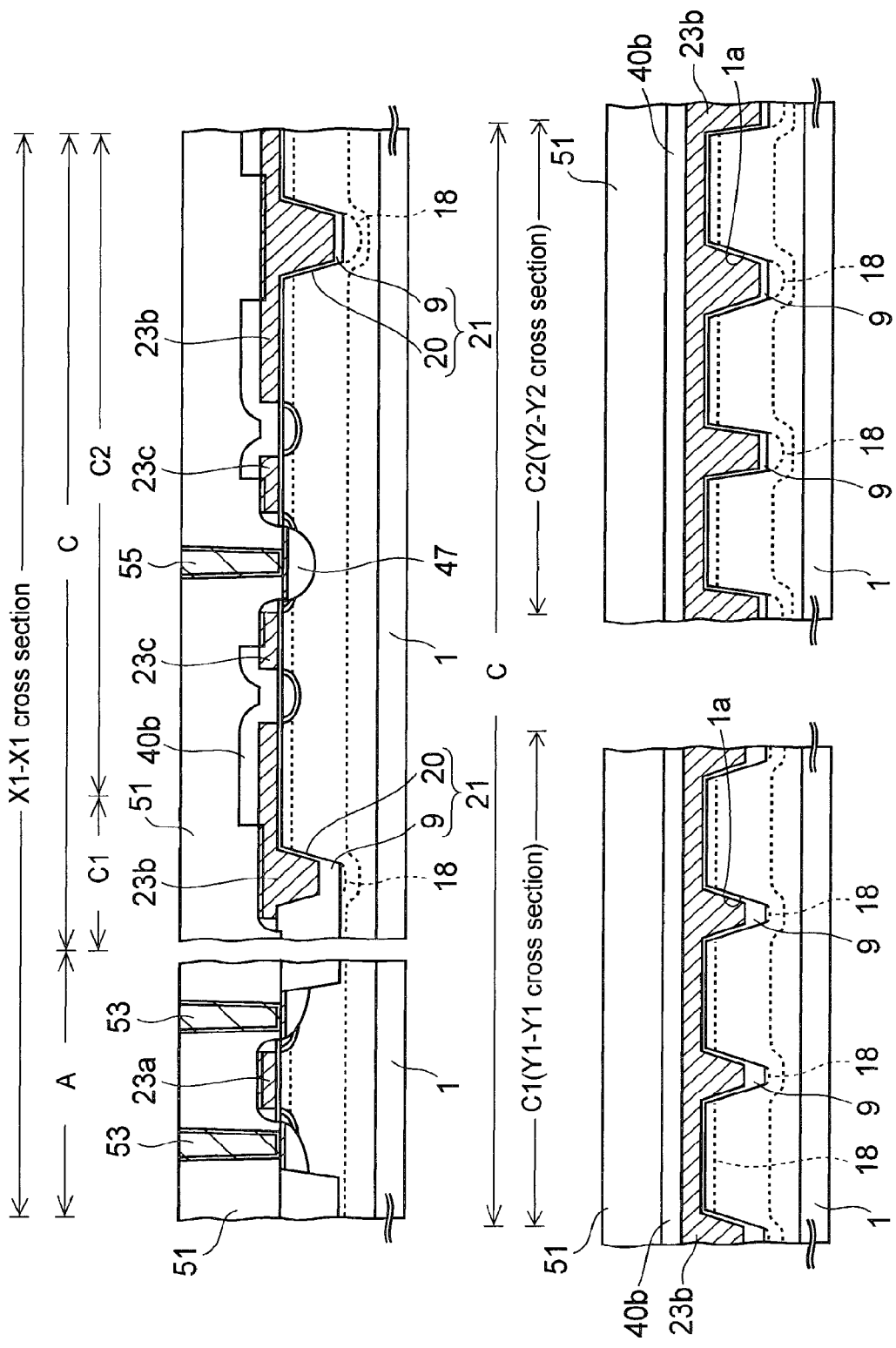

After that, the processes of FIGS. 6M to 6Y described in the first embodiment are carried out, so that the basic structure of the semiconductor device according to the present embodiment as shown in FIG. 15K is completed.

According to the present embodiment as described above, the element isolation insulating film 9 is thickly left in the end portion C1 of the cell region C. Therefore, the impurity diffusion regions 18 for adjusting a threshold voltage of the peripheral circuit can be functioned as channel stop regions in the end portion C1. Thereby, without providing the dummy active region 103 of the first embodiment, the leak current under the element isolation grooves 1a in the end portion C1 can be prevented, and hence, the memory cell in the end portion C1 becomes unlikely to be defective.

Next, the description will be given of investigation on effects that can be obtained according to the present embodiment, which was carried out by the inventor of the preset application.

Figure 16:
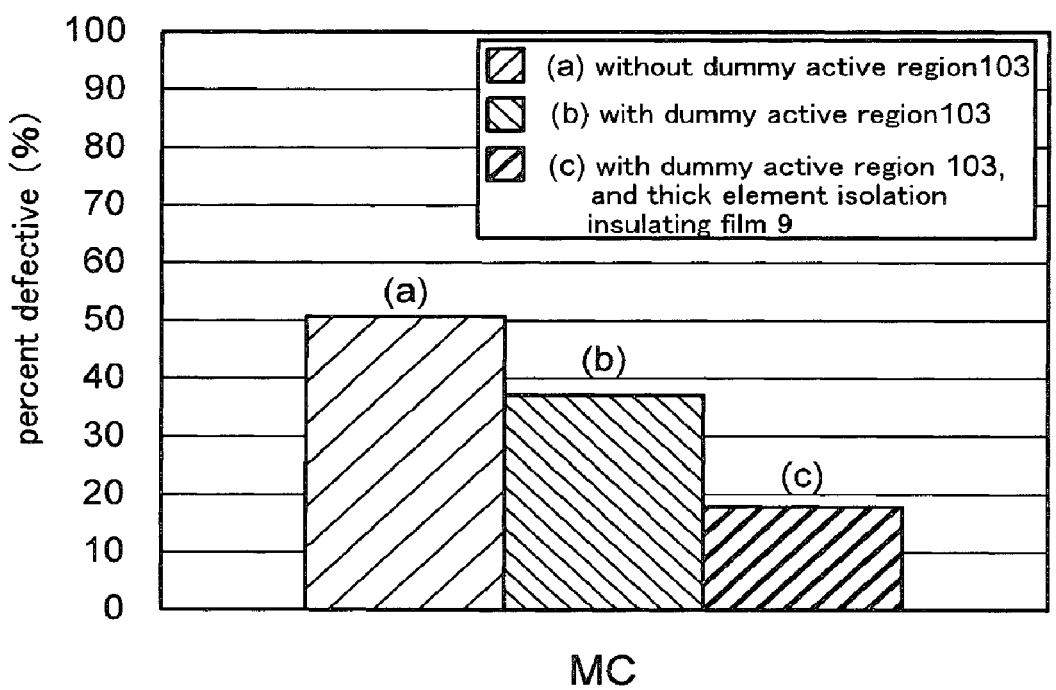
FIG. 16 is a graph obtained by investigating a percent defective of the semiconductor device in the second embodiment of the present invention.

FIG. 16 is a graph obtained by investigating percent defectives of the semiconductor device under the condition where an etching time of the element isolation insulating film 9 is set to 27 seconds to thickly leave the element isolation insulating film 9 than the first embodiment. This investigation is carried out for the following three cases: (a) the case where a dummy active region 103 is not provided, (b) the case where a dummy active region 103 is provided, and (c) the case where a dummy active region 103 is provided and the element isolation insulating film 9 is left thicker than that of the case (a) and (b).

Note that this investigation was carried out by heating the substrate to 85.degree. C.

As shown in FIG. 16, the percent defectives of the cases (a) and (b) are higher than that of the case (c). This is because the residual film thickness of the device isolation film 9 is reduced in the cases (a) and (b).

In addition, among the three graphs, the percent defective becomes smallest in the case (c) where the element isolation insulating film 9 is thickly left like the present invention.

From this result, it became apparent that defects attributable to a leak current is reduced by thickly leaving the element isolation insulating film 9 in the element isolation grooves 1a.

Next, a semiconductor device according to a third embodiment of the present invention will be described. As will be described below, similar to the second embodiment, a structure that a leak current is reduced without providing a dummy active region 103 is manufactured in the present embodiment.

FIGS. 17A to 17D are cross-sectional views showing processes of manufacturing a semiconductor device according to the present embodiment.

Note that, in these figures, the same reference numerals as those of the first embodiment will be given to denote components described in the first embodiment, and the description thereof will be omitted. In addition, in each of these cross-sectional views, cross sections taken along the line Y1-Y1 and the line Y2-Y2 in the regions C1 and C2 in FIGS. 7A and 7B are also shown.

Figure 17A:
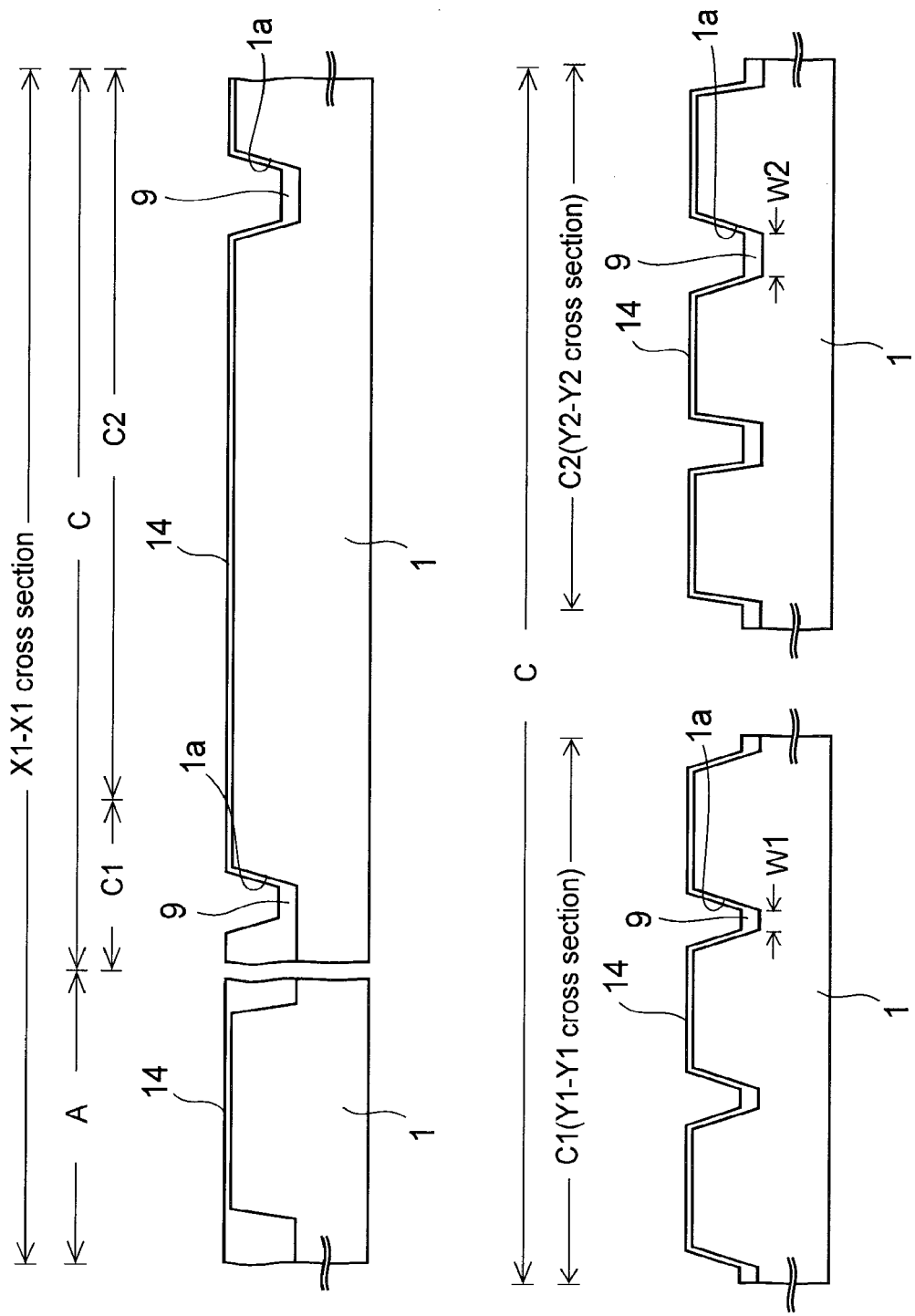
FIGS. 17A to 17D are cross-sectional views showing processes of manufacturing a semiconductor device according to a third embodiment of the present invention.
Figure 17B:
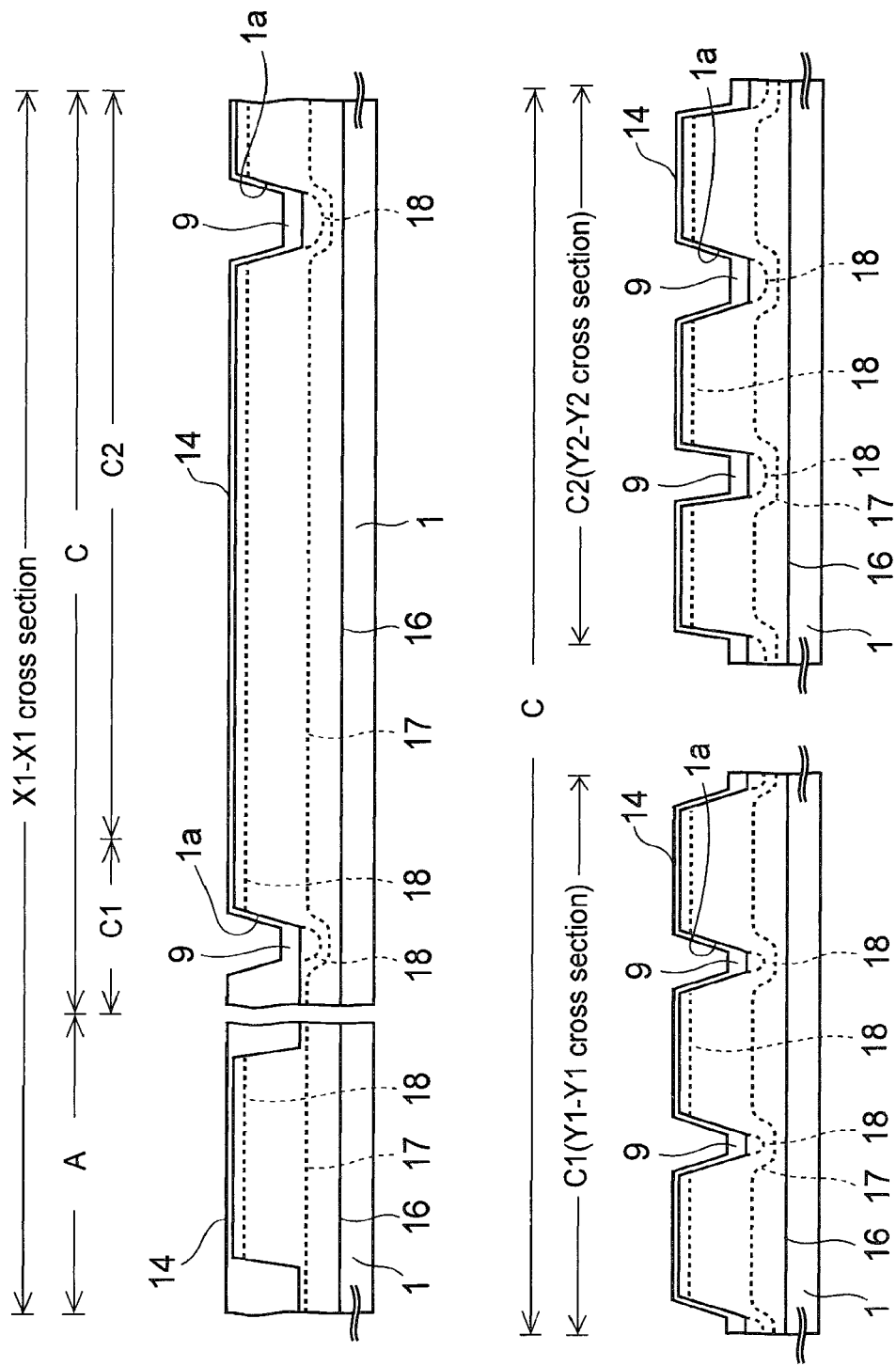

To manufacture this semiconductor device, the processes of FIGS. 6A to 6I described in the first embodiment are firstly carried out so as to obtain the cross-sectional structure shown in FIG. 17A.

Note that similar to the second embodiment, the dummy active region 103 described in the first embodiment does not need to be formed in the present embodiment, and hence the description will be given for the case where the dummy active region 103 is not formed in the followings. Accordingly, a free region B where a dummy active region 103 is formed is omitted in FIGS. 17A to 17D.

Since the dummy active region 103 is not formed in this manner, the extent of the optical proximity effect varies in the end portion C1 and the other portion C2 in the cell region C. Thus, the width W1 of an element isolation groove 1a in the end portion C1 becomes narrower than the width W2 in the other portion C2.

Furthermore, in the second embodiment, the residual film thickness of the element isolation insulating film 9 in the bottom of the element isolation grooves 1a is changed in the end portion C1 and the other portion C2. However, in the present embodiment, the residual film thicknesses of the element isolation insulating film 9 become equal in the portions C1 and C2 in the bottom of the element isolation grooves 1a, because the present embodiment follows the processes described in the first embodiment.

Subsequently, the processes of FIGS. 6J to 6L described in the first embodiment are carried out to form n-wells 16, channel stop regions 17, and impurity diffusion regions 18 for adjusting a threshold voltage in the silicon substrate 1.

Figure 17C:
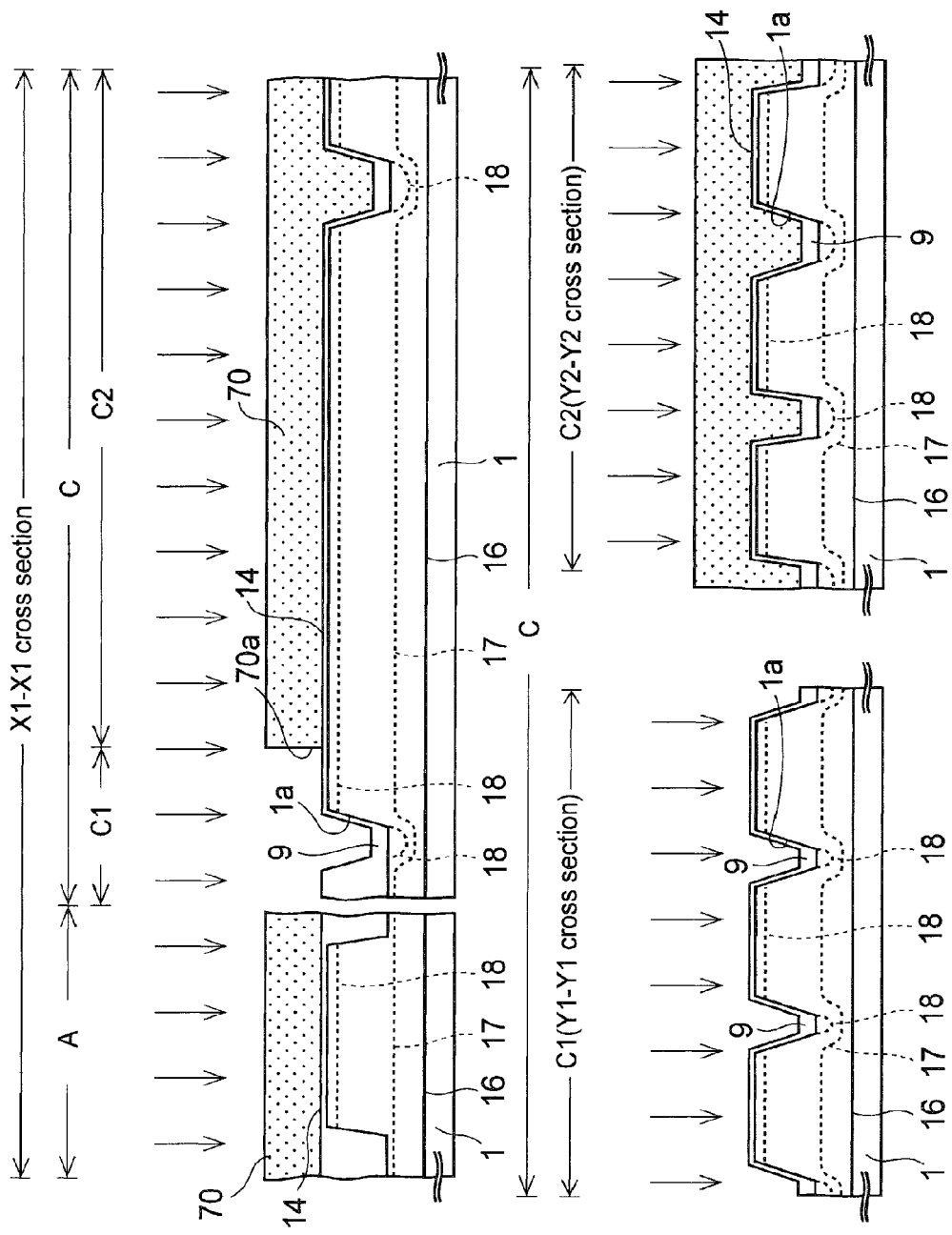

Next, as shown in FIG. 17C, a photoresist is applied on each of the third thermally-oxidized film 14 and the element isolation insulating film 9. The photoresist is then exposed and developed to form a ninth resist pattern 70. As shown in FIG. 17C, the ninth resist pattern 70 has a window 70a in which the end portion C1 of the cell region C is exposed. The other portion C2 of the cell region C and the peripheral circuit region A are covered with the ninth resist pattern 70.

After that, while the ninth resist pattern 70 is used as a mask, phosphorus as an n-type impurity is selectively ion-implanted into the silicon substrate 1 in the end portion C1, so that an impurity concentration of the channel stop regions 17 under the element isolation grooves 1a is selectively increased.

Note that conditions for this ion implantation are not particularly limited. In the present embodiment, acceleration energy is set to 50 KeV and a dose amount is set to 1.times.10.sup.12 cm.sup.−2.

Thereafter, the ninth resist pattern 70 is removed.

Figure 17D:
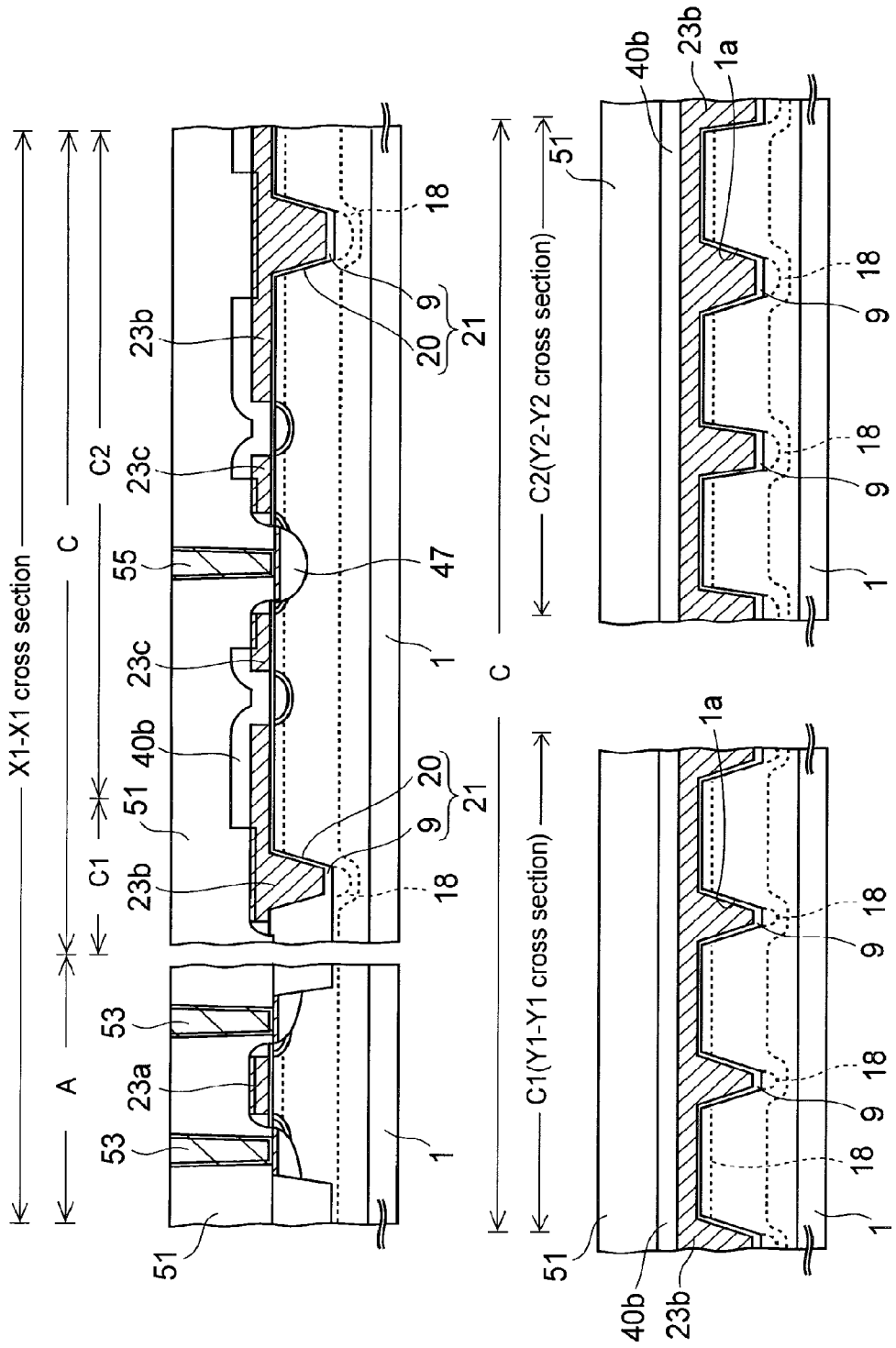

After that, the processes of FIGS. 6M to 6Y described in the first embodiment are carried out so that the basic structure of the semiconductor device according to the present embodiment shown in FIG. 17D is completed.

According to the present embodiment described above, additional ion implantation is carried out on the end portion C1 of the cell region C as described in FIG. 17C, so that an n-type impurity concentration of the channel stop regions 17 under the element isolation grooves 1a in the end portion C1 is increased.

Therefore, the n-type impurity concentration in the vicinity of the bottom surfaces of the element isolation grooves 1a becomes high by the additional ion implantation, even when the n-type impurity concentration of the channel stop regions 17 has a peak in a position lower than the bottom surfaces of the element isolation grooves 1a due to the element isolation insulating film 9 whose stopping power against ions is deteriorated by being thinned. Thus, the conductivity of the silicon substrate 1 on the bottom surfaces of the groove 1a is less likely to be reversed to a p-type, so that channels causing the leak current can be prevented from being formed on the bottom surfaces of the element isolation grooves 1a.

In particular, the additional ion implantation is carried out on the end portion C1 where the width of the element isolation groove 1a is narrow and thus a leak current is easily caused in the bottom surface of the groove 1a. Therefore, it can be prevented that the memory cell in the end portion C1 becomes defective, and hence the yield of the semiconductor device can be improved.

Moreover, by employing such an acceleration energy for the ion implantation that a peak of the impurity concentration of the channel stop regions in the end portion C1 coincides with the bottom surface of the element isolation groove 1a in the end portion C1, it can be prevented to a maximum extent that unnecessary channels are formed in the bottom surfaces of the groove 1a.

Next, the description will be given of investigation on effects obtained according to the present embodiment, which was carried out by the inventor of the present application.

Figure 18:
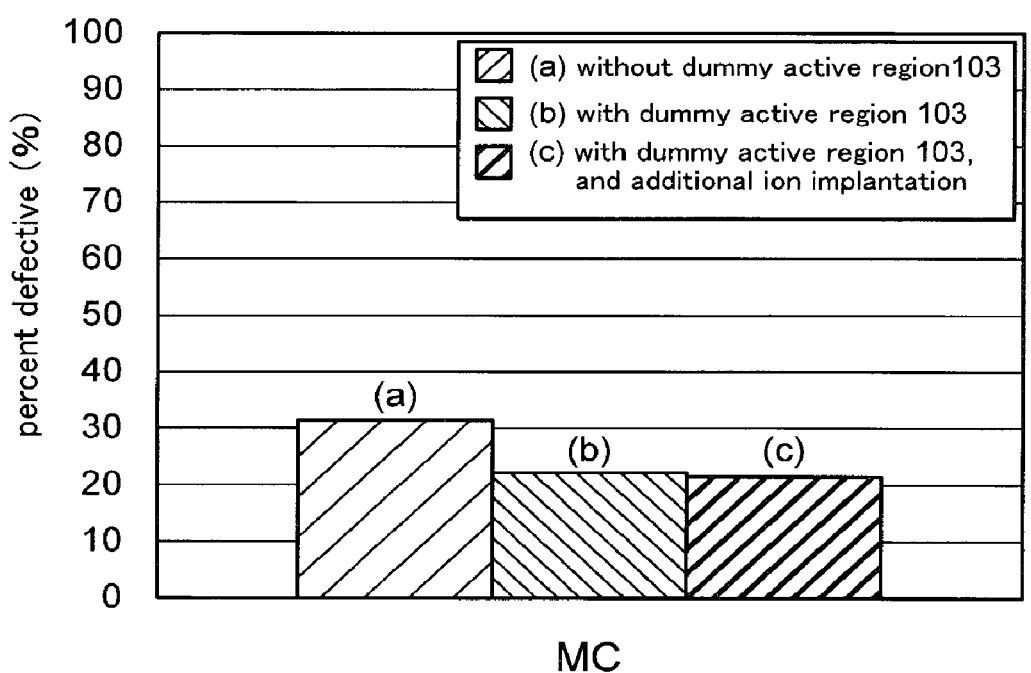
FIG. 18 is a graph obtained by investigating a percent defective of the semiconductor device in the third embodiment of the present invention.

FIG. 18 is a graph obtained by investigating percent defectives in the following three cases: (a) the case where a dummy active region 103 is not provided, (b) the case where a dummy active region 103 is provided and additional ion implantation (FIG. 17C) is not carried out, and (c) the case where a dummy active region 103 is provided and additional ion implantation (FIG. 17C) is carried out.

Note that in this investigation, the etching time for the element isolation insulating film 9 is set to 25 seconds, which is the same as that of the first embodiment, so as to leave the element isolation insulating film 9 relatively thick. In addition, the test was carried out by heating the substrate to 85.degree. C.

As shown in FIG. 18, in the case where the thickness of the element isolation insulating film 9 is thick, there is no major difference between the case (c) where the additional ion implantation is carried out and the case (b) where it is not carried out, and hence the percent defective is improved simply by providing the dummy active region 103. This is because the stopping power of the element isolation insulating film 9 against ions is increased when the thickness of the element isolation insulting film 9 is thick. Accordingly, the impurity concentration of the channel stop regions 17 has a peak in the vicinity of the bottom surfaces of the element isolation grooves 1a. Thus, it is prevented, by the channel stop regions 17, that the channels are formed in the bottom surfaces.

Figure 19:
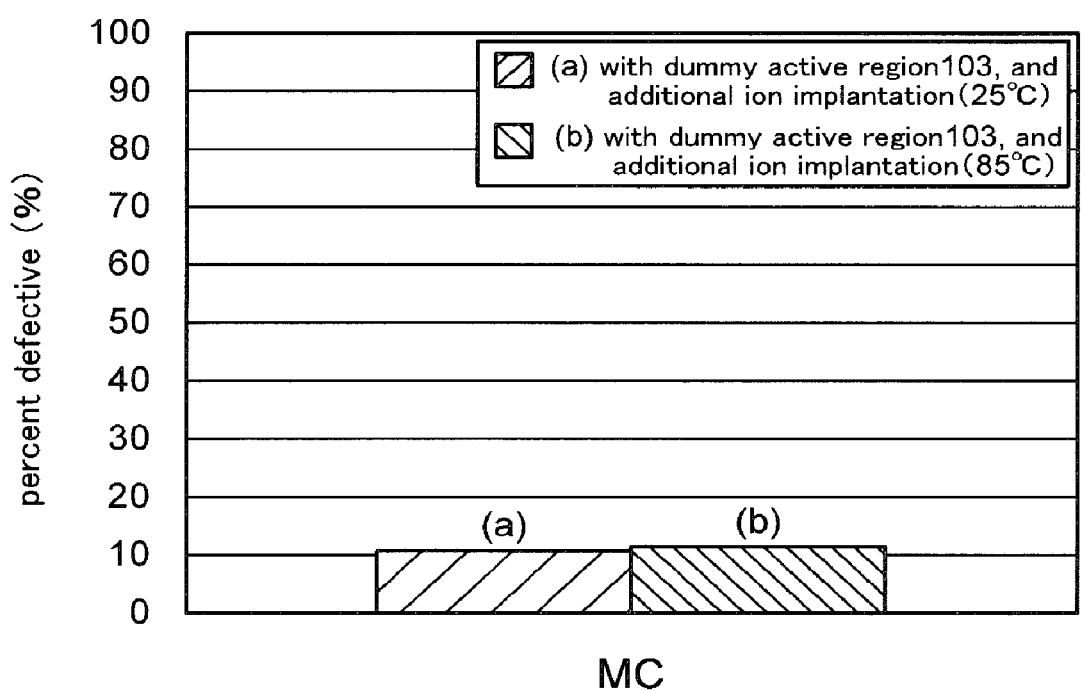
FIG. 19 is a graph obtained by investigating whether or not the defect of FIG. 18 is attributable to a leak current.

In addition, FIG. 19 is a graph obtained by investigating how the percent defective changes when the test was carried out at the substrate temperatures of 25° C. and 85° C. in the case where a dummy active region 103 is provided and the additional ion implantation is carried out.

As shown in FIG. 19, the percent defectives are the same regardless of the substrate temperatures. From this result, it is understood that the defect caused in the investigation of FIG. 18 is not attributable to a leak current.

Figure 20:
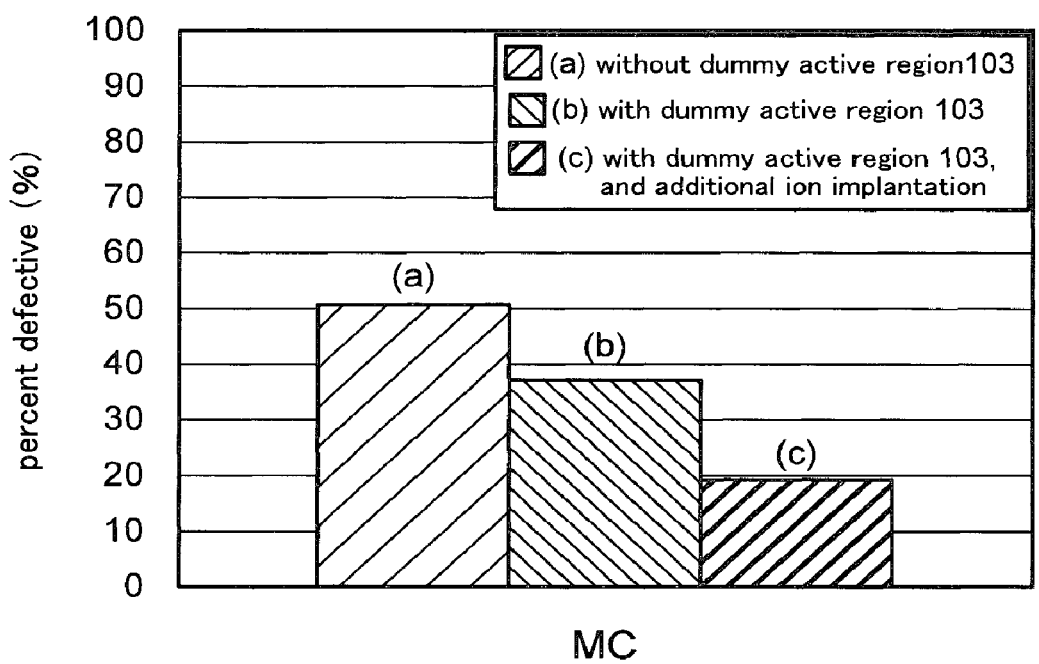
FIG. 20 is a graph obtained by investigating a percent defective of the semiconductor device by reducing a residual film thickness of an element isolation insulating film than that used in the investigation of FIG. 18.

FIG. 20 is a graph obtained by carrying out the same investigation as that of FIG. 18 under the condition where the element isolation insulating film 9 left in the element isolation grooves 1a is thinned by setting the etching time in FIG. 6G for the element isolation insulating film 9 to relatively long time, 27 seconds for example.

As shown in FIG. 20, when the element isolation insulating film 9 is thinned in this manner, the percent defective in the case (c) where the additional ion implantation is carried out becomes smaller than that in the case (b) where the additional ion implantation is not carried out.

This is possibly because when the element isolation insulating film 9 is thin, the impurity concentration of the channel stop regions 17 has a peak in a position lower than the bottom surfaces of the element isolation grooves 1a, and the channel stop regions 17 cannot prevent formation of the channels in the bottom surfaces, and thus the percent defective in the case (b) where the additional ion implantation is not carried out is increased.

From the result of FIG. 20, it became apparent that the additional ion implantation (FIG. 17C) was especially effective for the case where the element isolation insulating film 9 in the element isolation groove 1a was thin.

Although the embodiments have been described in detail in the above, the present invention is not limited to the above-described embodiments. For example, a leak current in the end portion C1 can be further effectively reduced by combining the first to third embodiments as needed, rather than by carrying out these embodiments separately.

Moreover, the foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor device, comprising:
    forming an element isolation groove in the semiconductor substrate by etching the semiconductor substrate so as to define a plurality of cell active regions in a cell region in the semiconductor substrate by the element isolation groove, and to define a dummy active region in the semiconductor substrate beside the cell region;
    forming an element isolation insulating film in the element isolation groove;
    etching the element isolation insulating film to lower an upper surface of the element isolation insulating film than the upper surface of the semiconductor substrate;
    forming a thermally-oxidized film on a side surface of the element isolation groove after the etching of the element isolation insulating film to make the thermally-oxidized film and the element isolation insulating film into a capacitor dielectric film;
    forming an upper electrode over the capacitor dielectric film and a gate electrode of a MOS transistor over the cell active region with a gate insulating film interposed therebetween, the upper electrode constituting a capacitor together with the capacitor dielectric film and the semiconductor substrate; and
    implanting an impurity into the semiconductor substrate of the cell active region beside the gate electrode and the dummy active region.

2. The method of manufacturing a semiconductor device according to claim 1,
    wherein, the capacitor and the MOS transistor function as a one transistor-one capacitor-type memory cell.

3. The method of manufacturing a semiconductor device according to claim 2, wherein, when forming the element isolation groove, an interval between the cell active regions in an end portion of the cell region and the dummy active region is set smaller than the width of the memory cell.

4. The method of manufacturing a semiconductor device according to claim 2, wherein, when forming the element isolation groove, the dummy active region is formed in a stripe shape extending in a repeating direction of the memory cell.

5. The method of manufacturing a semiconductor device according to claim 1, wherein, when forming the element isolation groove, the dummy active region is formed independently from the cell active region.

6. A method of manufacturing a semiconductor device, comprising:
    forming an element isolation groove in a semiconductor substrate to define a plurality of active regions in a cell region of the semiconductor substrate;
    forming an element isolation insulating film in the element isolation groove;
    etching the element isolation insulating film in a portion other than an end portion of the cell region to leave the element isolation insulating film with a first thickness on a bottom surface of the element isolation groove;
    etching the element isolation insulating film in the end portion of the cell region to leave the element isolation insulating film with a second thickness on a bottom surface of the element isolation groove, the second thickness being thicker than the first thickness;
    forming a well in the semiconductor substrate in the cell region;
    forming a thermally-oxidized film on a side surface of the element isolation groove after the element isolation insulating film is left with the first and second thicknesses, to make the thermally-oxidized film and the element isolation insulating film into a capacitor dielectric film;

forming an impurity diffusion region by implanting ions of an impurity having a same conductivity type as that of the well into the semiconductor substrate under the element isolation groove, after the element isolation insulating film is left with the first and second thicknesses; and forming an upper electrode over the capacitor dielectric film, the upper electrode constituting a capacitor together with the capacitor dielectric film and the semiconductor substrate.

7. The method of manufacturing a semiconductor device according to claim 6, wherein, when forming the impurity diffusion region, such an energy is employed as an acceleration energy of the ion implantation that a peak of an impurity concentration of the impurity diffusion region is positioned in a bottom surface of the element isolation groove in the end portion of the cell region.

8. The method of manufacturing a semiconductor device according to claim 6, further comprising:

forming a MOS transistor in a peripheral circuit region of the semiconductor substrate, wherein, when forming the impurity diffusion region, an impurity diffusion region for adjusting a threshold voltage of the MOS transistor is formed in the peripheral circuit region of the semiconductor substrate.

9. A method of manufacturing a semiconductor device, comprising:

forming an element isolation groove in a semiconductor substrate to define a plurality of active regions in a cell region of the semiconductor substrate;

forming an element isolation insulating film in the element isolation groove;

etching the element isolation insulating film to lower an upper surface of the element isolation insulating film than an upper surface of the semiconductor substrate;

forming a well in the semiconductor substrate in the cell region;

forming a thermally-oxidized film on a side surface of the element isolation groove after the etching of the element isolation insulating film, to make the thermally-oxidized film and the element isolation insulating film into a capacitor dielectric film;

forming a channel stop region by implanting ions of an impurity having the same conductivity type as that of the well into the semiconductor substrate under the element isolation groove after the etching of the element isolation insulating film;

implanting ions of an impurity having the same conductivity type as that of the channel stop region into the semiconductor substrate under the element isolation groove in an end portion of the cell region to increase an impurity concentration of the channel stop region in the end portion; and forming an upper electrode over the capacitor dielectric film, the upper electrode constituting a capacitor together with the capacitor dielectric film and the semiconductor substrate.

10. The method of manufacturing a semiconductor device according to claim 9, wherein, when increasing the impurity concentration of the channel stop region, such an energy is employed as an acceleration energy of the ion implantation that a peak of the impurity concentration of the channel stop region in the end portion of the cell region coincides with a bottom surface of the element isolation groove in the end portion.

* * * * *